United States Patent [19]

Kakinoki et al.

[11] Patent Number: 5,004,929
[45] Date of Patent: Apr. 2, 1991

[54] OPTICAL SYSTEM FOR DETECTING THREE-DIMENSIONAL SHAPE

[75] Inventors: Yoshikazu Kakinoki, Machida; Masato Nakashima, Yokohama; Tetsuo Koezuka, Hachioji; Noriyuki Hiraoka, Kawasaki; Hiroyuki Tsukahara, Atsugi; Yoshinori Suto, Kawasaki; Yoshitaka Oshima; Shinji Hashinami, both of Atsugi, all of Japan

[73] Assignee: Fujitsu Limited, Kawasaki, Japan

[21] Appl. No.: 360,878

[22] Filed: Jun. 2, 1989

[30] Foreign Application Priority Data

Jun. 4, 1988 [JP] Japan .................. 63-136651
Jun. 14, 1988 [JP] Japan .................. 63-144846
Aug. 5, 1988 [JP] Japan .................. 63-196815
Aug. 31, 1988 [JP] Japan .................. 63-218165

[51] Int. Cl.$^5$ .......................................... G01N 21/86
[52] U.S. Cl. .................................... 250/561; 356/376
[58] Field of Search .............. 250/235, 236, 560, 561; 356/376; 350/6.8, 6.91

[56] References Cited

U.S. PATENT DOCUMENTS

| | | | |
|---|---|---|---|
| 4,553,844 | 11/1985 | Nakagawa et al. | 356/376 |
| 4,677,302 | 6/1987 | Chiu et al. | 250/560 |
| 4,698,513 | 10/1987 | Tojo et al. | 250/561 |
| 4,743,770 | 5/1988 | Lee | 250/560 |
| 4,748,329 | 5/1988 | Cielo et al. | 250/56 |
| 4,761,546 | 8/1988 | Ikari | 250/201 |
| 4,792,695 | 12/1988 | Blandford | 250/560 |
| 4,796,961 | 1/1989 | Yamada et al. | 350/6.8 |
| 4,796,997 | 1/1989 | Svetkoff et al. | 356/376 |
| 4,848,864 | 7/1989 | Ostertag et al. | 350/6.8 |
| 4,864,123 | 9/1989 | Mizutani | 250/561 |

FOREIGN PATENT DOCUMENTS 56-155916 12/1981 Japan .
63-61110 3/1988 Japan .
63-140531 6/1988 Japan .

OTHER PUBLICATIONS

"Automated Printed-Circuit-Board Inspection", Oct. 1985.

Primary Examiner—David C. Nelms
Assistant Examiner—K. Shami
Attorney, Agent, or Firm—Staas & Halsey

[57] ABSTRACT

An optical system for detecting the shape of a three-dimensional object comprising a collimating lens for converting a laser beam to a parallel beam of light, a scanning optical system which moves the parallel beam incident on the object in a direction normal to the object thereby to scan the object with a scanning beam, a mirror which is located in the vicinity of the scanning beam at a predetermined inclination angle with respect to the object, to reflect the beam reflected by the object in a predetermined direction as a reflection beam, an image forming lens which converges the reflection beam to a point and thereby producing an image of the object, and a first optical detector located at the point at which the reflection beam is converged to detect the converged beam spot.

37 Claims, 38 Drawing Sheets

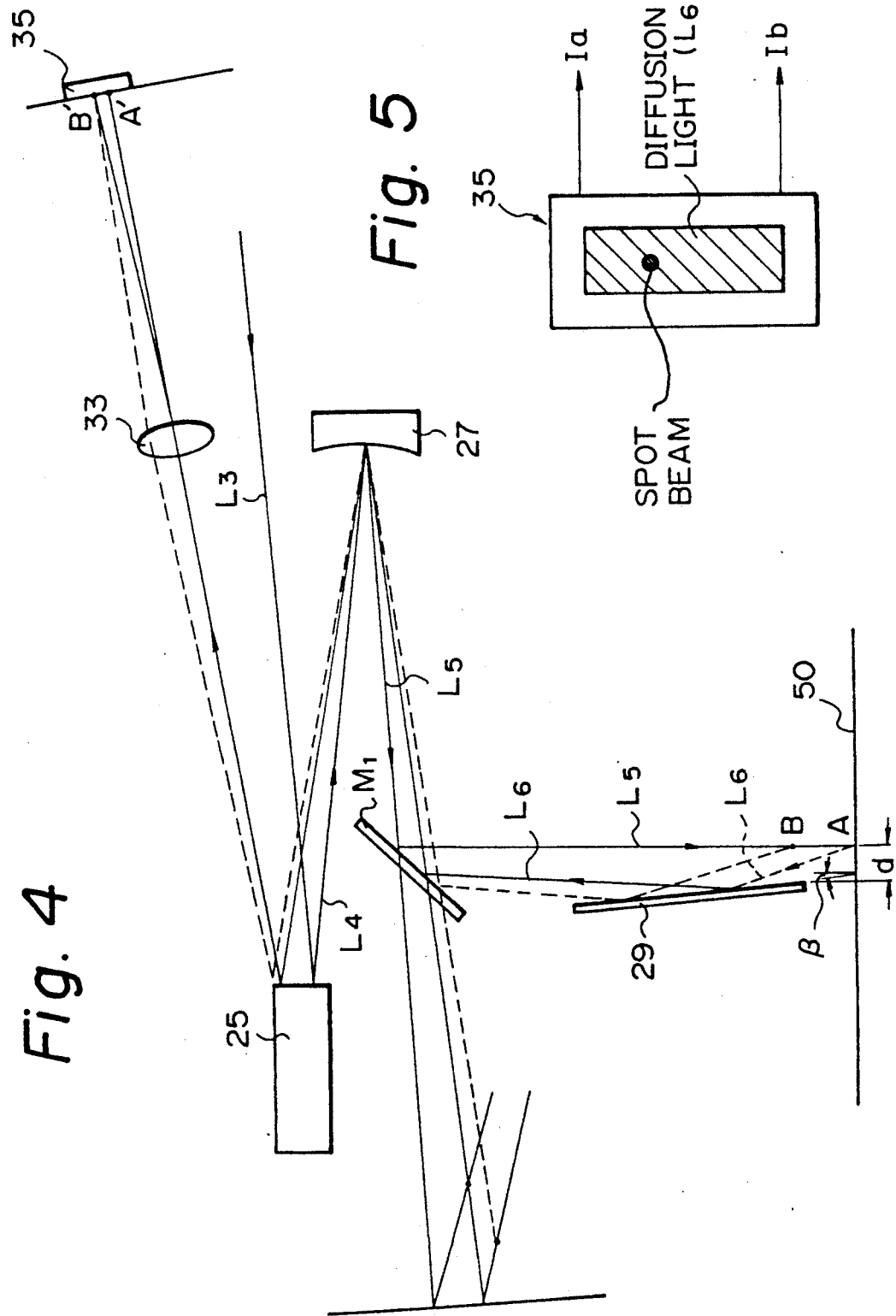
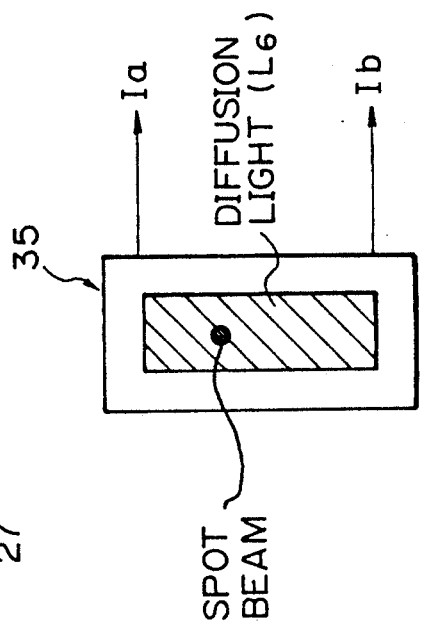
Fig. 4
Fig. 5

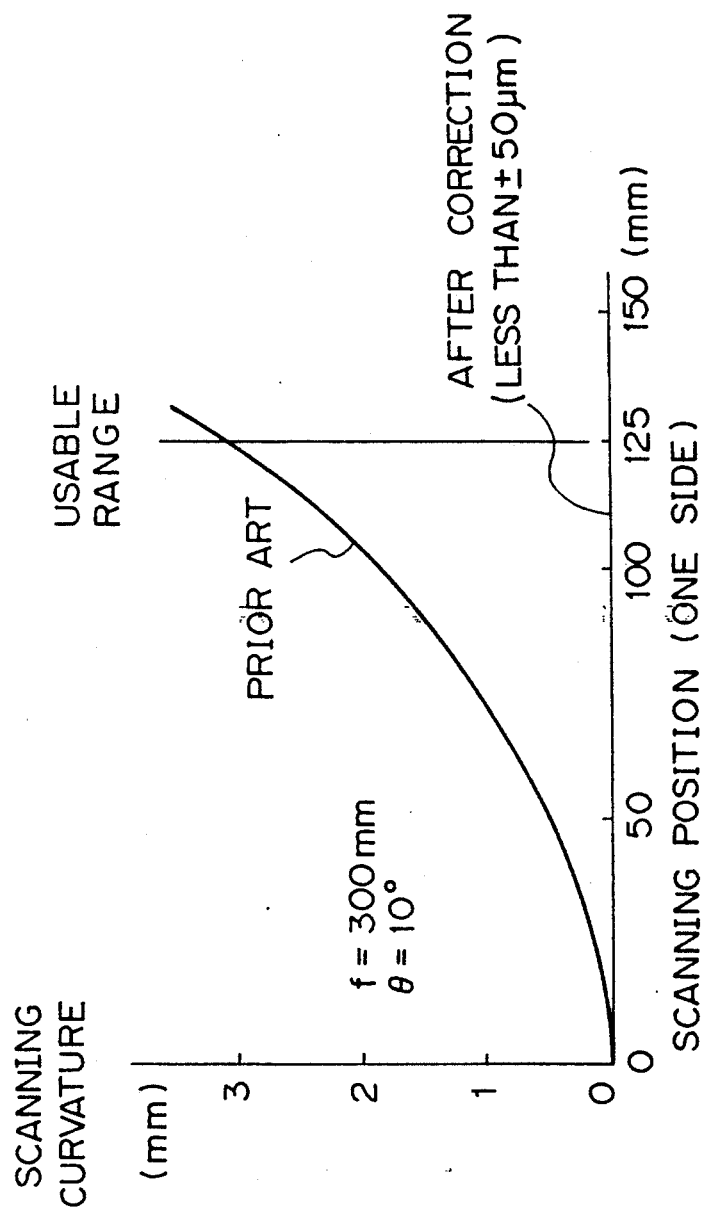

Fig. 18A
PRIOR ART
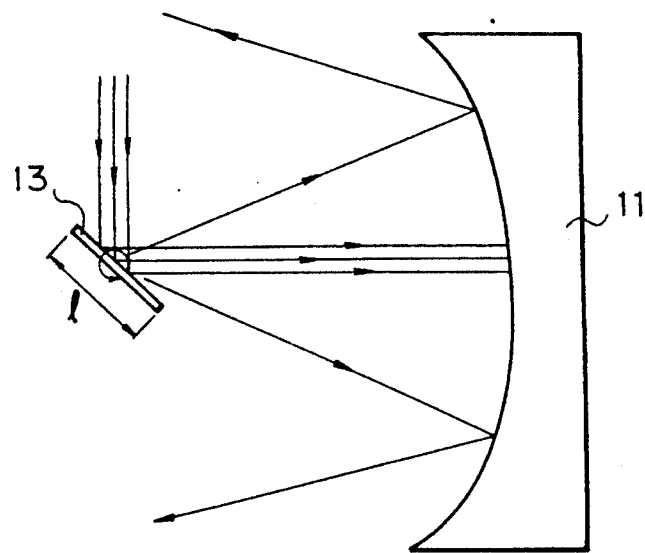
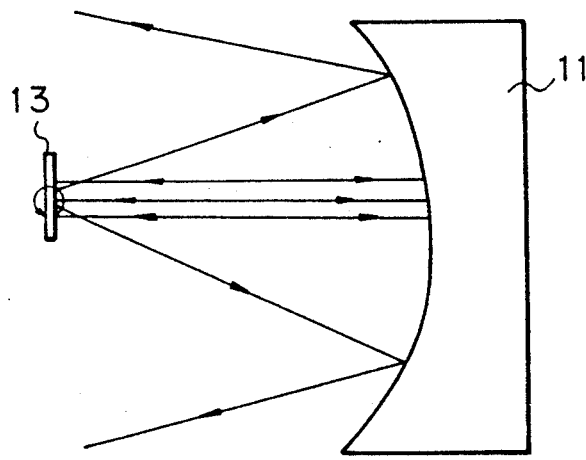
Fig. 18B
Fig. 19
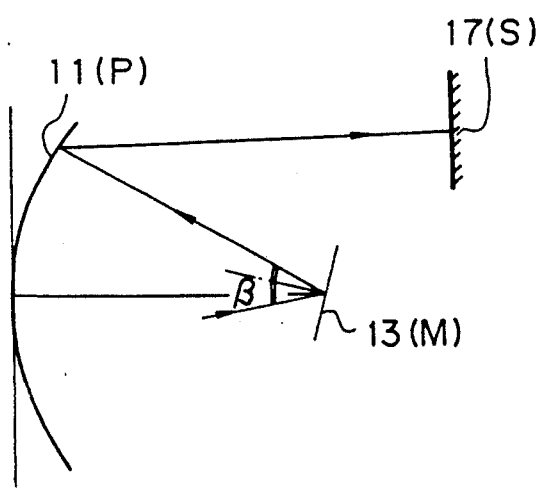

OPTICAL SYSTEM FOR DETECTING THREE-DIMENSIONAL SHAPE

BACKGROUND OF THE INVENTION

1. Field of the Invention

The present invention relates to an optical system for detecting the shape of a three-dimensional object, and if necessary, a gradation pattern thereof.

2. Description of the Related Art

There are many known non-contact measuring methods of detecting the shape of a three-dimensional object, and these are used, for example, to check the mounting state of electronic components on a printed circuit board. Namely, the presence (or absence) of electronic components, the mounting positions and mounting directions thereof, failures of electronic connection, etc., are automatically detected by a non-contact method using an optical detection system. One of the most widely-used non-contact measuring methods is a structure light method, as discussed below.

FIG. 43 shows the principle of a known structure light method of detecting a shape (particularly the height) of an object.

As shown in the FIG., an object 10 to be detected is illuminated directly from above by a slit light $L_1$, and lines of light intersecting the object 10 are observed by a TV camera 13 from a predetermined oblique angle. For example, for the shape of the object 10 shown in FIG. 43, the portions corresponding to heights of the object 10 are detected as a luminary image by the TV camera 13, as shown in FIG. 44. An image window of the TV camera is small in comparison with the whole, or complete, object area. By scanning the image window step by step in the lateral direction (x direction) for every line (vertical direction y), the whole shape (height) of the object can be detected by a triangulation method known per se.

In such a known structure light method, however, it takes a long time to scan the image window in the x-y directions, resulting in a reduced measuring speed, and even if a realtime processing of the detection of the height from the detected image picture is attempted by using hardware, it takes at least 1/30 second (time of one frame) to measure the height information in one window. Such a low measuring speed is not satisfactory in view of the current need for an in-line inspection system.

SUMMARY OF THE INVENTION

Therefore, a primary object of the present invention is to provide a simple optical measuring system which can perform precise and high speed measuring of the shape of a three-dimensional object.

To realize this object, according to the present invention, there is provided an optical system for measuring a three-dimensional shape, which comprises a collimating lens which converts a laser beam from a laser beam source into a beam of light, a beam scanning optical system by which the object to be detected is scanned with the laser beam (telecentric characteristics) in the vertical direction, a mirror located at a predetermined angle nearly normal to the object and spaced from the scanning beam by a predetermined distance, an image forming lens which forms an image of the light reflected by the object through the above-mentioned beam scanning optical system, and a light detector which detects a beam spot focused by the image forming lens.

Preferably, the beam scanning optical system comprises a deflection mirror which deflects the laser beam in a predetermined direction, and a parabolic mirror which reflects the deflected light to cause the deflected light to be incident upon the object in a direction perpendicular thereto. An f-θ lens can be used instead of the parabolic mirror.

According to another aspect of the present invention, a λ/4 plate is located in the light path of the laser beam, to polarize the beam reflected by the object, and a polarized beam splitter is provided to split the polarized beam. Further, a lens which converges the beam as split by the beam splitter, and a second optical detector which detects the converged beam, can be also provided. Preferably, a mask is provided in front of the second light detector to intercept the light reflected from the beam illuminating point on the object to be detected. Note, preferably PSD's are used as the light detectors. Assuming that the outputs of the first PSD are $I_a$ and $I_b$, the height information of the object is given by:

$$\frac{I_a - I_b}{I_a + I_b} \tag{1}$$

Assuming that the total output of the second PSD is $\alpha I$, when the outputs of the first PSD are adjusted by the output of the second PSD, the height information can be represented by the following equation:

$$\frac{I_a - I_b}{I_a + I_b - 2\Delta I} \tag{2}$$

It is possible to provide the second PSD and a third PSD on opposite sides of the first PSD. In this alternative, assuming that the outputs of the first, second, and third PSD's are $I_a$, $I_b$; $I_c$, $I_d$; and $I_e$, $I_f$ respectively, the height information of the object is given by:

$$\frac{I_a - I_b}{\{(I_a + I_b) - (I_c + I_d + I_e + I_f)/2\}} \tag{3}$$

With reference to FIG. 1, which shows a basic principle of an optical measuring system according to the present invention, the laser beam emitted from the laser beam source 21 is converted to a beam by the collimating lens 23. The laser beam is incident upon the deflecting mirror 25 at a predetermined incident angle, is deflected by the deflecting mirror 25, and the deflected light is incident upon the parabolic mirror 27 which reflects the light as a laser beam spot which is incident upon the object 50 to be detected at an incident angle perpendicular to the object. The laser beam spot is moved by the deflecting mirror 25 and the parabolic mirror 27 to scan the object.

A part of the reflected, diffused light from the object 50 is reflected by the mirror 29 and is then focused to form an image at the light detector 35 by the imaging lens (image forming lens) 33 through the deflecting mirror 25 and the parabolic mirror 27. The imaging, or image-forming lens is referred to variously hereinafter also as an image reforming lens, a converging lens, and/or a condenser lens. The output from the light detector 35 is processed by a signal processing circuit 45 which operates with a known method, so that a height signal $S_1$, and a brightness signal $S_2$ can be obtained as outputs.

The above discussion can be applied to an alternative embodiment in which the parabolic mirror 27 is replaced with the f.θ lens 41, as shown in FIG. 2. A scanning optical system, known per se, using the deflecting mirror 25 and the parabolic mirror 27 is widely used in a laser printer or the like.

To take out, or remove the diffusion light reflected from the illuminated point of the object, it is possible to provide a beam splitting means in the light path of the laser beam, to bring the thus-split beam outside onto the second light detector, so that the detected light information can be used as an arithmetic adjusting value of the output value of the first light detector.

Furthermore, if the second and third PSD's are provided on opposite sides of the first PSD, the output of the first PSD can be adjusted by the detected values of the second and third PSD's, to minimize a possible error due to light diffusion.

BRIEF DESCRIPTION OF THE DRAWINGS

The invention will be described below in detail with reference to the accompanying drawings, in which:

FIG. 5 is a schematic view of a light detector used in the present invention, by way of an example;

FIG. 17 is a diagram showing a technical effect of correction of a curved scanning beam;

FIGS. 18A and 18B are views showing a positional relationship between a parabolic mirror and a deflecting mirror according to the prior art and the present invention, respectively;

FIG. 19 is a schematic view of an optical system according to still another embodiment of the present invention;

DESCRIPTION OF THE PREFERRED EMBODIMENTS

Figure 1:
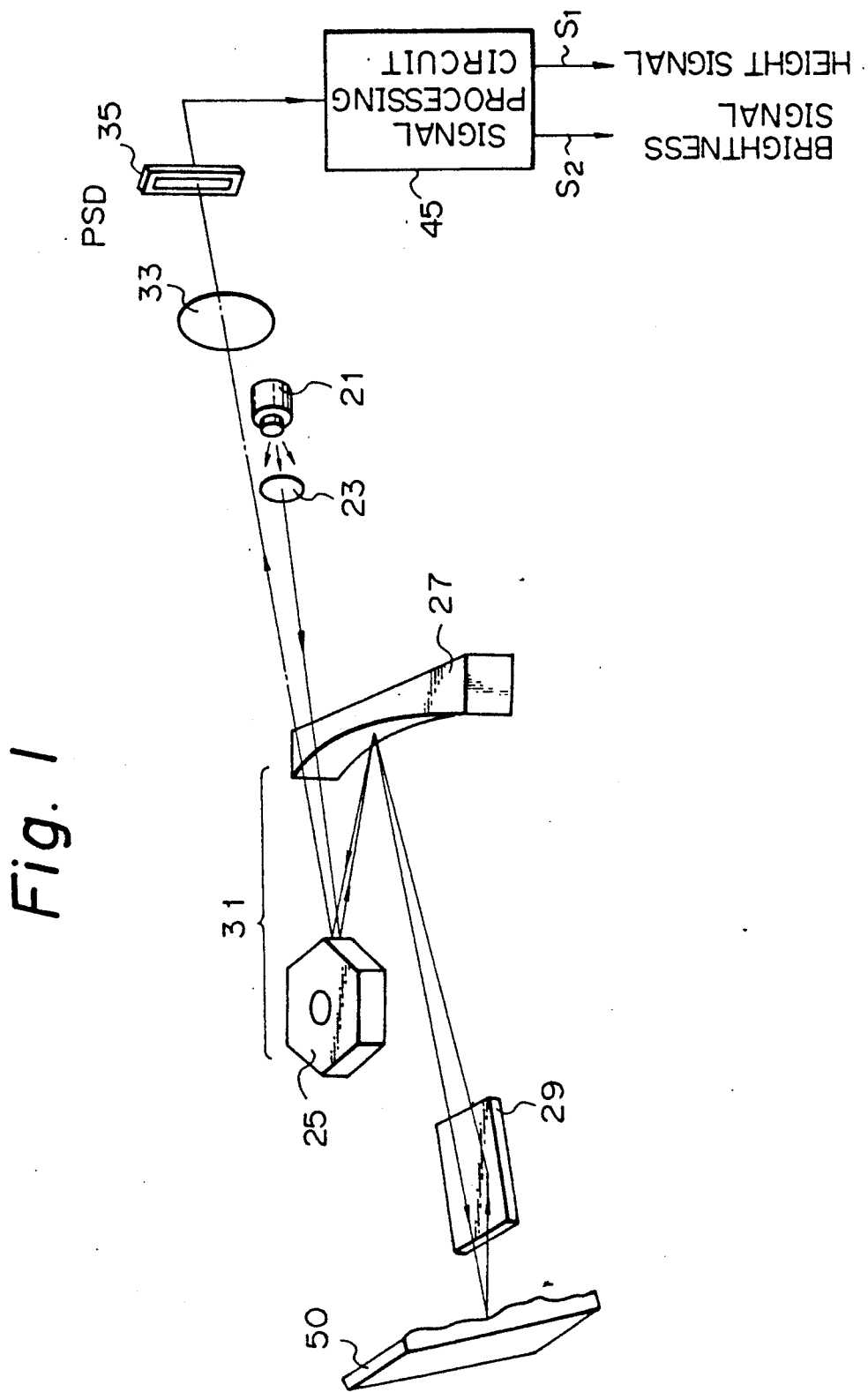
FIG. 1 is an explanatory perspective view showing a basic principle of an optical measuring system according to one aspect of the present invention.
Figure 3:
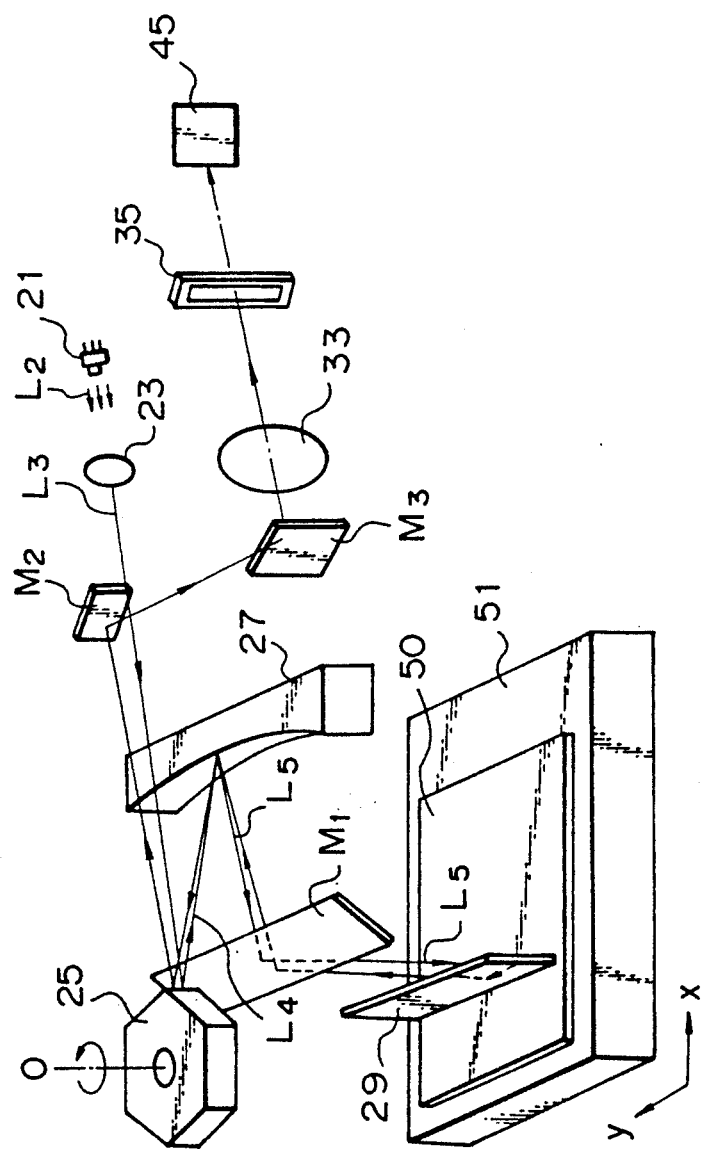
FIG. 3 is a schematic perspective view of an embodiment of an optical measuring system shown in FIG. 4 is a schematic view showing a measuring principle of an optical system shown in FIG. 3.

FIGS. 3 and 4 show an embodiment of the present invention, the basic construction thereof being similar to that shown in FIG. 1. In FIGS. 3 and 4, the elements corresponding to those shown in FIG. 1 are designated with the same reference numerals as used in FIG. 1.

In FIGS. 3 and 4, the laser beam $L_2$ from the laser source (e.g., laser diode) 21 is converted to a parallel beam $L_3$ by the collimating lens 23, and is then incident upon the deflection mirror 25. As the deflection mirror 25, a rotatable polygonal mirror known per se which rotates about an axis 0 can be used. The light $L_4$ reflected by the polygonal mirror 25 is reflected by the parabolic mirror 27 in a predetermined direction. As is well known, the parabolic mirror 27 produces an image at the focal length thereof. Accordingly, the object 50 to be detected, which is supported on a stage 51 movable in an orthogonal x-y plane, is located at the focal length of the parabolic mirror 27. In the illustrated embodiment, since the object 50 is located in the horizontal plane, a first mirror $M_1$ is located between the parabolic mirror 27 and the object 50, so that a scanning beam $L_5$ is directly and vertically incident upon the object 50 from above. The first mirror $M_1$ and second and third mirrors $M_2$ and $M_3$, which will be described in detail hereinafter, merely change the direction of the light beam path, and accordingly, may be omitted depending on the arrangement of the optical system, as shown in FIG. 1. Alternatively, it is also possible to additionally provide a fourth mirror, and fifth, sixth, ... mirror(s).

The mirror 29 which is located in the vicinity of the object 50 forms a very small inclination angle $\beta$ (FIG. 4) relative to the perpendicular to the object 50. The mirror 29 is also located close to the beam $L_5$ incident on the object 50 at a distance d from the incident point, so that a retroreflection system is formed in which the light reflected by the mirror 29 is close to and substantially parallel to the incident light thereupon. The diffusion light $L_6$ is reflected by the object 50. Namely, the reflected light $L_6$ returns along a returning path close to and substantially parallel to the incident path (going path) through the first mirror $M_1$, the parabolic mirror 27, and the polygonal mirror 25. The light is then condensed by the converging lens 33 onto the optical detector 35, optionally (FIG. 3) through the second mirror $M_2$ and the mirror $M_3$. The optical detector 35 is located at the focal length of the condenser ("image forming")lens 33, and thus the light (signal light) reflected from the object 50 is focused onto the optical detector 35 as a beam spot.

Note that the light (beam) is represented by an optical axis in the drawings.

The following discussion will be directed to a principle of measurement of a three-dimensional shape of the object 50 (mainly the height thereof) with reference to FIG. 4.

In FIG. 4, the lower height portion and the higher height portion of the object 50 are designated as A and B, respectively. The optical system shown in FIG. 3 is an image reformation system as mentioned above, and accordingly, the reflected light (signal light) can be converged at one point (the optical detector 35) regardless of the scanning of the beam. Since the mirror 29 forms a predetermined inclination angle $\beta$ with respect to the object 50, as mentioned before, the beam spot which is converged onto the optical detector 35 varies in accordance with the height of the object 50. Consequently, the beam spot from the point A is converged at the point A' and the beam reflected from the point B is converged at the point B', respectively. Namely, the height distribution of the object 50 can be detected by detecting the beam spots on the optical detector 35.

As the optical detector 35, for example, a PSD (Position Sensitive Detector) known per se, which is produced by and available on the market, for example, by Hamamatsu Photonics Co., Ltd. Japan, can be used. The PSD is a kind of photodiode which detects the position of the light point and the intensity of light thereat in accordance with the output therefrom. The response time (detection time) of the PSD is around 500 nsec, which is extremely short. It is possible to detect one light point within 1 $\mu$sec. which includes the processing time in the signal processing circuit 45.

It should be appreciated that, since the PSD can detect not only the position of the light point but also the light intensity as mentioned before, i.e. information on the brightness gradation, or degree, of the object also can be detected.

In FIG. 5, assuming that the output currents of the two output terminals of the PSD 35 are $I_a$ and $I_b$, the position of the light point (which corresponds to the height information of the object 50 in the illustrated embodiment) and the intensity of light (which corresponds to the gradation information of the object 50 in the illustrated embodiment) are given by the following equation:

$$\text{position} = \frac{I_a - I_b}{I_a + I_b} \quad (4)$$

$$\text{light intensity} = I_a + I_b \quad (5)$$

Figure 2:
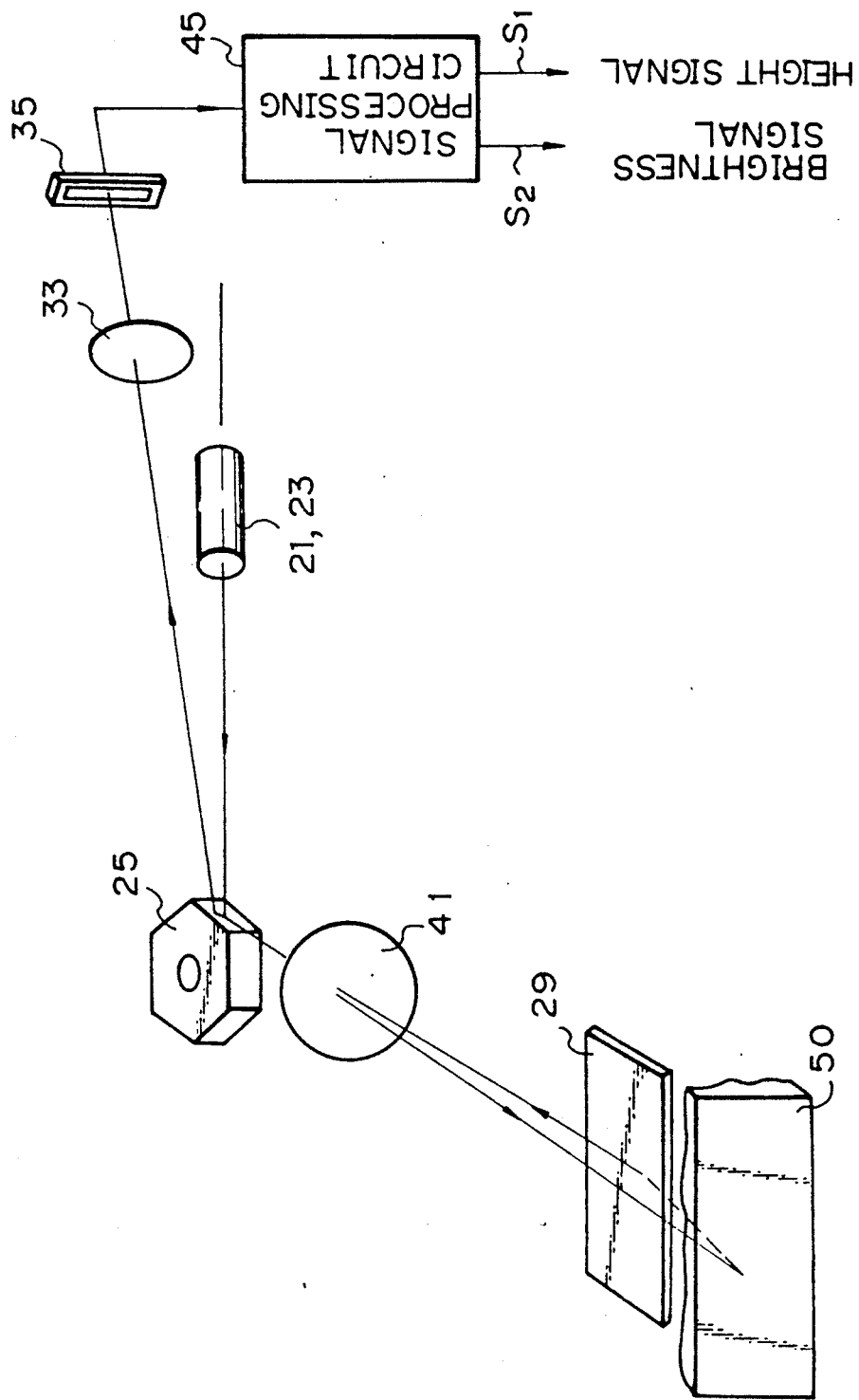
FIG. 2 is a view similar to FIG. 1, wherein an f-θ lens is used in place of a parabolic mirror shown in FIG. 1.

The invention can be similarly applied to an embodiment in which an f.$\theta$ lens 41 is used in place of the parabolic mirror 27, as shown in FIG. 2.

Generally speaking, however, when a scanning optical system is realized in combination with a deflection mirror, a parabolic mirror is more advantageous than an f.$\theta$ lens, from the following viewpoints:
(1) a longer scanning length (about 240 mm) can be easily obtained;
(2) a larger quantity of reflected light can be easily obtained;
(3) there is relatively less shading (i.e., greater light attenuation, producing a darker image, at the circumferential portion as compared to the central portion) of the quantity of reflected light Conversely, an F.$\theta$ lens has the following advantages:
(1) Substantially completely straight line scanning (i.e., the scanning beam is not curved but straight) can be realized. In the case of a parabolic mirror, usually the scanning beam is curved, and accordingly, a special means for correcting the curvature is necessary.
(2) A smaller beam spot diameter can be obtained.

In the embodiments mentioned above, it is possible to change the resolving power and range of measurement relative to the object by changing the distance d between the mirror 29 and the illuminating beam $L_5$ and the inclination angle $\beta$ of the mirror 29.

The resolving power and range of measurement relative to the object also can be modified by changing the focal length of the image reforming lens 33 and the surface area of the receiving surface of the PSD 35.

Figure 6:
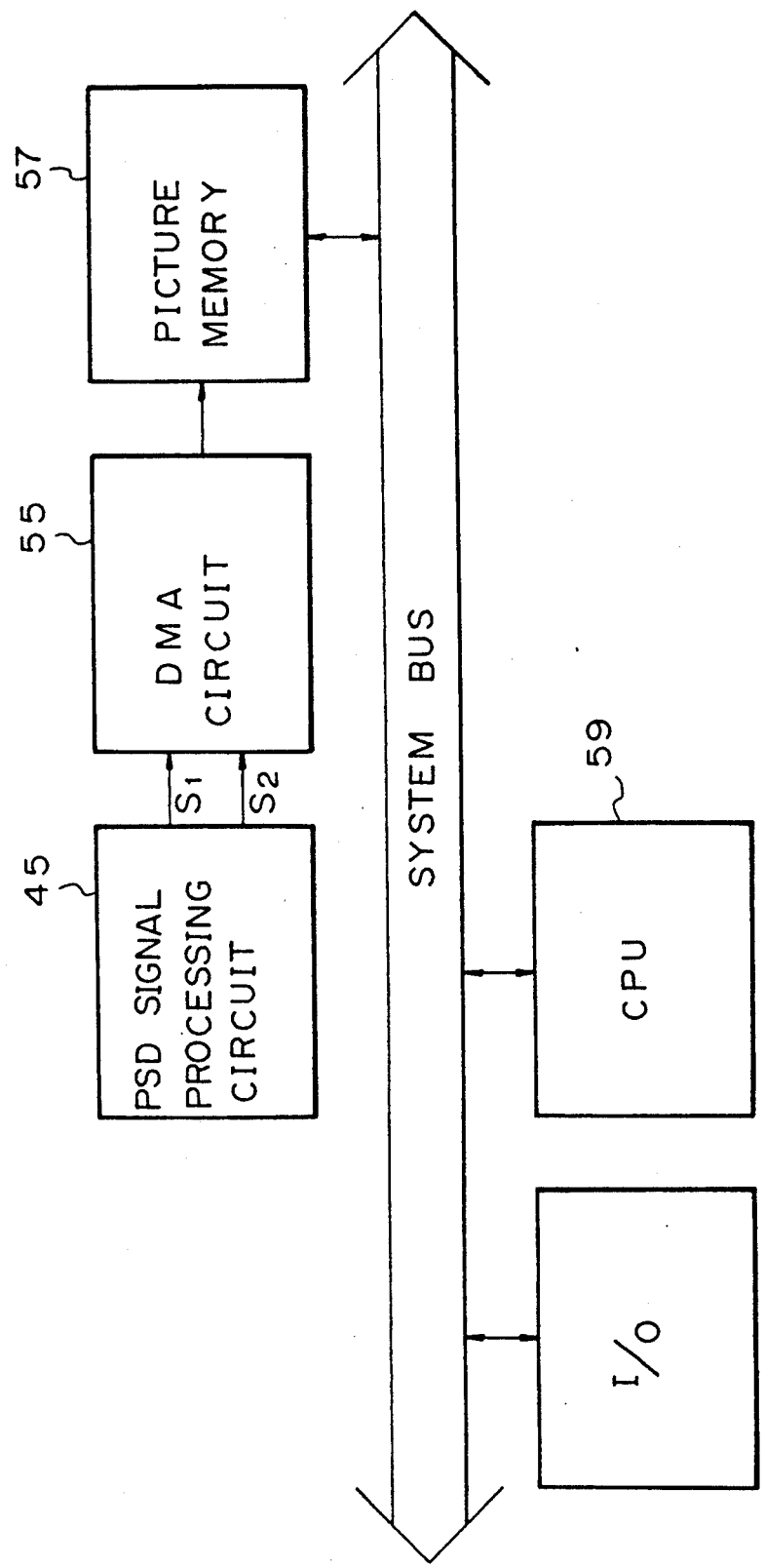
FIG. 6 is a block diagram of an image processing circuit according to an embodiment of the present invention.

FIG. 6 is an image processing system in accordance with the height information $S_1$ and the gradation (shading) information $S_2$ of the object detected by the optical system shown in FIG. 1. In the case of a detection of the height of the object 50, the object can be kept stationary and only the beam moved to scan the object in one dimension. In the case of a detection of the three-dimensional shape of the object 50, however, the object is moved in a direction (x or y direction) perpendicular to the scanning direction, by the x-y stage 51.

In FIG. 6, the signal processing circuit 45 performs the above-mentioned arithmetic processes (4) and (5) to obtain data of height and brightness. The data is sent to a picture memory 57 through a DMA (Direct Memory Access) circuit 55. The picture of the data ($S_1$ and $S_2$) input to the picture memory 57 is processed by CPU 59 so that, for example, the state of mounting of the object on a printed circuit board (not shown) can be checked. The subject of the present invention is not directed to the manner of picture-processing the signal detected by the signal processing circuit 45, and accordingly, no detailed explanation thereof is given.

Note that, in a beam scanning optical system using a parabolic mirror, it is usually necessary to offset the optical axis of the incident beam from the optical axis of the reflected beam, so that an off-axis angle is obtained between those beams. Otherwise, the incident beam will coincide with the reflected beam, and detection will be impossible, as discussed hereinafter.

By way of an example, assuming that the off-axis angle is 10°, the focal length f of the parabolic mirror 27 is 300 mm, and the polygonal mirror 25 is hexagonal, with six reflecting surfaces spaced from one another at 60 degrees, the laser scanning length is 240 mm. In this example, the effective scanning efficiency (rate of an effective reflecting angle to a whole reflecting mirror's angle of the polygonal mirror) is about 40%. If a PSD 35 which has a response time of 500 nsec. is used, the height and brightness of the object 50 can be detected at a speed of one M picture element/second. Taking the above-mentioned effective scanning efficiency into consideration, the mean measuring time is about 0.4 M picture element/second.

Figure 7:
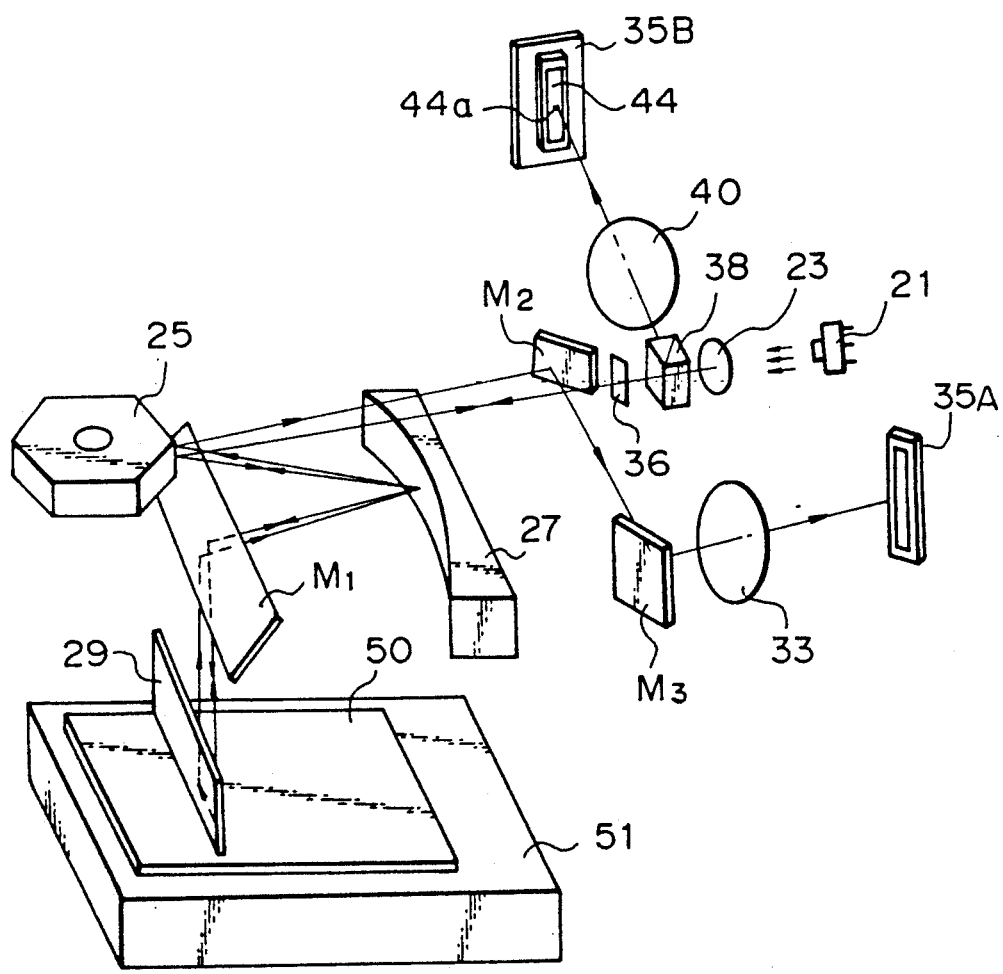
FIG. 7 is a view similar to FIG. 3, but according to another embodiment of the present invention.

FIG. 7 shows another embodiment of the present invention.

In the above-mentioned embodiment shown in FIG. 3, if the object 50 is made of a material having large light diffusion characteristics, not only the light reflected from the illumination point on the object but also the light reflected from the vicinity thereof are produced when the beam is converged onto the optical detector. Namely, the outputs $I_a$ and $I_b$ of the PSD 35 (FIG. 5) may include an unnecessary diffusion light signal $\Delta I$. Due to the diffusion light signal $\Delta I$, the measurement of the position of the light point obtained by the equation (4) mentioned above is smaller than the correct value, for the following reasons. Namely, the correct output currents, which do not include the diffusion light signal $\Delta I$, are $I_1$ and $I_2$, respectively, whereas the actual measurements thereof are given by the following equations.

$$I_a = I_1 + \Delta I$$

$$I_b = I_2 + \Delta I$$

As a result, the measurement of the height is given by:

$$\text{Measurement of Height} = \frac{(I_1 + \Delta I) - (I_2 + \Delta I)}{(I_1 + \Delta I) + (I_2 + \Delta I)} \quad (6)$$

$$= \frac{I_1 - I_2}{I_1 + I_2 + 2\Delta I}$$

On the other hand, the correct height is:

$$\text{Correct Height} = \frac{I_1 - I_2}{I_1 + I_2} \quad (6)$$

It is apparent from (6) and (7) that the correct height (7) is smaller than the measurement (6).

The arrangement illustrated in FIG. 7 can correct such an error. Namely, the light intensity of diffusion light, other than the beam spot to be detected, is detected and is subtracted from $(I_a + I_b)$.

FIG. 7 shows an embodiment of an optical system therefor, in which an optical system for detecting the diffusion light (referred to as excess diffusion light hereinafter) as distinguished from the necessary light of the beam spot to be detected, is additionally provided. The additional optical system has a polarization beam splitter 38 located in the light axis of the going path of the incident beam from the laser diode 21, a second condenser lens 40 which converges the split light beam of the polarization beam splitter 38, and a second optical detector, i.e., a second PSD 35B (in this case, the first mentioned PSD is referred to as a first PSD 35A) located at the focal point of the second condenser lens 40. Thus, the excess diffusion light which is reflected by the object 50 returns along the return light path. In front of the polarization beam splitter 38, which can be replaced with a mirror, is located a λ/4 plate 36 provided on the opposite side of the polarization beam splitter 38, relatively to the laser diode 21. The polarization beam splitter 38 transmits, for example, P-polarized light, therethrough and reflects S-polarized light. Accordingly, if the beam (linearly polarized light) of the going path is set to be P-polarized light, the excess diffusion light is converted to S-polarized light by the λ/4 plate 36 on the return path, so that the excess diffusion light is reflected by the polarization beam splitter 38, thereby to be converged onto the second PSD 35B by the second condenser lens 40. Thus, the excess diffusion light can be taken out from the return path into the second PSD 35B.

Note that since the optical system is in principle a usual, or conventional, image reforming (i.e. image forming) system, the position of the light point is fixed.

Preferably, a mask 44 is provided in front of the second PSD 35B to intercept the point of light, corresponding to the beam spot irradiated onto and reflected by the object 50, thereby to further ensure that only the excess diffusion light is taken out from the return path into the second PSD 35B. The mask 44 is a transparent plate which has an opaque portion 44a corresponding to the above specified point of light so that only the excess diffusion light can be incident on and detected by the second PSD 35B.

Strictly speaking, the excess diffusion light detected by the second PSD 35B is not exactly identical to the diffusion light which is detected by the first PSD 35A, since there is a difference in the angle of detection. But since the excess diffusion light is considered to be uniformly reflected in all directions, the difference can be ignored.

Figure 8:
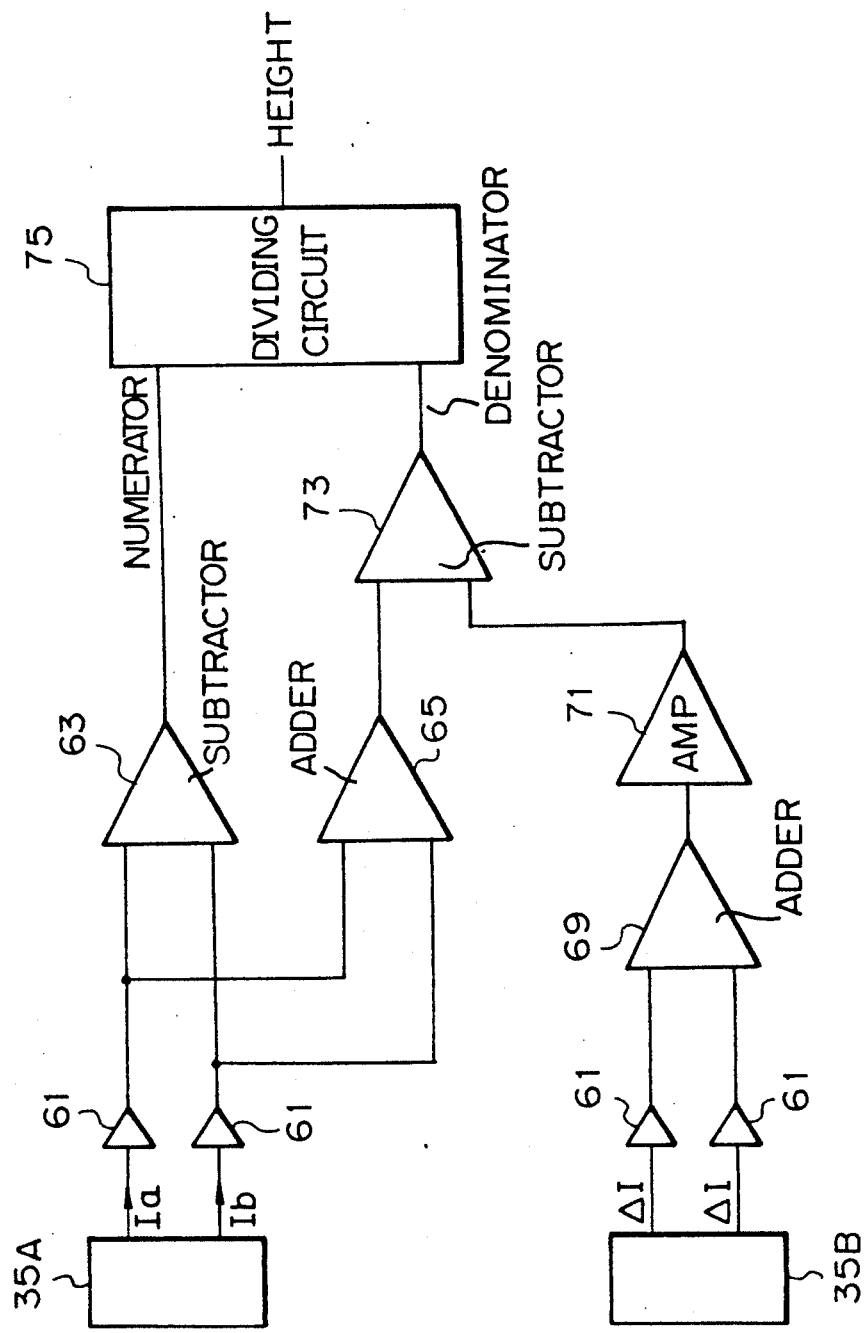
FIG. 8 is a block diagram of an arithmetic circuit of an optical system shown in FIG. 7.

FIG. 8 shows an example of an arithmetic circuit for use with the optical system shown in FIG. 7.

For the first PSD 35A, the sum and difference of the currents $I_a$ and $I_b$ are obtained by an adder 65 and a subtracter 63, respectively, as in the embodiment mentioned above. Note that although the measured current value is converted to a voltage value by a current-voltage converter 61 in an actual arithmetic process, the current will be used in the following explanation for simplification.

The outputs $\Delta I$ of the second PSD 35B are added by the adder 69.

Since the light of the laser diode is a linearly polarized light, there is almost no loss of illumination light in the going path. On the return path, however, the light is converted to the S-polarized light from the P-polarized light (or vice versa) by the $\lambda/4$ plate 36, as mentioned before, and accordingly, there is approximately a 50% loss of the reflected light. Therefore, it is preferable to amplify the signal of the sum of the outputs of the second PSD 35B by an amplifier 71. The 50% loss can be compensated by doubling the gain of the amplifier 71.

The sum signal of the first PSD 35A has subtracted therefrom the amplified sum signal of the second PSD 35B by the subtracter 73, so that the result is input to a denominator of a dividing circuit 75. On the other hand, the difference signal of the first PSD 35A is input to the numerator of the dividing circuit 75. In the divider 75, the following arithmetic process is performed to correct for the excess diffusion light:

$$\frac{I_1 - I_2}{I_1 + I_2 + 2\Delta I - 2\Delta I} = \frac{I_1 - I_2}{I_1 + I_2}$$

Figure 9:
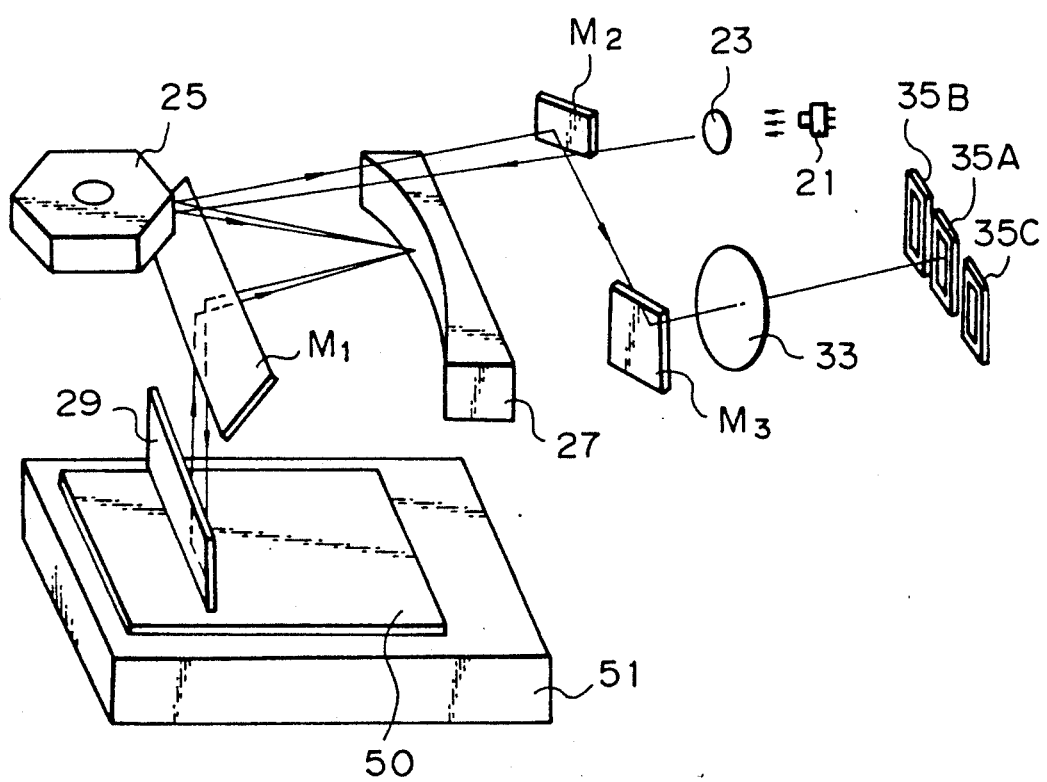
FIG. 9 is a view similar to FIG. 7, but according to another embodiment of the present invention.
Figure 10:
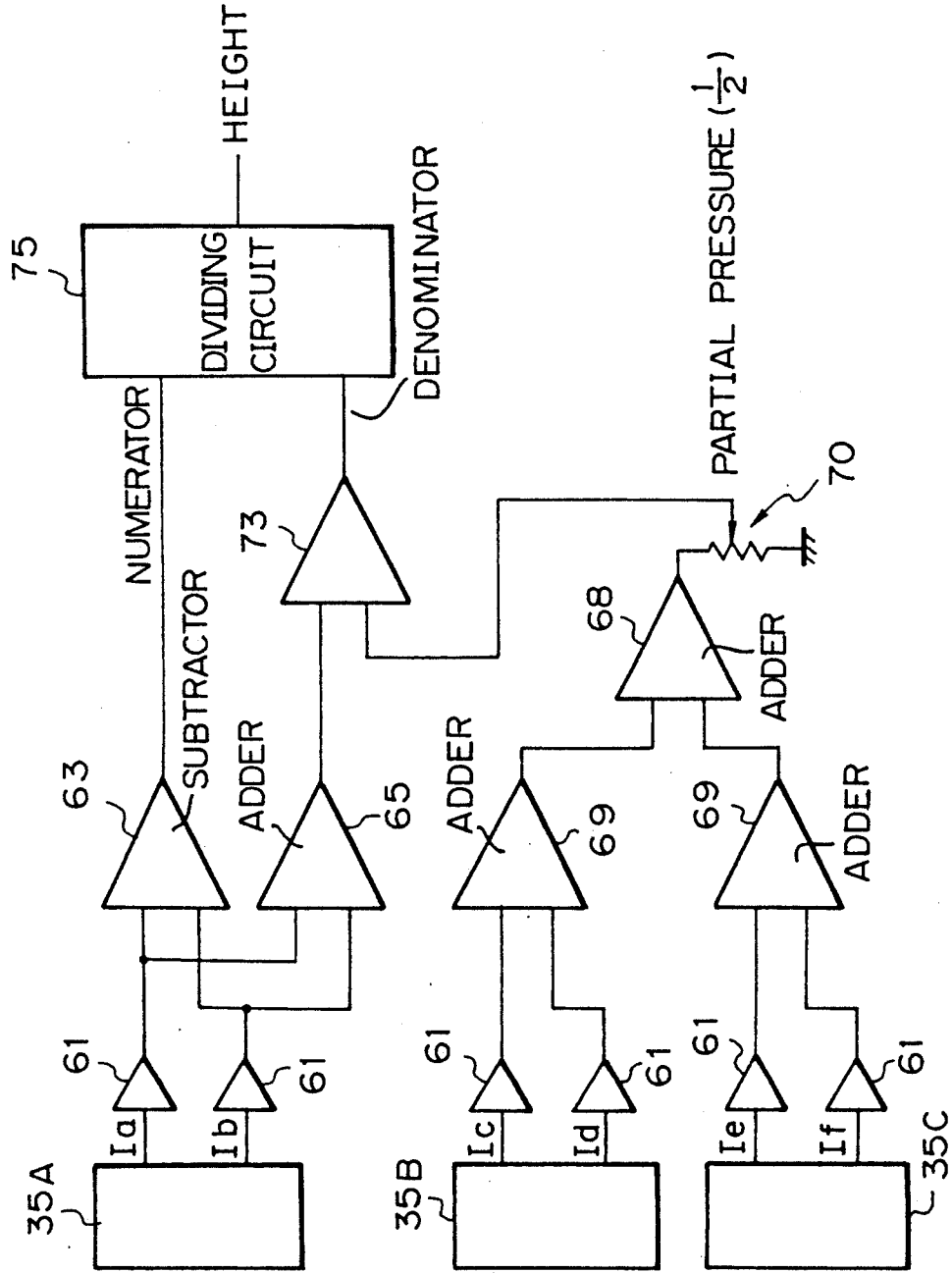
FIG. 10 is a block diagram of an arithmetic circuit of an optical system shown in FIG. 9.

FIGS. 9 and 10 show another embodiment of the present invention, in which second and third PSD's 35B and 35C are provided on opposite sides of the first PSD 35A for detecting the height of the object 50, to detect the excess diffusion light. The three PSD's 35A, 35B and 35C can be exactly the same type.

In this alternative, since the three PSD's each have the same light receiving surface area and photosensitivity, a more precise detection of the excess diffusion light can be expected. Namely, the diffusion light is considered to be uniformly reflected, as mentioned above, and the second and third PSD's 35B and 35C receive the same quantity of excess diffusion light.

The arithmetic circuit illustrated in FIG. 10 is basically the same as that of FIG. 8. The difference is that the mean value of the sum signal of the second PSD 35B and the sum signal of the third PSD 35C is subtracted from the sum signal of the first PSD 35A, in FIG. 10, thus differing from FIG. 8. Namely, the sum signal of the second PSD 35B and the sum signal of the third PSD 35C are added by an adder 68 and the sum value thus obtained is halved to obtain a mean value, which is then input to the subtractor 73.

In the arithmetic process shown in FIG. 10, the height signal is given by the following equation.

$$\frac{I_a - I_b}{\{(I_a + I_b) - (I_c + I_d + I_e + I_f)/2\}} \quad (9)$$

wherein $I_a$, $I_b$; $I_c$, $I_d$; $I_e$, $I_f$ are outputs of the first, second and third PSD's 35A, 35B and 35C.

The use of such a mean value contributes to a reduction of detection errors.

As can be seen from the foregoing, according to the present invention, the three-dimensional shape and the brightness of an object can be detected at one time within a extremely short space of time.

The provision of the second and third optical detectors makes it possible to precisely detect a shape of even a three-dimensional object made of a material having a light diffusion property, with a reduced possibility of error due to diffusion light.

As stated before, in the optical system using a parabolic mirror, the scanning beam is curved on a projection plane, due to the off-axis angle.

Figure 45:
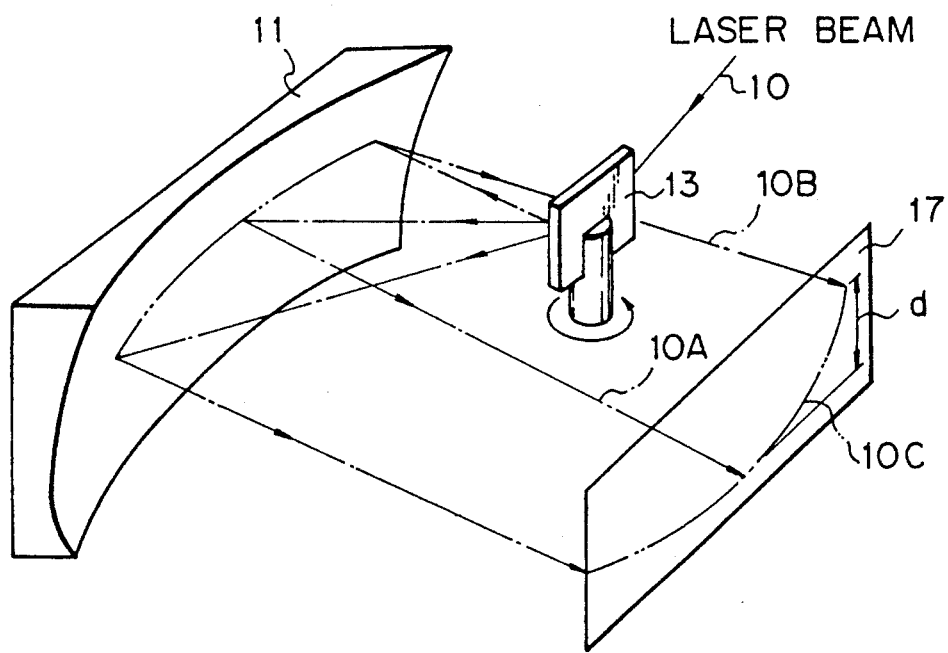
FIG. 45 is a schematic perspective view of a known scanning optical system.
Figure 46:
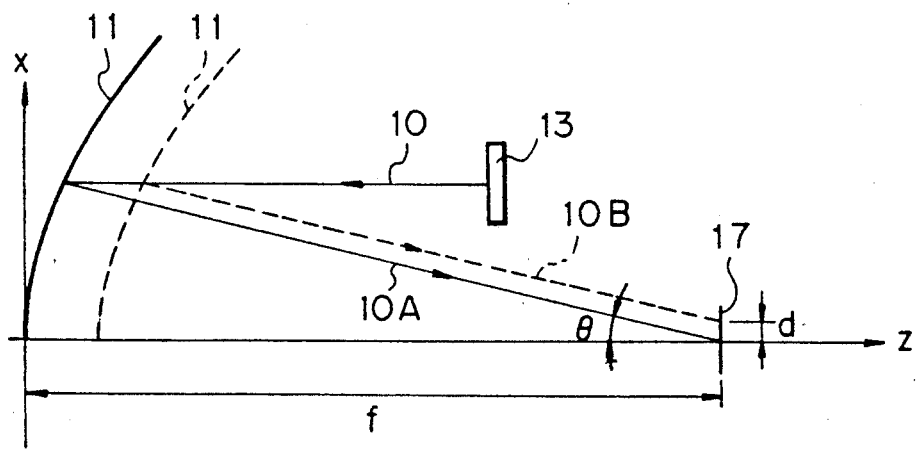
FIG. 46 is a front elevational view of FIG. 45.
Figure 47:
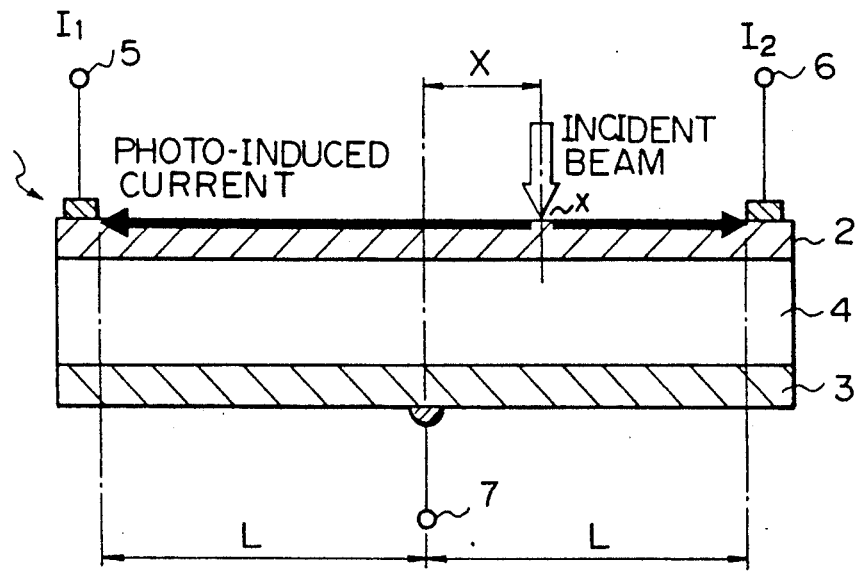
FIG. 47 is a sectional view of a known PSD.

FIGS. 45 and 46 show the circumstance of such a curved scanning beam. In FIGS. 45 and 46, the laser beam 10 is transmitted in a predetermined direction in a horizontal plane parallel to the z-axis and is then reflected by a rotational mirror 13 (corresponding to the polygonal mirror 25 in FIG. 1) or a galvanomirror into a predetermined direction to be incident upon the parabolic mirror 11. The beam 10 incident upon the parabolic mirror 11 is reflected thereby to be focused onto the scanning plane (projection plane 17).

Although the scanning beam is moved in accordance with rotation of the rotational mirror 13, so that the incident points of the beam on the parabolic mirror 11 successively change, since the parabolic mirror 11 has a three-dimensional curved shape like a parabolic antenna, the optical distance between the parabolic mirror 11 and the projection plane 17 successively changes in accordance with the reflecting points on the parabolic mirror 11, as shown at 10A, 10B in FIG. 46. As a result, the point at which the image is formed is deviated on the projection plane 17, so that the scanning beam is curved as shown at 10C in FIG. 45. The curvature is represented by the difference d in height of the scanning beam. Note that the off-axis angle is designated by $\theta$ in FIG. 46.

The inventors of the present invention investigated the problem of curved scanning and formed that the curved scanning beam is caused because the beam reflected by the parabolic mirror describes a curved track corresponding to the curved beam 10C on the projection plane 17. The simplest solution is to produce a beam reflected by the parabolic mirror so as to describe a curved track which cancels the curvature of the beam produced on the projection plane. To this end, according to an aspect of the present invention, basically the beam is made to be incident on the rotational mirror at an incident angle which is inclined with respect to the optical axis of the rotational mirror.

Figure 11:
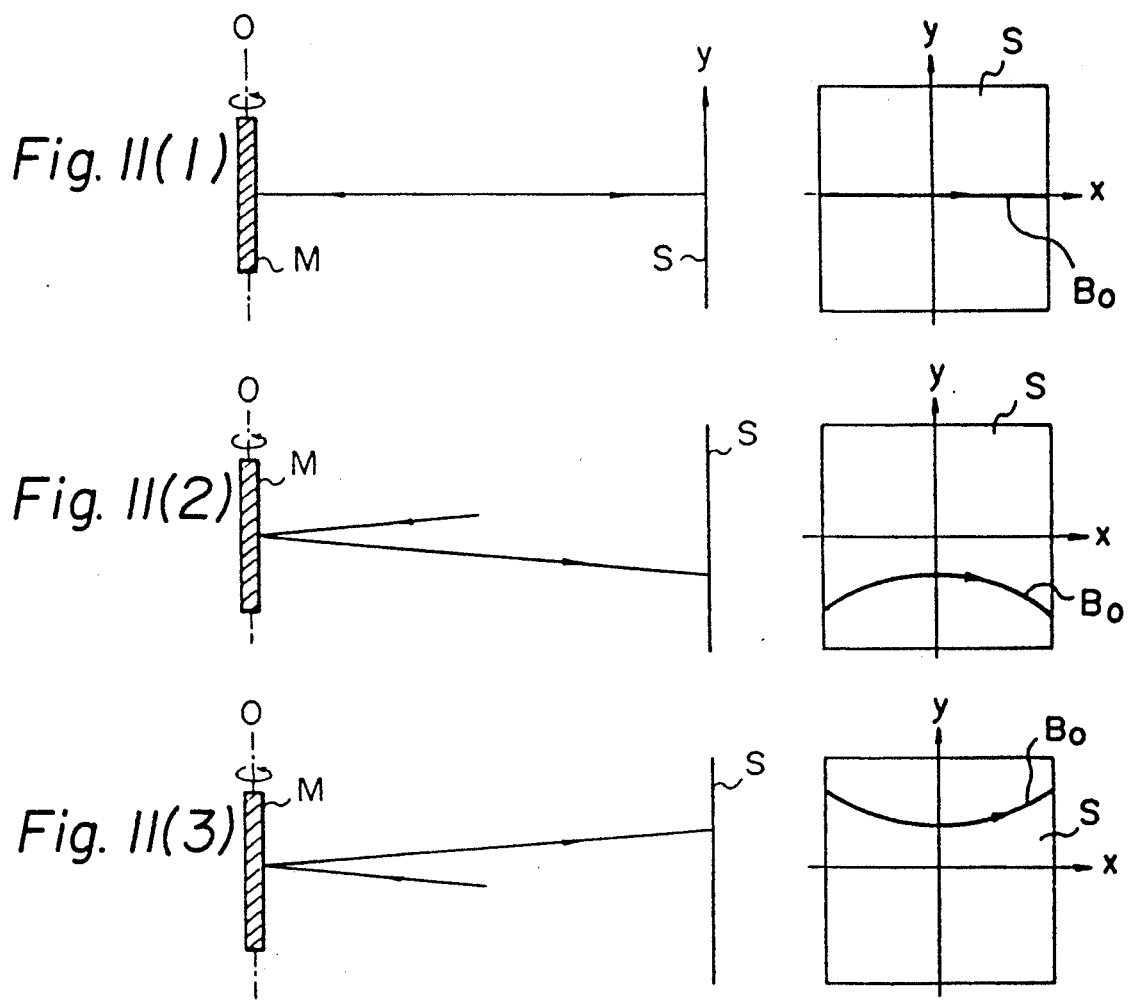
FIG. 11 (1), 11(2), and 11(3) are schematic views showing relationships between beam incident angles and tracks of reflected beams, with respect to a deflection mirror, according to the present invention.

FIG. 11 shows a basic principle of the correction of curvature of the scanning beam.

General speaking, a light is incident upon a deflection mirror (rotational mirror) M at an incident angle perpendicular to the rotational axis O thereof, and a track $B_0$ of the deflected beam is a straight line when viewed on the projection plane S, as shown in FIG. 11(1). On the other hand, when a light is incident upon the rotational mirror from an inclined direction with respect to the rotational axis O, the track $B_0$ of the deflected beam has an arched curve, since the optical path length is not same, as shown in FIGS. 11(2) and (3). In FIG. 11(2), the beam is incident from an upwardly inclined direction, and in FIG. 11(3), the beam is incident from a downwardly inclined direction. The curvature depends on the beam incident angle. Namely, it is possible to provide a desired curve of the track $B_0$ by selecting a suitable beam incident angle. The invention utilizes this principle. Namely, the curvature which will be later produced by the parabolic mirror is cancelled by an intended curvature of a deflected beam reflected by the deflection mirror.

In a distortion correcting apparatus according to the present invention, a beam is incident upon the deflection mirror from an incident angle inclined with respect to the rotational axis thereof, so that the track of the deflected beam thus obtained describes a curve which cancels the curvature of the scanning beam produced by the parabolic mirror.

With this arrangement, when the beam is incident on the deflection mirror from an inclined direction, the deflected beam describes a curved track, as mentioned above. On the other hand, the scanning beam by the parabolic mirror also describes a curved track, as a matter of course and as mentioned above. The curved track of the deflected beam is opposite to the curved track of the scanning beam produced by the parabolic mirror and thus they cancel each other out, with the result that the scanning beam follows a substantially straight track, or path, on the scanning plane.

Preferably, the parabolic mirror has a pre-determined off-axis angle and the incident angle of the beam upon the deflection mirror is about 0.65 times the off-axis angle. It has been experimentally confirmed that an optimum linear scanning beam can be obtained when the beam is incident upon the deflection mirror from the front of the deflection mirror, when the deflection mirror directly faces the parabolic mirror.

With this arrangement, the deflection mirror can cover the necessary deflection angle only at a small center portion thereof, thus resulting in a realization of a small deflection mirror.

Furthermore, preferably the rotational axis of the deflection mirror is inclined with respect to a line normal to the optical axis of the parabolic mirror, at an angle identical to the incident angle of the beam on the parabolic mirror. This makes the reflected light of the deflection mirror parallel with the optical axis of the parabolic mirror.

Figure 12:
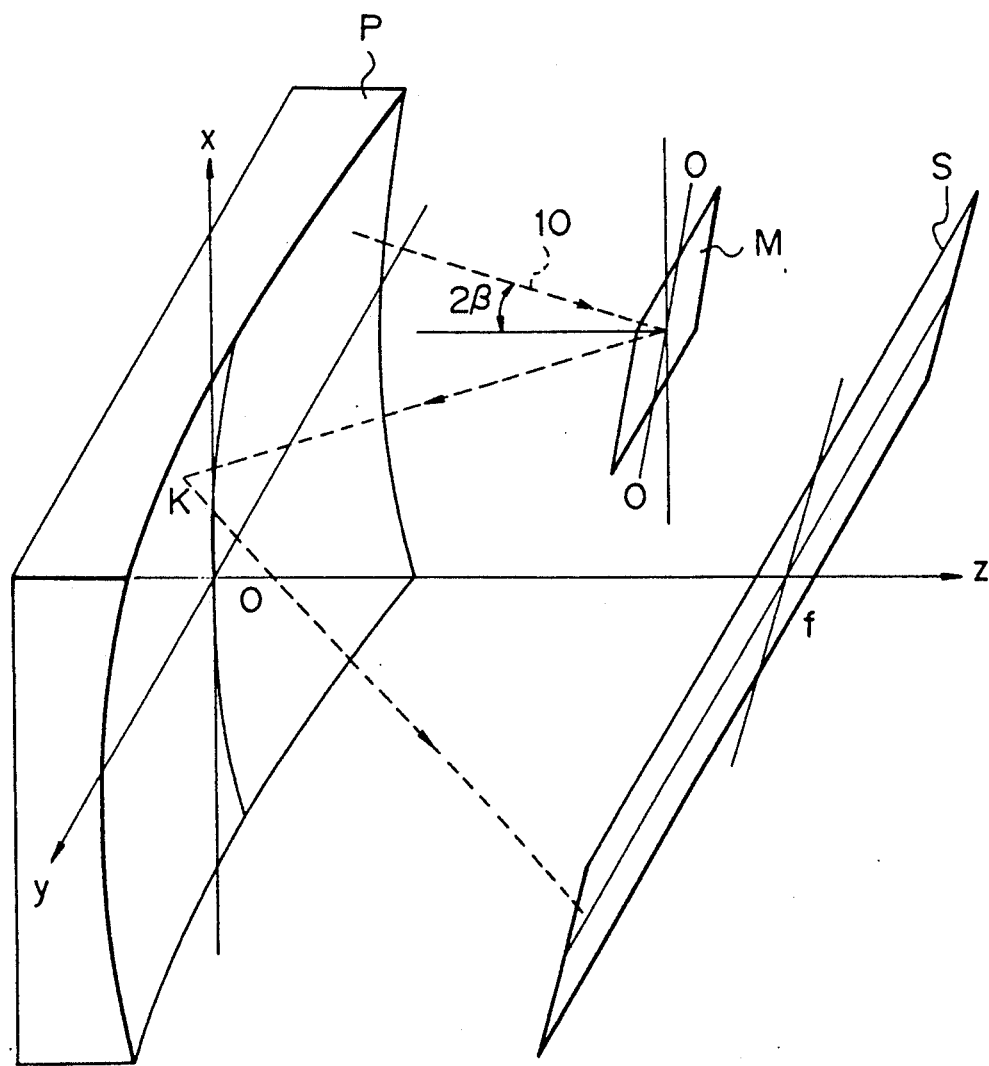
FIG. 12 is a schematic view of an optical coordinate arrangement of an optical system shown in FIG. 11.
Figure 13:
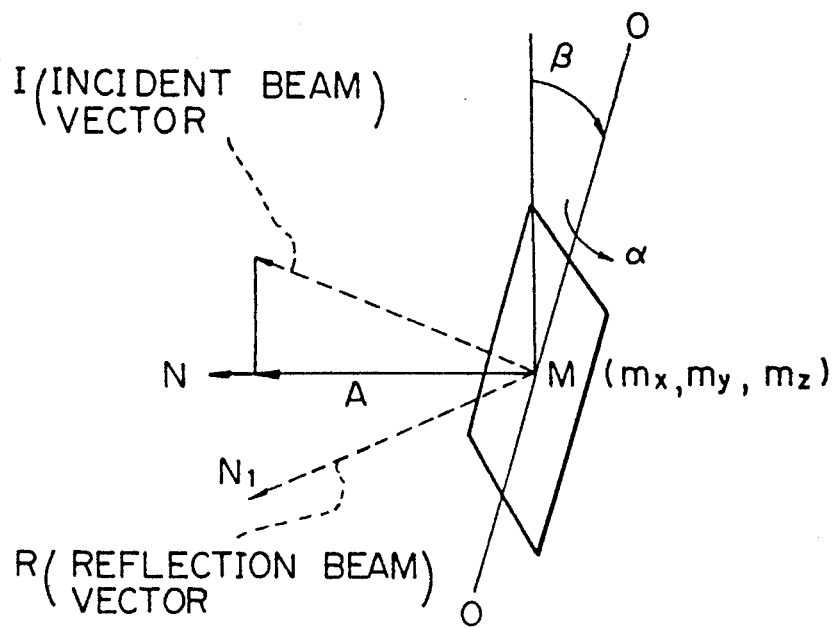
FIG. 13 is a schematic view showing the reflection of the beam by a deflection mirror.
Figure 14:
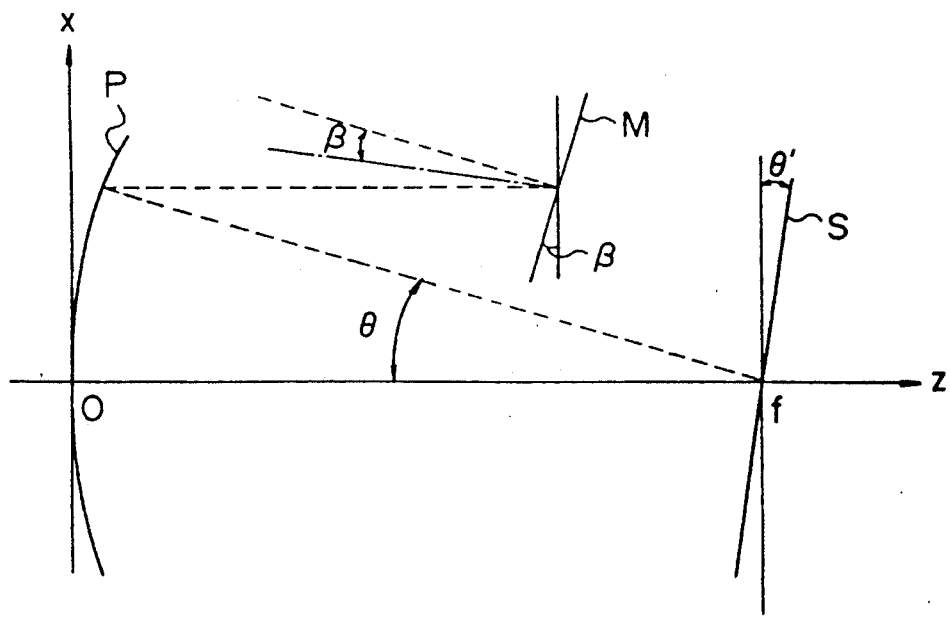
FIG. 14 is an explanatory view of a coordinate of an illuminating spot on a projecting plane.

Concrete arrangements of the elements of the optical system for correcting the distortion mentioned above will be discussed below, with reference to FIGS. 12, 13 and 14.

1. Introduction of Normal Vector of Deflection Mirror M

The incident angle $\beta$ of the beam 10 upon the deflection mirror (rotation mirror) M can be obtained by a geometrical calculation based on the focal lengths of the parabolic mirror P, the off-axis angle, the scanning length, and deflection position, in an orthogonal three-dimensional x-y-z coordinate system. The incident angle $\beta$ will be referred to as a curvature correcting angle.

It is assumed that the rotation angle of the deflection mirror M is $\beta$ when viewed in the counterclockwise direction from the x-axis (i.e., the direction of the optical axis of the parabolic mirror) and that the inclination angle of the rotational axis O-O of the deflection mirror M is $\beta$ when viewed in the clockwise direction from the y-axis (i.e., the direction of a normal frame perpendicular to the optical axis of the parabolic mirror).

Assuming that a normal unit vector of the deflection mirror at $\alpha=\beta=0$, is $N_0$, where:

$$N_0 = (0, 0, -1) \tag{10}$$

Rotation matrix is given by the following equation.

$$R_x(\alpha) = \begin{bmatrix} 1 & 0 & 0 \\ 0 & \cos\alpha & \sin\alpha \\ 0 & -\sin\alpha & \cos\alpha \end{bmatrix} \tag{11}$$

$$R_y(\beta) = \begin{bmatrix} \cos\beta & 0 & \sin\beta \\ 0 & 1 & 0 \\ -\sin\beta & 0 & \cos\beta \end{bmatrix} \tag{12}$$

The normal unit vector N of the deflection mirror is given by the following equation.

$$\begin{aligned} N &= N_0 R_x(\alpha) R_y(\beta) \\ &= (0, \sin\alpha, -\cos\alpha) R_y(\beta) \\ &= (\cos\alpha \cdot \sin\beta, \sin\alpha, -\cos\alpha \cdot \cos\beta) \end{aligned} \tag{13}$$

2. Introduction of Equation of Reflected Light of Deflection Mirror M

Assuming that the vector of the incident beam on the deflection mirror is I (the direction is opposite to the beam), and the vector of the reflected beam thereby is R (the direction is same as the beam), respectively, $$I = (\tan 2\beta, 0, -1) \tag{14}$$
$$A = I \cdot N = \tan 2\beta \cos\alpha \sin\beta + \cos\alpha \cos\beta \tag{15}$$
$$N_1 = (I \cdot N)N = AN \tag{16}$$
$$\begin{aligned} R &= 2N_1 - I = 2AN - I \\ &= 2(\tan 2\beta \cdot \cos\alpha \cdot \sin\beta + \cos\alpha \cdot \cos\beta) \times \\ &\quad (\cos\alpha \cdot \sin\beta, \sin\alpha, -\cos\alpha \cdot \cos\beta) - \\ &\quad (\tan 2\beta, 0, -1) = (r_x, r_y, r_z) \end{aligned} \tag{17}$$

When the coordinate of the reflecting point of the deflection mirror is $(m_x, m_y, m_z)$, the reflected beam is represented by the following equation, wherein u is a parameter.

$$\begin{aligned} (x, y, z) &= uR + (m_x, m_y, m_z) \\ &= (ur_x + m_x, ur_y + m_y, ur_z + m_z) \end{aligned} \tag{18}$$

$$\begin{cases} x = ur_x + m_x & (19) \\ y = ur_y + m_y & (20) \\ z = ur_z + m_z & (21) \end{cases}$$

3. Introduction of Coordinate of Intersecting Point of Reflected Light and Parabolic Mirror The paraboloid is represented by the following equation:

$$z = (x^2 + y^2)/(4f) \tag{22}$$

wherein f is focal length of the paraboloid.

When the term "z" of equation (22) is replaced by equation (21), then $$(x^2 + y^2)/(4f) = ur_z + m_z \tag{23}$$

By inserting equations (19) and (20) in equation (23), then $$\{(Ur_x + m_x)^2 + (Ur_y + m_y)^2\}/(4f) = Ur_z + m_z \quad (24)$$

When u in equation (24) is represented by the following $u_k$:

$$u_k = \{-(r_x m_x + r_y m_y - 2fr_z) \pm \sqrt{((r_x m_x + r_y m_y - 2fr_z)^2 - (r_x^2 + r_y^2)(m_x^2 + m_y^2 - 4fm_z))}\}/(r_x^2 + r_y^2) \quad (25)$$

When $\alpha = 0$, $$u_k = (4fm_z - m_x^2 - m_y^2)/(2(r_x m_x + r_y m_y - 2fr_z)) \quad (26)$$

The coordinate $(k_x, K_y, K_z)$ of the intersecting point K of the reflected light and the paraboloid is given by the following equations.

$$k_x = u_x r_x + m_x \quad (27)$$
$$k_y = u_y r_y + m_y \quad (28)$$
$$k_z = u_z r_z + m_z \quad (29)$$

4. Equation of Reflected Light of Parabolic Mirror

The normal unit vector $N_k$ at the intersecting point K on the parabolic mirror is given by the following equation.

$$N_k = (-K_x/2f, -k_y/2f, 1)/\sqrt{(k_x/2f)^2 + (K_y/2f)^2 + 1}$$

The vector S of the reflected light of the paraboloid is given by:

$$S = 2(R \cdot N_k)N_k - R$$
$$S_0 = (-k_x r_x/f - k_y r_y/f + 2r_z)/(k_x/2f)^2 + (k_y/2f)^2 + 1 \quad (30)$$
$$S_x = -S_0 k_x/2f - r_x \quad (31)$$
$$S_y = -S_0 k_y/2f - r_y \quad (32)$$
$$S_z = S_0 - r_z \quad (33)$$

Consequently, the reflected light of the parabolic mirror is represented by the following equations.

$$x = S_x t + k_x \quad (34)$$
$$y = S_y t + k_y \quad (35)$$
$$z = S_z t + k_z \quad (36)$$

5. Beam Spot Illuminating Position

The coordinate of the beam illuminating plane (projection plane) is represented by the following equation.

$$z = \tan\theta x + f \quad (37)$$

When equation (36) is replaced by equation (37), then $$t = (\tan\theta x + f - k_z)/S_z \quad (38)$$

The scanning position can be obtained by inserting t given by equation (38) in equations (34) and (35). Note that the scanning plane has an inclination angle $\theta'$ with respect to the x-axis. (Note that $\theta' + \theta$, the off-axis angle, so that the light beam is normal to, and thus incident on plane S in a perpendicular direction.) Accordingly, it is necessary to divide the X position $(X_s)$ by $\cos\theta'$. As a result, $$X_s = (S_x t + k_x)/\cos\theta' \quad (39)$$

From the above mentioned calculation, the track (curvature) of the scanning light can be obtained.

Figure 15:
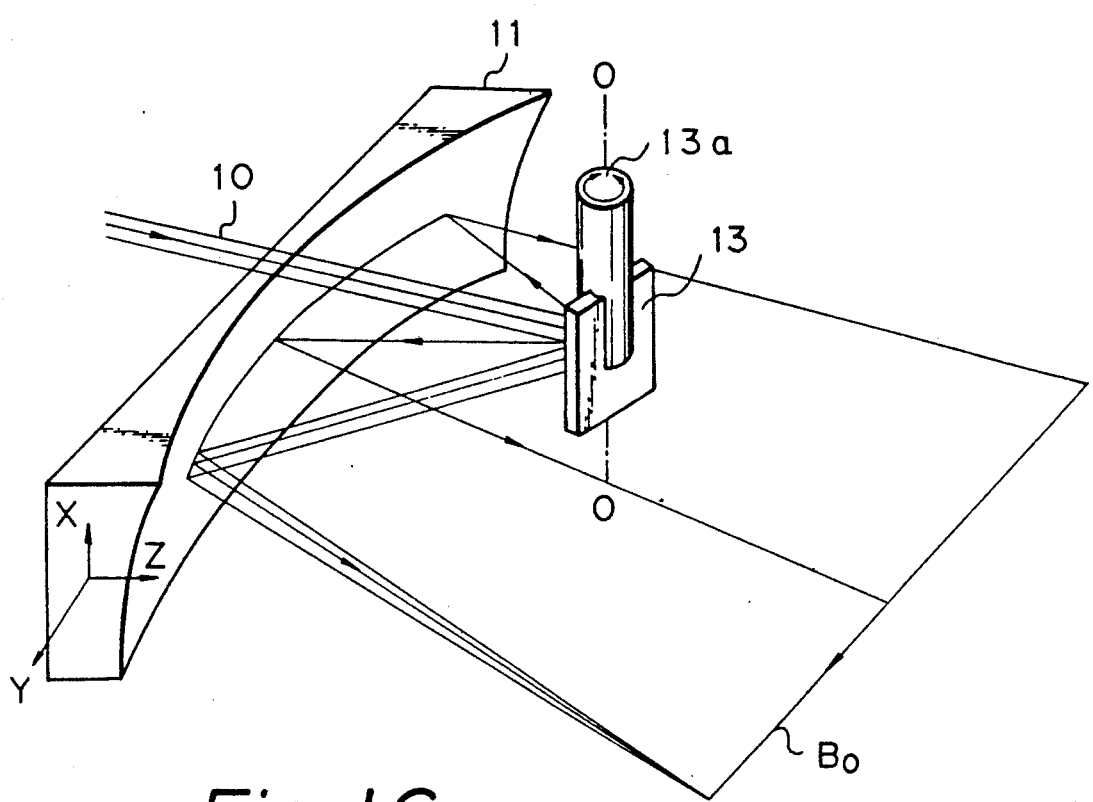
FIG. 15 is a schematic perspective view of an embodiment of an optical system shown in FIG. 12.
Figure 16:
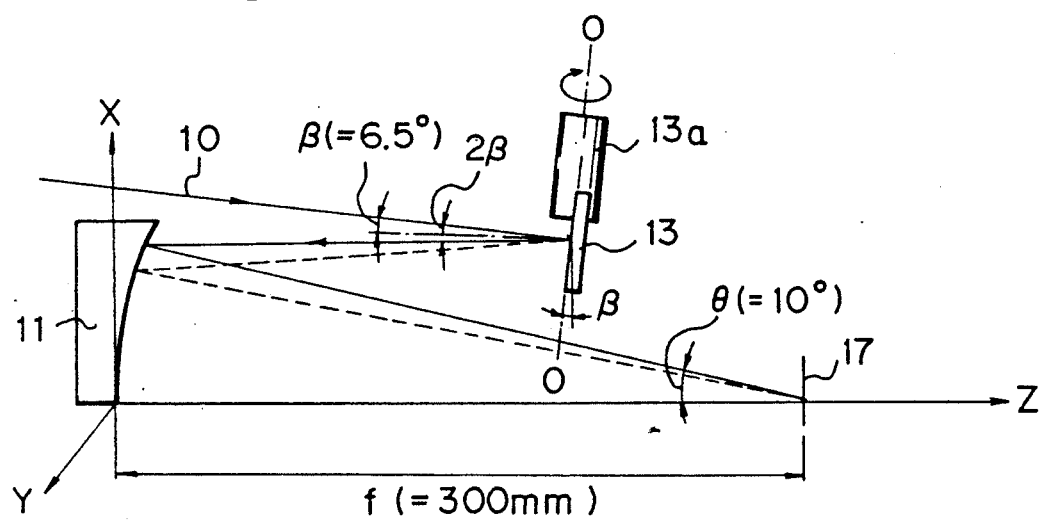
FIG. 16 is a front elevational view of FIG. 15.

FIG. 15 and 16 show an embodiment of a curvature correcting optical system according to the present invention.

From the viewpoint of hardware, the arrangement shown in FIGS. 15 and 16 is basically the same as that of FIG. 45. Namely, the parabolic mirror 11 is located in front of the deflection mirror 13 which rotates about the rotational shaft 13a. The rotational shaft 13a is connected, for example, to a motor (not shown), so that it can be rotated about an axis O—O. The deflection mirror 13 can be a rotational mirror (polygonal mirror) and can be replaced by a galvanomirror or the like. Preferably, the rotational axis O—O of the deflection mirror 13 is inclined by an angle equal to the curvature correcting angle $\beta$, with respect to the x-axis. This is because, when the beam is incident on the deflection mirror 13 at an incident angle equal to the curvature correcting angle $\beta$, the beam reflected by the deflection mirror 13 is in parallel with the optical axis (z-axis) of the parabolic mirror 11, as mentioned before. Namely, the parabolic mirror 11 converges the collimated light onto the focal point thereof (i.e., the projection plane 17 located at the focal length f from the parabolic mirror 11), and accordingly, it is preferable to make the beam incident on the parabolic mirror 11, i.e., the beam reflected by the deflection mirror 13 parallel to the z-axis.

Alternatively, it is possible to arrange the deflection mirror (especially, the polygonal mirror), which has a vertically extending rotational axis, and to relatively incline the parabolic mirror 11 and the projection plane 17 by an angle equal to the inclination angle $\beta$.

As a result, the beam which is incident on the deflection mirror 13 at an incident angle equal to the curvature correcting angle $\beta$ is reflected at the same reflection angle $\beta$, so that the reflected light is incident on the parabolic mirror 11 as a collimated beam.

In the illustrated embodiment, the focal length f of the parabolic mirror is 300 mm (f=300 mm), the off-axis angle $\theta$ of the parabolic mirror is 10°, the beam scanning length (the necessary length of the scanning beam $B_0$ is 250 mm, and the curvature correcting angle $\beta$ is 6.5° ($\beta = 6.5°$). In the prior art in which the beam is incident on the deflection mirror in a direction normal thereto, and accordingly in the context of the present invention, the curvature correcting angle $\beta = 0°$, a curvature of about 3 mm has occurred. On the contrary, in our invention, the scanning beam curvature is less than ±50 μm, which is substantially straight, and this has been experimentally confirmed as shown in FIG. 17.

The direction of incidence of the incident beam is preferably such that when the angular displacement of the deflection mirror 13 is zero, i.e., when the deflection mirror directly faces the parabolic mirror 11, the incident beam is incident upon the deflection mirror from the front in the direction of the z-axis or parallel therewith. This is shown in FIG. 18B.

FIG. 18A shows a prior art arrangement in which the beam is incident upon the deflection mirror 13 at an angle of 90° with respect to the optical axis of the parabolic mirror 11. Therefore, to move the scanning beam so as to cover a desired angular range, the deflection mirror 13 must have a sufficient length l. Namely, if the length of the deflection mirror 13 is small, when the angular displacement of the deflection mirror becomes large in accordance with the rotation thereof, i.e., when the deflection mirror rotates toward a vertical position parallel to the parabolic mirror, the incident beam extends beyond of the longitudinal end edges of the deflection mirror 13, i.e., the beam is not incident on the deflection mirror.

On the contrary, in our invention, as shown in FIG. 18B, since the incident beam is incident on the deflection mirror from directly in front thereof, accordingly it is necessary to illuminate only the small area in the vicinity of the center of the deflection mirror, thus resulting in a small deflection mirror. According to a simple calculation, the length l of the deflection mirror shown in FIG. 18B is about 70% of that of the deflection mirror shown in FIG. 18A.

FIG. 19 shows another embodiment different from FIGS. 15 and 16. The relationship between the incident beam and the reflected beam shown in FIG. 19 is opposite to that of the above-mentioned embodiment. In FIG. 19, the deflection mirror 13 is located at the focal point of the parabolic mirror 11, so that the rotational axis thereof is inclined by an angle corresponding to the curvature correcting angle $\beta$ with respect to the vertical direction. Accordingly, when the beam is incident upon the deflection mirror 13 at an angle $\beta$, the beam reflected by the parabolic mirror 11 is in parallel with the z-axis of the parabolic mirror. Namely, the embodiment illustrated in FIG. 19 can be used to produce a reflected beam which is parallel with the optical axis (z-axis) of the parabolic mirror.

Figure 20:
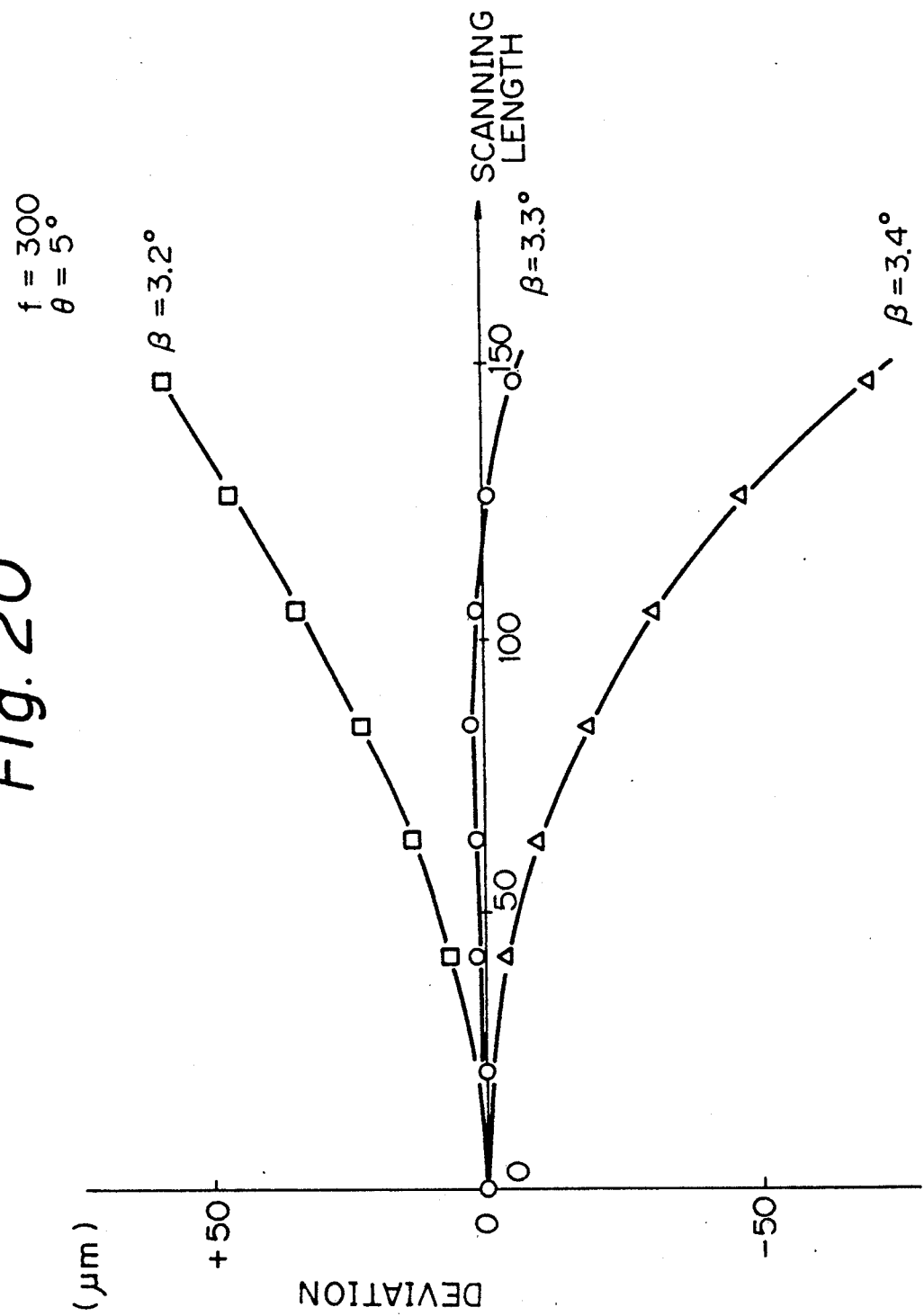
FIGS. 20 and 21 are diagrams showing experimental results of scanning tracks, according to the present invention.
Figure 21:
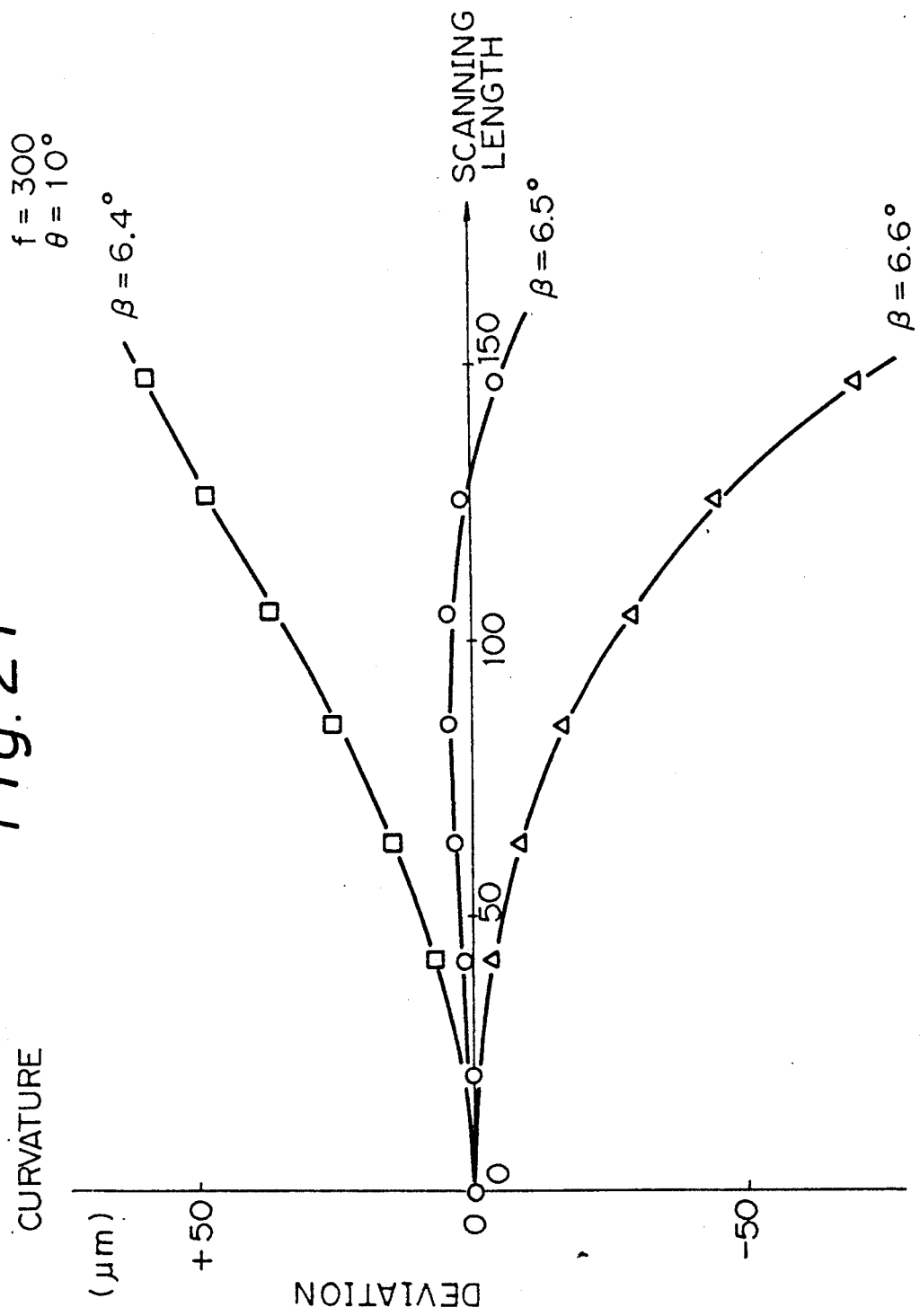
Figure 22:
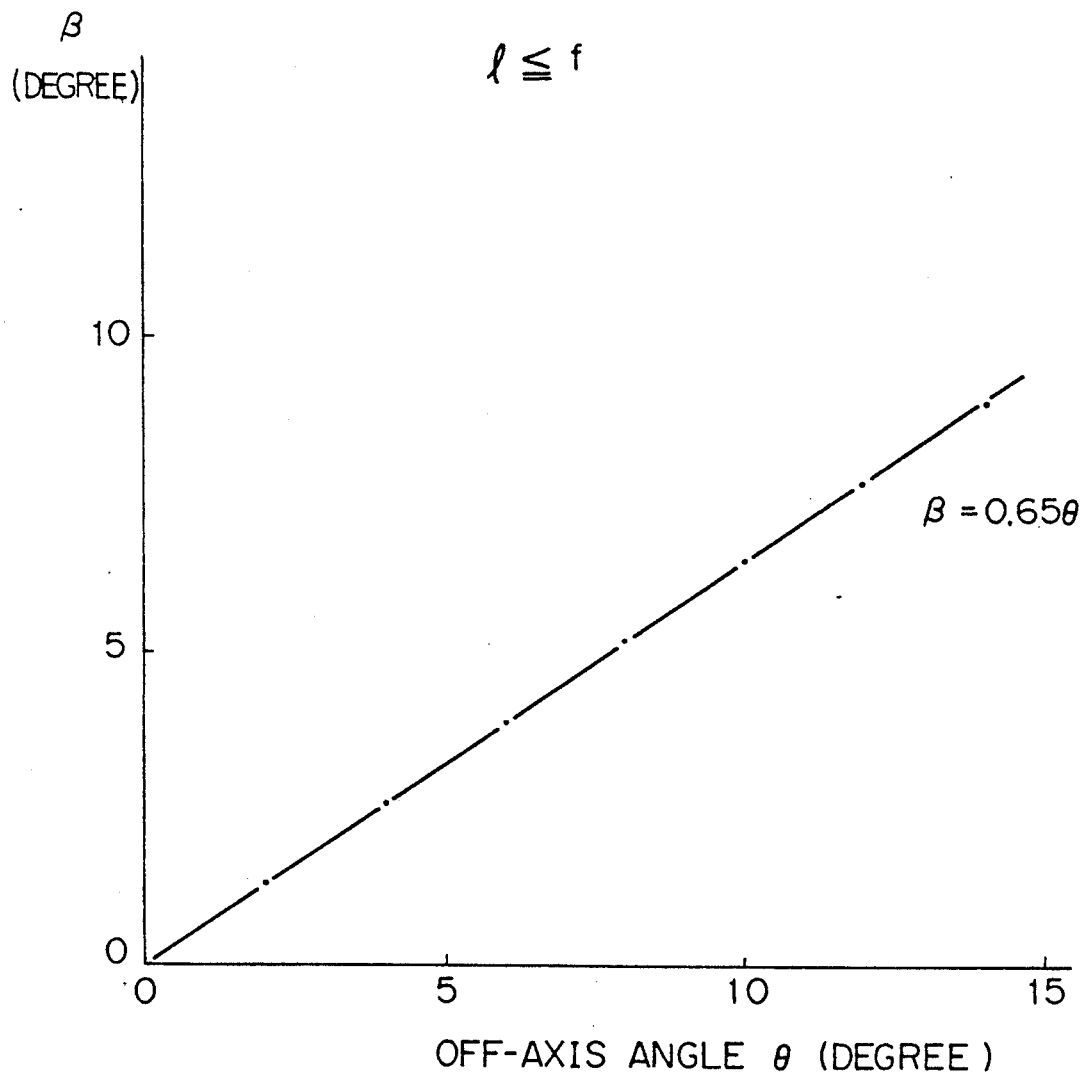
FIG. 22 is a diagram showing experimental results of characteristics of curvature correcting angles and off-axis angles, according to the present invention.

FIGS. 20 to 22 show experimental results of the present invention, which have been obtained to confirm the technical effects of the present invention.

In the experiments, f and $\theta$ were set to be the proper values usually used, and $\beta$ was varied to calculate the tracks of the scanning beams.

Note that only the right halves of the tracks are illustrated.

In FIG. 20, f=300 mm, $\theta$=5, and $\beta$ was varied every 0.1°, i.e., was 3.2°, 3.3°, and 3.4°. As can be seen from FIG. 20, when $\beta$=3.3°, the best result in which the track of the scanning beam most closely approximates a straight line was obtained. Note that FIG. 20 merely shows that the best result was obtained at $\beta$=3.3°. In practice, no problem arises when the curvature is within ±50 μm, and accordingly, when the scanning length is about 130 mm (on one side), values of $\beta$=3.2° or $\beta$=3.4° can be practically used without any problems.

In FIG. 21, f=300 mm, $\theta$=10°, and $\beta$ was varied every 0.1°, i.e., was 6.4°, 6.5°, and 6.6°. As can be seen from FIG. 21, when $\beta$=6.5°, the best result was obtained. Also in this case, similar to FIG. 20, $\beta$=6.4° or $\beta$=6.6° can be practically used without problems, depending on the scanning length.

In both cases, the inventors have experimentally confirmed that the scanning beam described a substantially straight line when $\beta$=0.65$\theta$.

FIG. 22 shows experimental results ($\beta-\theta$ diagram) in which the f and $\theta$ were varied to find an optimum $\beta$ which gives a substantially linear track or path of the scanning beam. This confirms that $\beta$=0.65$\theta$ can exist.

Note that, in most cases, the off-axis angle $\theta$ is usually set to be about 10° ($\theta$=10°).

Also note that deflection mirror is usually located at a distance of ⅔ of the focal length f of the parabolic mirror, i.e., at 2f/3.

FIGS. 23 to 31 show still another embodiment of the present invention, in which additional information, such as a scanned object inclination angle (which can be used to detect the state of mounting of an object, i.e., whether or not an electronical component is mounted in an inclined state on a printed circuit board), or an extent of scattering of light (which can be used to identify the mounted object, i.e., whether or not the mounted object is an intended one) also can be detected. Such additional information is important, particularly in an optical image reading system such as an optical recognizing system for detecting the state of electronical components on a printed circuit board.

Figure 23:
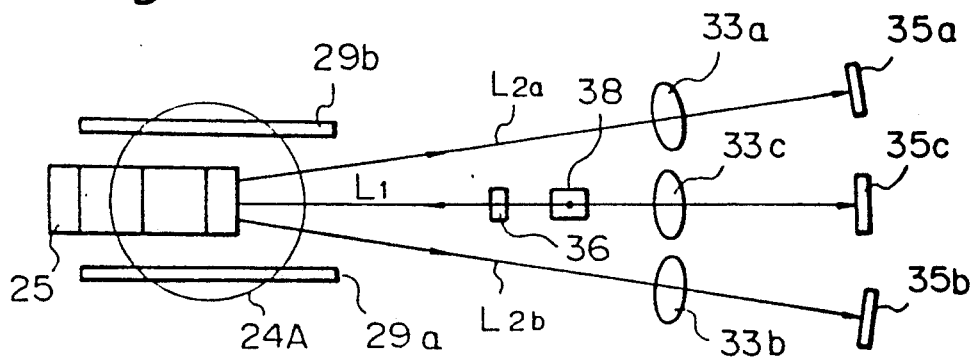
FIG. 23 is an explanatory plan view of an optical system according to an aspect of the present invention.
Figure 24:
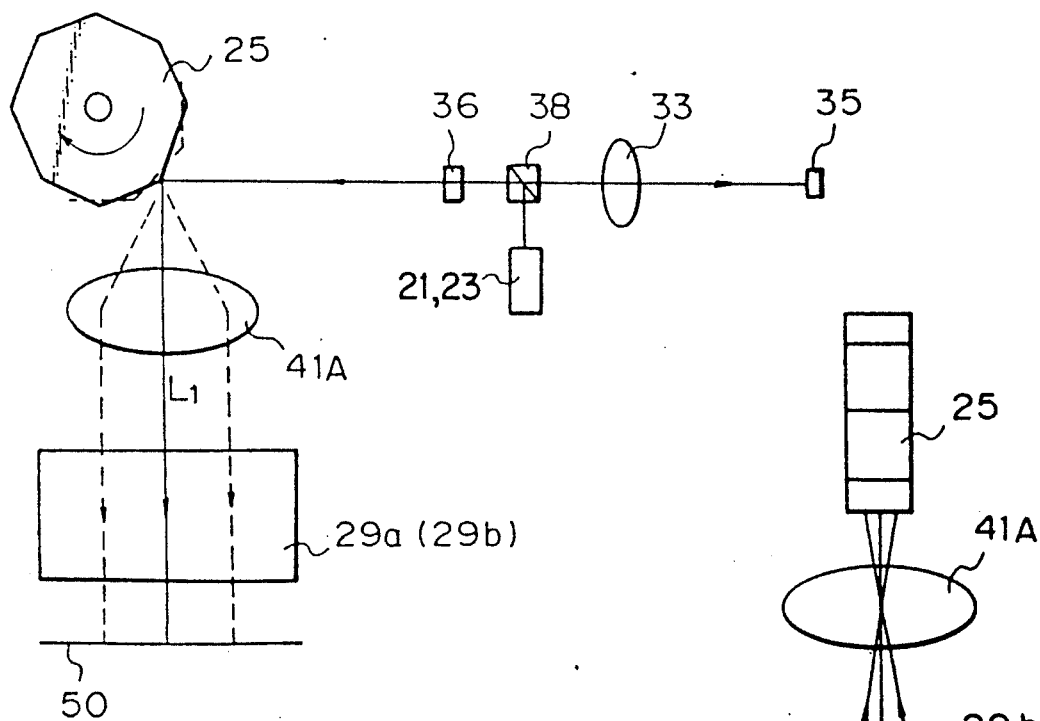
FIG. 24 is a front elevational view of FIG. 23.
Figure 25:
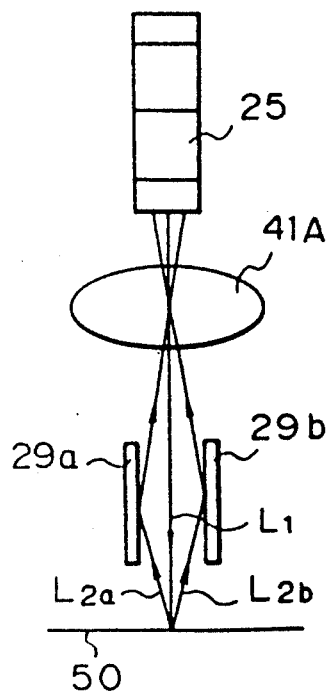
FIG. 25 is a side view of FIG. 23.

In FIGS. 23, 24 and 25, which are a plan view, front elevational view, and side view of an optical system for detecting various information as mentioned above, the polarization beam splitter 38 splits the beam emitted from the laser diode and collimating line 21, 23, for transmission to the rotatable polygonal mirror 25. The polarization beam splitter 38 transmits, for example, P-polarized light therethrough and reflects S-polarized light, or vice versa, similar to the polarization beam splitter 38 shown in FIG. 7. The beam reflected by the polygonal mirror 25 is incident perpendicularly on the object 50 to be detected through the f.$\theta$ lens 41A, which has a function similar to the parabolic mirror 27 shown in FIG. 3 as mentioned before, so that a spot beam can be formed by the f.$\theta$ lens 41A. A pair of mirrors 29a and 29b are provided on opposite sides of and parallel to the beam $L_1$ incident on the object 50 and the beams $L_{2a}$ and $L_{2b}$, which are reflected by the object 50, are reflected by the respective mirrors 29a and 29b, so that the beams $L_{2a}$ and $L_{2b}$ are returned to the polygonal mirror 25 through the f.$\theta$ lens 41A. The beams $L_{2a}$ and $L_{2b}$, which are reflected by the polygonal mirror 25, are incident on respective optical detectors 35a and 35b located on opposite sides of the optical detector 35c, which corresponds to the optical detector 35 shown in FIG. 3, through respective condenser lenses 33a and 33b located on opposite sides of the condenser lens 33c corresponding to the condenser lens 33 shown in FIG. 3. The light reflected by the object 50 and returned along the same path as the going path of the light $L_1$ is transmitted through the polarization beam splitter 38 and is focused onto the optical detector 35c by the condenser lens 33c, since the polarization of the light $L_1$ is converted from P to S (or vice versa).

The laser beam incident on the polygonal mirror 25 is moved within the range designated by imaginary lines shown in FIG. 24 to scan the object 50. The reflected beams of light $L_{2a}$ and $L_{2b}$ are symmetrical with respect to the incident beam $L_1$, so that the beams $L_{2a}$ and $L_{2b}$ can detect the shape of object 50 viewed from the left and right directions.

As mentioned before, although the f.$\theta$ lens 41A has the same function as the parabolic mirror (formation of parallel beam and conversion thereof), the f.$\theta$ lens can be advantageously used to handle symmetrical beams like the beams $L_{2a}$ and $L_{2b}$.

The tracks of the reflected beams $L_{2a}$ and $L_{2b}$ depend on the height of the light points of the beam incident on the object 50, resulting in a change of the position of the points of the light incident on the optical detectors 35a and 35b. Note that the reflected beam, which is returned along the same path of the going beam $L_1$, is perpendicularly incident on the optical detector 35c, and accordingly, there is no change in the incident point on the optical detector even if the height of the object at the point incident thereon changes.

The optical detectors 35a, 35b and 35c are all, for example, PSD's.

As is well known, the PSD is basically made of three layers consisting of a resistor formed by a p-type diffusion layer 2, n+diffusion layer 3, and intrinsic silicon layer (i-$S_i$ layer) 4 therebetween, and has output terminals 5 and 6 located on opposite ends of the p-type diffusion layer 2, and a common terminal 7 on the n+diffusion layer 3. A predetermined bias voltage is applied to and between the output terminals 5, 6 and the common terminal 7. Assuming that the beam spot is incident upon the point x which is spaced at the distance X from the common terminal 7, which is a median point of the PSD, i.e., the origin of a coordinate, when a beam spot is incident on the PSD, a charge which is proportional to the optical energy is produced at the incident point. The produced charge passes through the resistor layer (in this case, P layer) as a photo-induced current and is output from the electrodes. The resistor layer is formed to have a uniform resistor value, so that the current is divided in proportion to the distance (resistor value) to the electrodes. Assuming that the length of the PSD, i.e., the distance between the electrodes (output terminals) is 2L, and the photo-induced current is $I_0$, the currents $I_1$ and $I_2$ output from the electrodes 5 and 6 are given by the following equation, as mentioned before.

$$I_0 = I_1 + I_2$$
$$I_1 = I_0 \cdot (L - x)/2L$$
$$I_2 = I_0 \cdot (L + x)/2L$$

The position of the incident point and the light intensity at the incident point can be obtained by the equations (4) and (5) mentioned before, respectively.

Namely,
the position is given by $(I_2-I_1)/(I_1+I_2)$, and the intensity is given by $I_1+I_2$.

Referring again to FIGS. 23 to 25, the brightness signal and the height signal can be detected by the optical detectors 35a and 35b as $(I_1+I_2)$ and $(I_2-I_1)/(I_1+I_2)$, respectively. Further, the brightness signal also can be detected by the central optical detector 35c as $(I_1+I_2)$.

Figure 26:
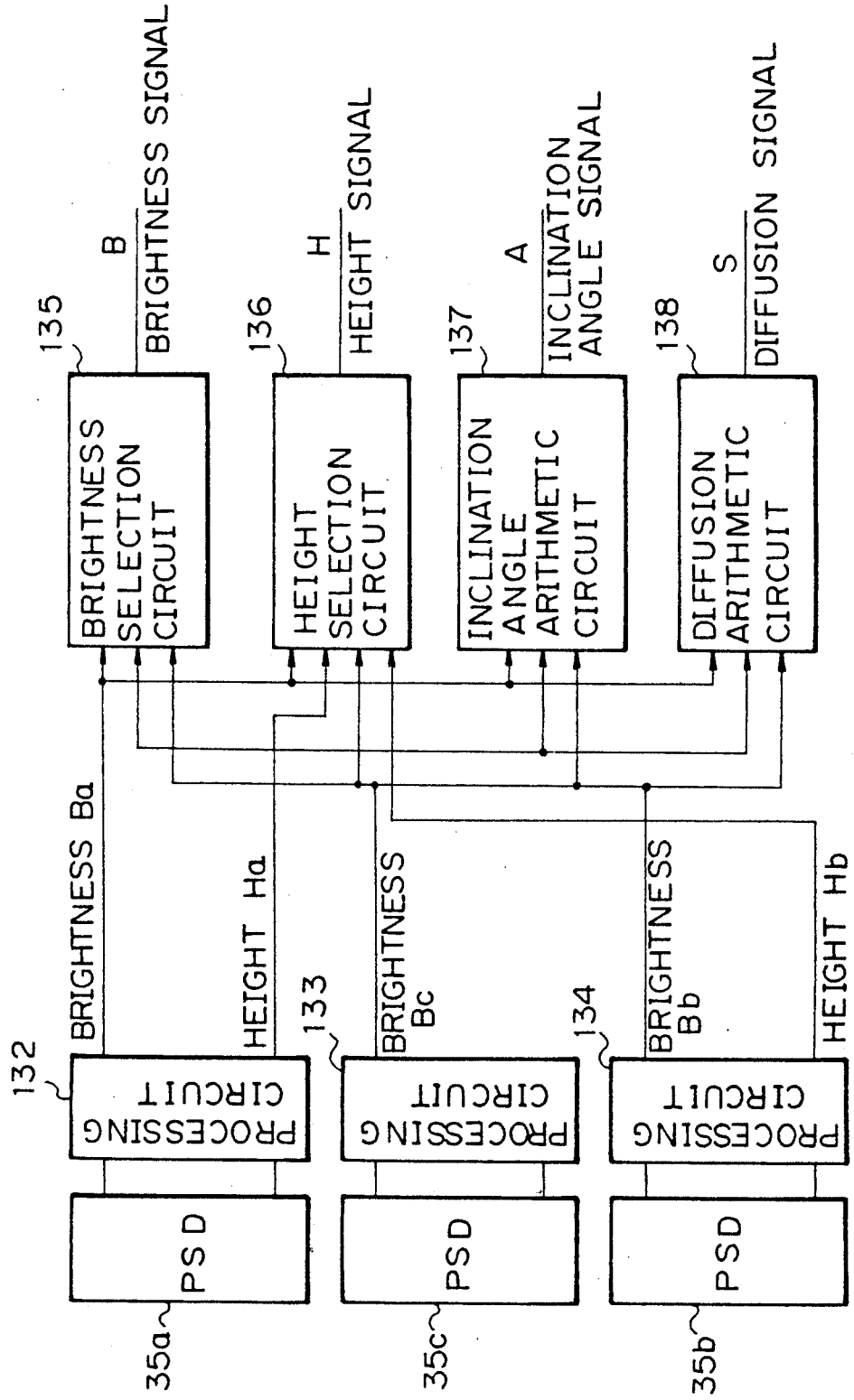
FIG. 26 is a block diagram of a signal processing unit according to the present invention.

FIG. 26 shows a signal processing circuit in which processing circuit units 132, 133 and 134 corresponding to the optical detectors 35a, 35b and 35c are provided, and the brightness signal and the height signal outputs thereof are processed by each of the respective processing circuit units 132, 133 and 134.

The brightness signals $B_a$, $B_b$ and $B_c$ from the processing circuit units 132, 133 and 134 are fetched into a brightness selection circuit 135 in which the brightest signal (maximum value) is selected and is issued as a final signal B. Alternatively, it is possible to use a mean value of the three brightness signals $B_a$, $B_b$ and $B_c$ as a final brightness signal. The final brightness signal shows how bright the object to be detected can be when illuminated.

A height selection circuit 136 receives the brightness signal $B_a$, $B_b$ and the height signals $H_a$ and $H_b$ as input thereto by the processing circuit units 132 and 134 and functions to select a final height signal H corresponding to the brighter signal $B_a$ or $B_b$. This is because the height signal corresponding to the darker signal may not represent the real height of the object. Namely, the darker signal may be one which comes from a shaded portion of the object.

Figure 27:
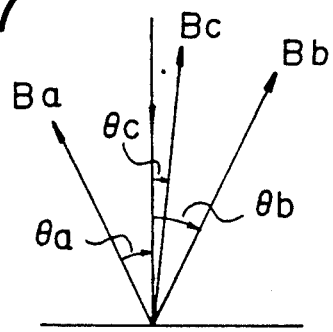
FIG. 27 is an explanatory view of a reflecting light shown in FIGS. 23 to 25.

The inclination angle of the object can be detected by the following method. As can be seen in FIG. 27, a mean reflection angle $\theta_M$ of three reflection angles $\theta_a$, $\theta_b$ and $\theta_c$ of the reflected beams $B_a$, $B_b$ and $B_c$ (which are connoted by the same references as the brightness) is given by the following equation.

$$\theta_M = (B_a\theta_a + B_b\theta_b + B_c\theta_c)/(B_a + B_b + B_c) \quad (40)$$

The second object inclination angle A can be considered to be half the mean reflection angle, i.e., is given by the following equation:

$$A = \theta_M/2 \quad (41)$$

The extent of scattering (diffusion) depends on the material of which the object is made. This is represented by a mean deviation $\sigma$:

$$\sigma = \frac{[|B_a(\theta_a - \theta_M)| + |B_b(\theta_b - \theta_M)| + |B_c(\theta_c - \theta_M)|]}{B_a + B_b + B_c} \quad (42)$$

A standard deviation or a variance can be used instead of the mean deviation.

Figure 28:
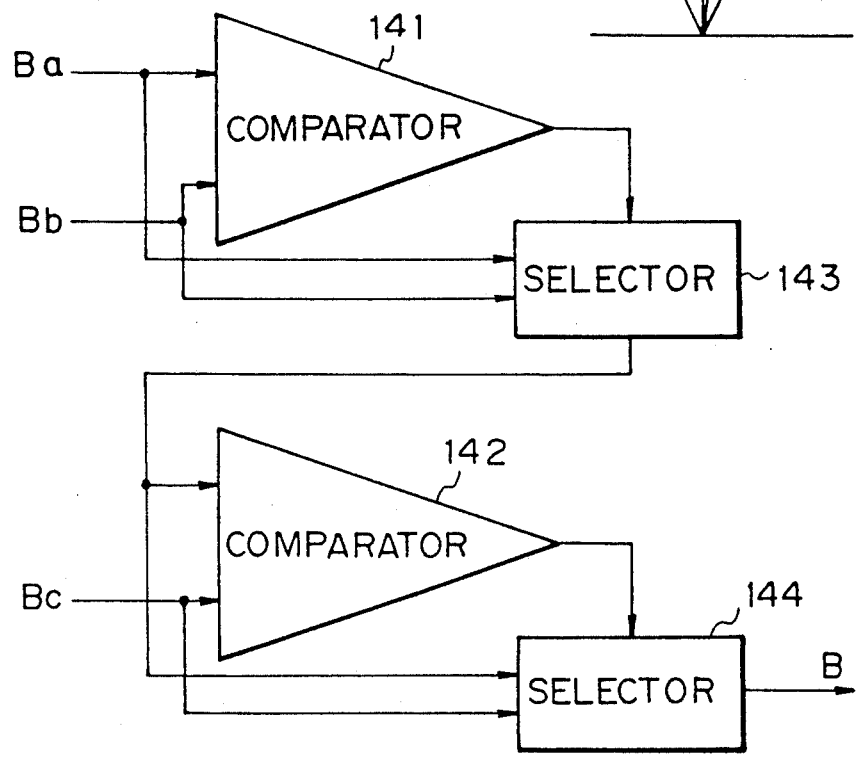
FIG. 28 is a block diagram showing a brightness selection circuit, according to the present invention, by way of an example.

FIG. 28 shows an embodiment of the brightness selection circuit 135, in which numerals 141 and 142 designate comparators, and numerals 143 and 144 designate selectors. The comparator 141 compares the brightness signals $B_a$ and $B_b$ and supplies the larger thereof to the selector 143. For example, if $B_a > B_b$, the comparator 141 generates a positive output, so that the selector 143, which has two analog gates, makes the $B_a$side ON thereby to output $B_a$. The comparator 142 compares the brightness signal $B_c$ with the brightness signal $B_a$ in the illustrated embodiment) generated by the selector 143, to supply the larger thereof to the selector 144, and thus the maximum value can be selected.

Alternatively, the above-mentioned processes can be made in digital fashion. Namely, the processing circuit units 132, 133 and 134 may output digital signals of brightness and height, and comparators 141 and 142 then comprise digital comparators. In this alternative, the selectors may include registers in which the larger value is stored.

The (scanned object) inclination angle arithmetic circuit 137 (FIG. 26) performs the above-mention equations (40) and (41). The scattering extent arithmetic circuit 38 (FIG. 26) performs the above-mentioned equation (42). Note that digital processings using processors are simpler and more precise.

Figure 29:
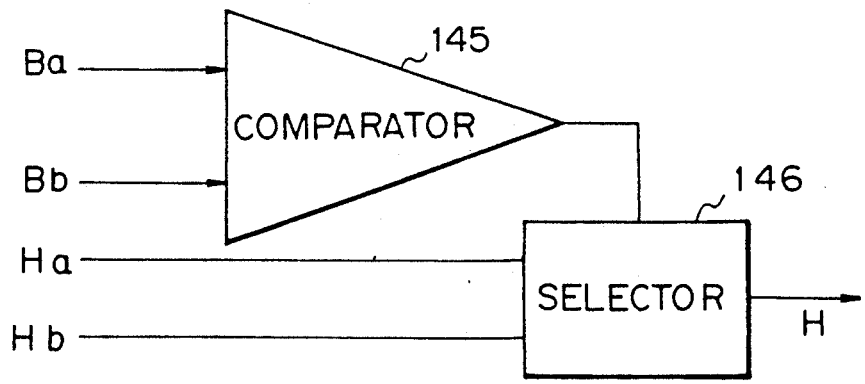
FIG. 29 is a block diagram showing a height selection circuit, according to the present invention, by way of an example.

FIG. 29 shows an embodiment of the height selection circuit 136, in which a comparator 145 compares the brightness signals $B_a$ and $B_b$, and if $B_a > B_b$, produces a positive output so that the signal $H_a$ is selected by the selector 146 as the output H. On the contrary, if $B_a < B_1$, the comparator 145 issues a negative output so that the signal $H_b$ is selected by to the selector 146 as the output H.

Figure 30:
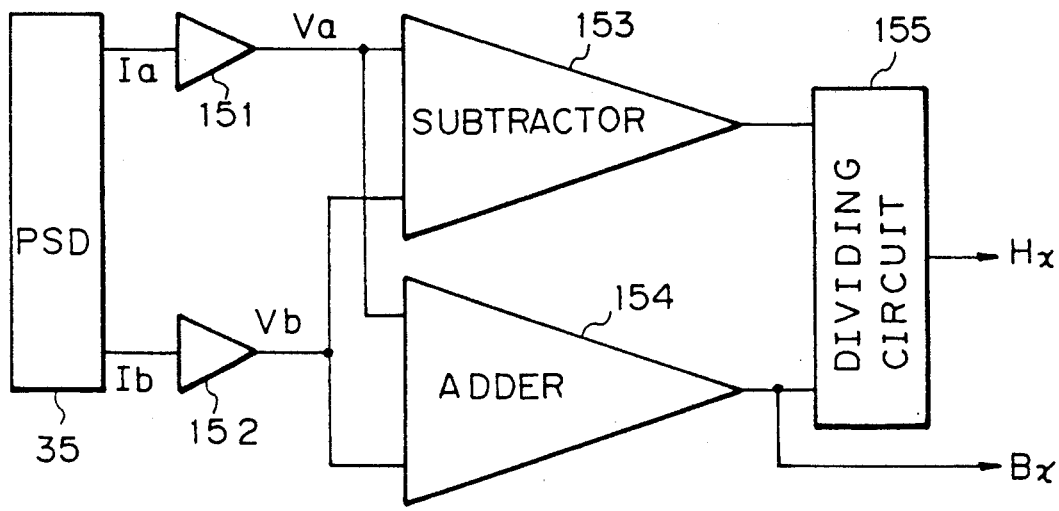
FIG. 30 is a block diagram of a signal processing circuit of an optical position detector, according to the present invention.

FIG. 30 shows an embodiment of the signal processing circuit associated with the PSD.

The PSD 35 generates the photo-induced currents $I_a$ and $I_b$, which are converted to voltages $V_a$ and $V_b$, by current-voltage converters 151 and 152, as mentioned before. The voltage signals $V_a$ and $V_b$ are supplied to the subtracter 153 and the adder 154. The output of the adder 154 represents the brightness signal $B_x$, and the output of the subtracter 153 is divided by the output of the adder 154 in the dividing circuit 155 to obtain the height signal "$H_x$".

Figure 31:
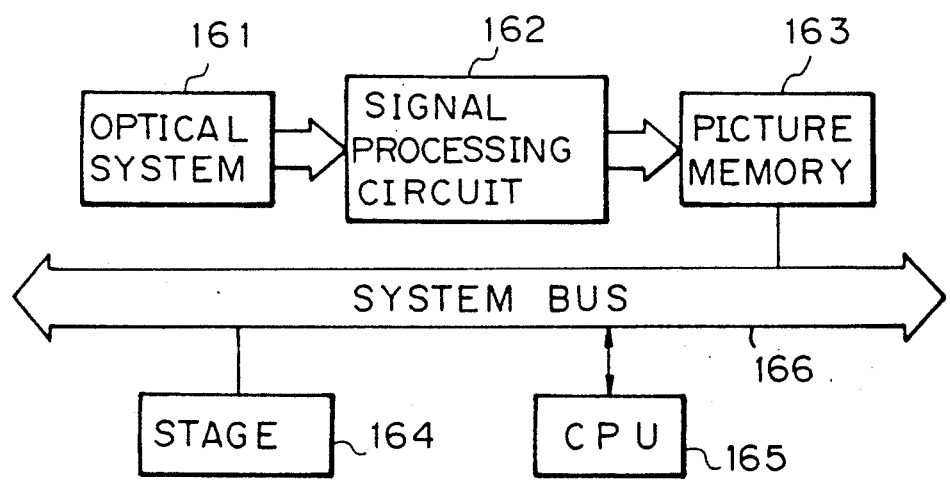
FIG. 31 is a block diagram showing a measuring system, according to the present invention.

FIG. 31 shows an example of the overall construction of the optical measuring system according to an aspect of the present invention. The optical system shown in FIGS. 23 to 25 is generally designated at 161 and the signal processing circuit shown in FIG. 26 is generally designated at 162. Numerals 163, 164 and 165 denote the picture memory, the stage for moving the object 50, carried thereon, in the orthogonal x-y coordinate, and the CPU (processor), respectively. The picture memory 163, the stage 164, and the CPU are interconnected by a system bus 166.

As an example, for checking the state of electronic components mounted on a printed circuit board, the printed circuit board is carried on the stage 164 and scanned with the scanning beam, using the optical system 161 to obtain the above-mentioned signal $B_a$, $B_b$, and $B_c$, and $H_a$ and $H_b$. From these signals, the above-mentioned signals B, H, A and S are obtained by the signal processing circuit 162 and are successively stored in the picture memory 163. The signals are obtained for the whole surface of the printed circuit board, by moving the latter by the stage 164, and are stored in the memory 163.

Upon checking, the above-mentioned signals thus obtained are compared with correct signals stored in advance in the picture memory 163 and representing the signals when the electronical elements are correctly mounted to the printed circuit board, to check "agreement" or "disagreement". If all the data agree, the state of the mounting is judged to be "good". The CPU 165 performs the above-mentioned digital signal processes, the storage of the signals obtained, and the control of the movement of the stage, etc.

As can be understood from the foregoing, according to the embodiment shown in FIGS. 23 to 31, the height, the brightness and the scanned object inclination angle of an object to be checked, and the extent of scattering of light can be detected at the same time. Furthermore, since two mirrors 29a and 29b are provided on the opposite sides of the incident beam upon the object, the shape of the back (shade portion) of the object, which would otherwise not be detected, can be detected.

The improvement of the present invention is also directed to the signal processing circuit.

Figure 48:
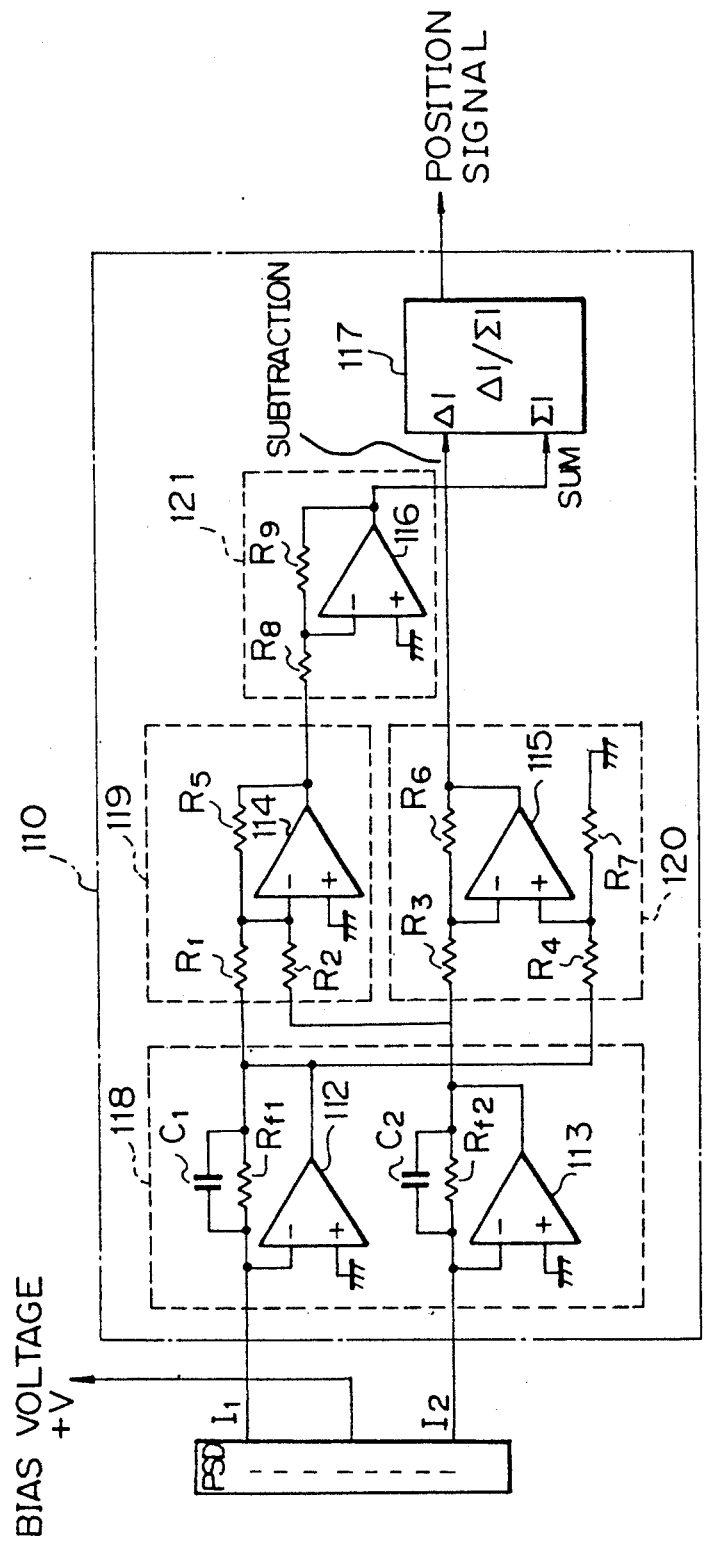
FIG. 48 is a block diagram of a known signal processing circuit.

FIG. 48 shows a known signal processing circuit 110 for processing the signals $I_1$ and $I_2$.

The signal processing circuit 110 includes operational amplifiers (OP AMP) 112–116, capacitors $C_1$, $C_2$, resistors $R_{f1}$, $R_{f2}$, $R_1$–$R_9$, and an analog divider 117. The OP amplifiers 112, 113, the capacitors $C_1$, $C_2$, and the resistors $R_{f1}$, $R_{f2}$ form a current-voltage converting circuit 118; the OP amplifier 114 and the resistor $R_1$, $R_2$, $R_5$ form an adding circuit 119; the OP amplifier 115 and the resistor $R_3$, $R_4$, $R_6$, $R_7$ form a differential circuit 120; and the OP amplifier 116 and the resistors $R_8$, $R_9$ form an inverting circuit 121. Accordingly, in the conventional processing circuit 111, two current outputs $I_1$ and $I_2$ are converted to voltage signals by the current-voltage converting circuit 118, so that the sum and subtraction of the voltage signals are obtained by the adding circuit 119 and the differential circuit 120 to obtain the position signal from the analog divider 117.

In the known optical position detecting apparatus as shown in FIG. 48, however, the following problems have been raised.

① The dynamic range of the light intensity is small. The dynamic range, which is a ratio between corresponding maximum and minimum values (voltages) when the brightness of light itself changes, is about 10 times. This problem is caused by the signal processing circuit rather than the PSD itself.

② The operational speed is about 1 MHz, which is very small.

③ A high precision can not be expected. In the worst case, the error is more than 10%.

The cause of these drawbacks is not the PSD itself, but resides in the use of the analog dividing circuit (corresponding to the analog circuit 17 in FIG. 48), when dividing the outputs to obtain the optical position signals. Generally speaking, the analog dividing circuit has a low operational speed, a small dynamic range, and a low precision. Nevertheless, the analog dividing circuit can be widely used, since the division can be performed by a single IC (there is no divider in which the division can be effected by only one IC).

To solve the problem mentioned above, there is also known a digital dividing circuit in which the sum and subtraction (i.e., difference) of the analog signals are converted to digital signals by an A/D converter (e.g. Japanese Patent Application No. 61-301718). In this known apparatus, however, the A/D converter can be a bar to achieving precise and high speed operation. If an A/D converter having a high resolving power and a high speed is used, the precision can be increased, but as is well known, the speed and the resolving power of an A/D converter are in inverse proportion to each other. Accordingly, in practical use, an A/D converter having 1 MHz and a 12 bit resolving power or having 20 MHz and a 10 bit resolving power is limit. In this case, the problem is that a large dynamic range cannot be obtained. Namely, it is impossible to provide a large dynamic range even if digital division is effected. That is, when the voltage corresponding to $(I_1+I_2)$ mentioned above, indicated in the denominator of the equation is small, the effective bit number of the data after A/D conversion is lowered, resulting in a lower precision of the arithmetic operation. For example, assuming that the denominator is 12 bits and 1 MHz speed is necessary, an approximate 12 bit resolving power is the limit. In the case of a 12 bit resolving power (the numerator of the equation can be a 12 bit resolving power), if the change of the brightness is 10 times, the resolving power is lowered from 12 bits to about 8 bits. Furthermore, if the change of the brightness is 16 times, the actual maximum resolving power is 8 bits in the worst case. Namely, even if an A/D converter of 12 bits is used, a precision of 8 bits at most can be realized (8 bit/8 bit).

For the light position represented by numerator (difference)/denominator (sum), when the value of the denominator itself is changed by a large amount, it is impossible to increase the precision. As mentioned before, the denominator is in proportion to the brightness, and accordingly, it is desirable to provide an optical detector which can detect the light position of an object in which the quantity of light changes depending on the light incident position, independently of the quantity of light.

According to the present invention, an optical position detecting system can detect the light position at a very high speed and over a large dynamic range, with a high precision.

FIGS. 32 to 35 show an embodiment of the present invention, in which FIG. 1 shows an arithmetic circuit for obtaining the sum and difference (i.e., subtraction) of the two output signals of the PSD, similar to FIG. 48.

Figure 32:
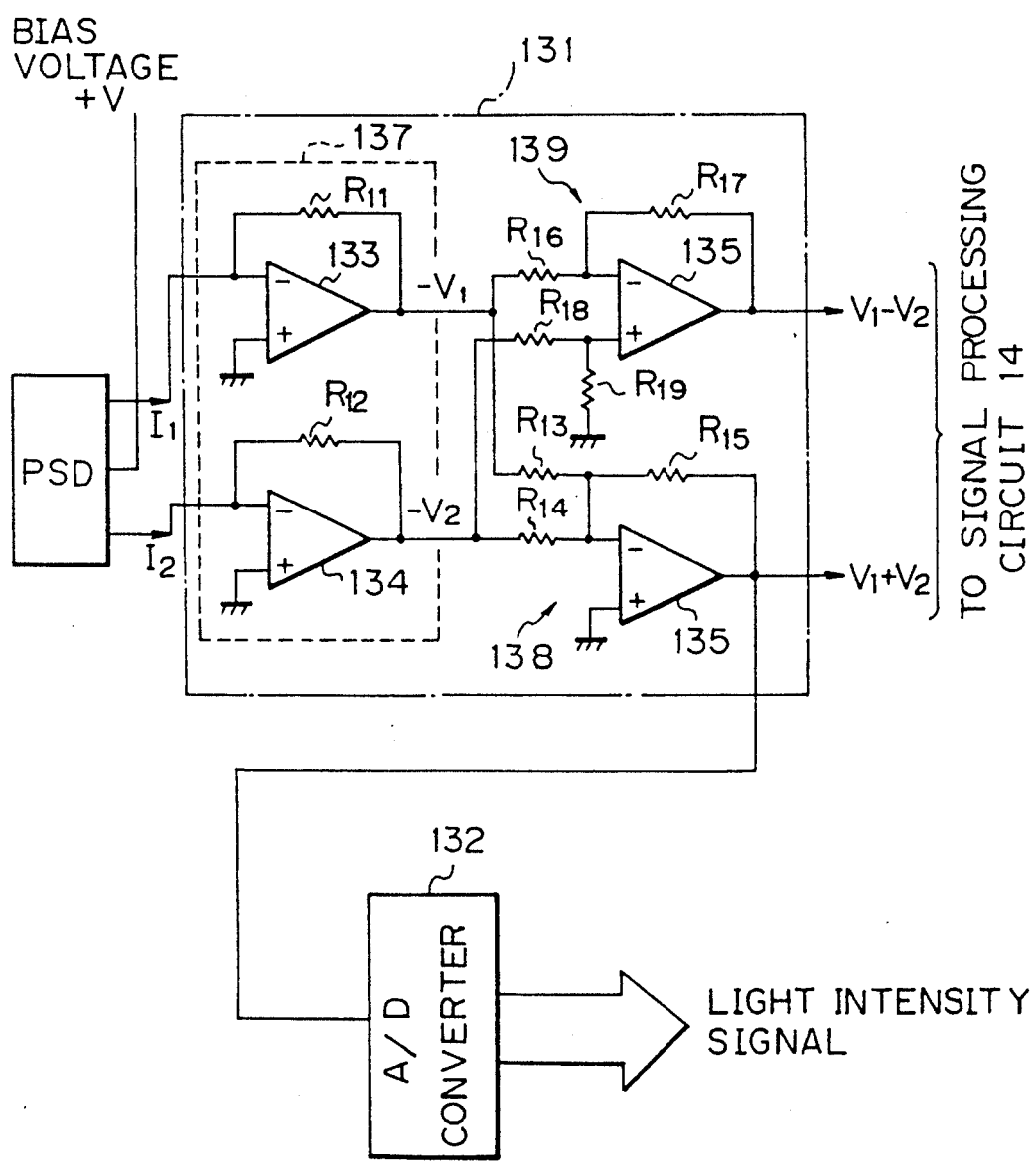
FIG. 32 is a circuit block diagram of an optical position detector according to the present invention.

In FIG. 32, the arithmetic circuit 131 is connected to an A/D converter 132. The arithmetic circuit 131 includes operational amplifiers (OP AMP) 133–136 and resistors $R_{11}$–$R_{19}$. The OP amplifiers 133 and 134 and the registers $R_{11}$ and $R_{12}$ form a current-voltage converting circuit 137 which converts the output currents $I_1$ and $I_2$ of the PSD; the operational amplifier 135 and the resistors $R_{13}$–$R_{15}$ form an adding circuit 138; the OP amplifier 136 and the resistors $R_{16}$–$R_{19}$ form a differential circuit 139; and the respective outputs ($V_1+V_2$) and ($V_1-V_2$) of the adding circuit 138 and the differential circuit 139 are input to the signal processing circuit 141 shown in FIG. 33. In the illustrated embodiment, the sum signal is converted to the digital signal by the A/D converter 132 to obtain a digital light intensity signal.

Figure 33A:
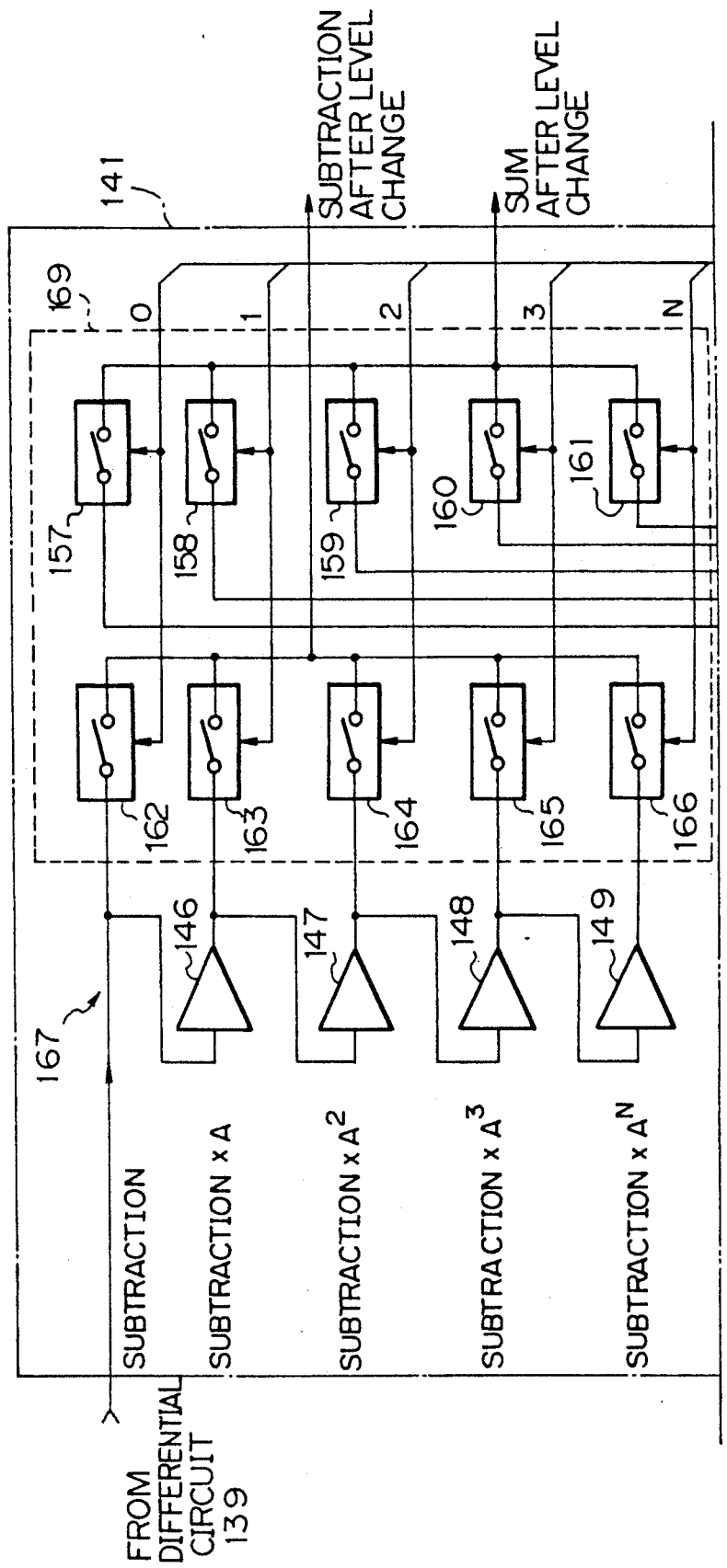
FIG. 33 is a circuit block diagram of a signal processing circuit shown in FIG. 32.
Figure 33B:
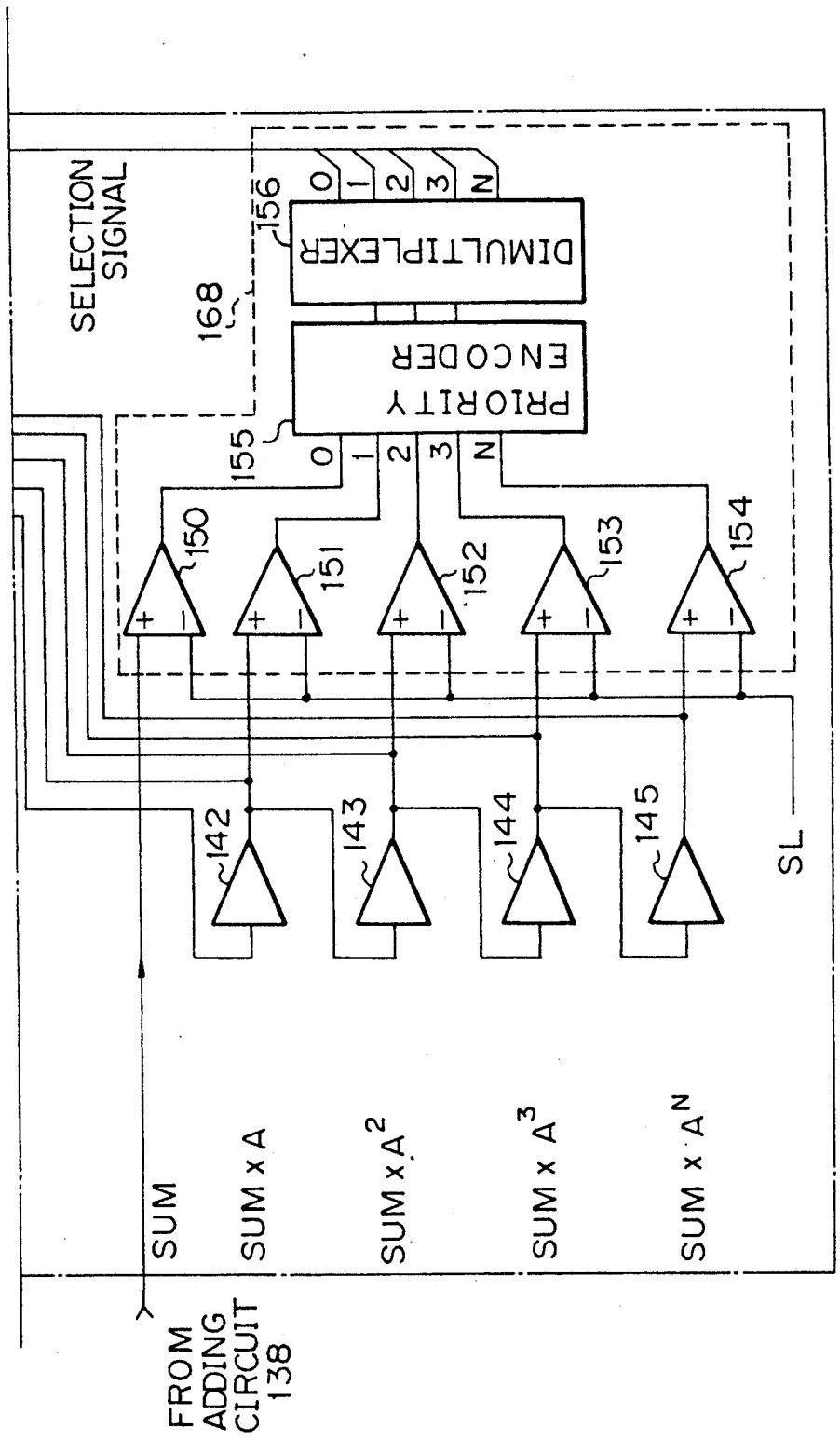

In the system shown in the combination of FIGS. 33A and 33B, the signal processing circuit 141 includes N-stage (four-stage in the illustrated embodiment) amplifiers 142–145 each having an amplification of gain A, and each of which amplifies the respective sum signal input thereto. Namely, the first stage amplifier 142 amplifies the sum signal) (original signal from the adding circuit 138, and the second stage amplifier 143 amplifies the signal input thereto, i.e., the amplified signal output of the first stage amplifier 142. The same is true for the subsequent amplifiers 143–145.

The signal processing circuit 141 also includes N-stage amplifiers 146–149, each having an amplification of gain A and each of, which amplifies the respective subtraction signal input thereto, similar to the amplifiers 142 –145. The signal processing circuit 141 also includes comparators 150–154 which compare the sum signal from the adding circuit 138 or the amplified signals from the preceding amplifiers with a predetermined slice level SL, a priority encoder 155 which detects the input "L" of the highest level among the output data 0–N of the comparators 150–154 input thereto to encode the data to a 3-bit code, a demultiplexer 156 which converts again the data output of the encoder 155 representing the priority order of the O–N data, analog switches 157–161 which are connected to the output sides of the adding circuit 138 and the amplifiers 142 –145, respectively, and which are selectively made ON in accordance with the selection signals from the demultiplexer 156 to output a sum signal after conversion, and analog switches 162–166 which are connected to the output sides of the differential circuit 139 and the amplifiers 146–149 and which are selectively made ON in accordance with the selection signal output of the demultiplexer 156 to output a subtraction signal after conversion. Accordingly, if the N-stage amplifiers each having a gain A (e.g., 4-stage AMP having a gain of 10) are connected to the sum signal (denominator), the same amplifiers (e.g., 4-stage AMP having a gain of 10) are connected to the subtraction signal (numerator), so that a pair of amplifiers having the same gain the numerator and the denominator relative to the signals correspond are selected at the same time among the amplifiers 142 –149.

The amplifiers 142–149 form an amplifier 167; the comparators 150–154, the priority encoder 155, and the demultiplexer 156 form together a selection circuit 168; and the analog switches 157–166 form a switching means 169.

Figure 34:
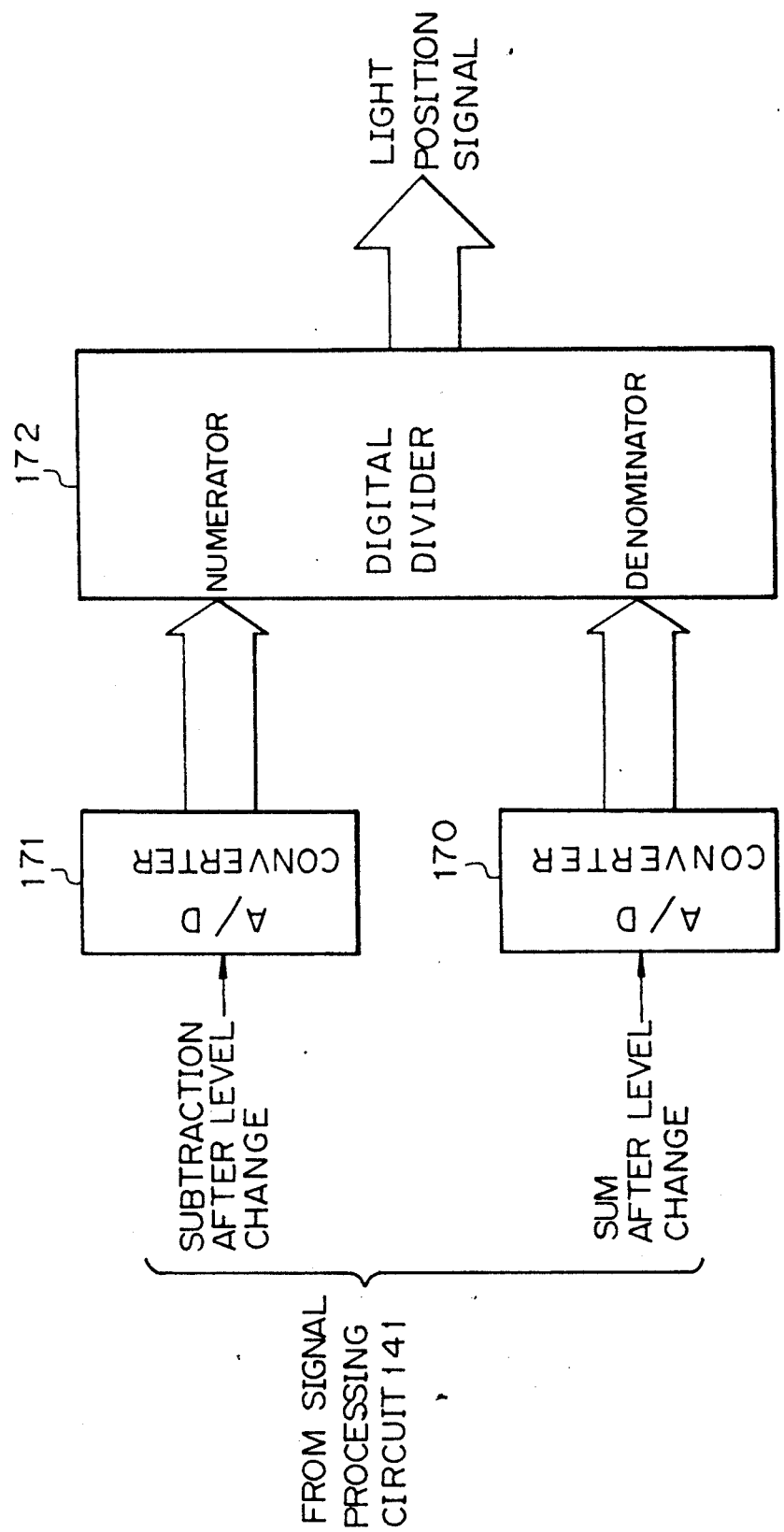
FIG. 34 is a block diagram showing a production of a light position signal, according to the present invention.

The sum and subtraction (difference) signals after conversion are supplied to the A/D converters 170 and 171 shown in FIG. 34, respectively. The A/D converters 170 and 171 convert the analog sum and subtraction (difference) signals to the digital signals and supply the digital signals to the digital divider (light position detecting means) 172. The digital dividing circuit 172 generates the height signal which is represented by the subtraction (i.e., difference) (numerator) divided by the sum value (denominator).

The apparatus shown in FIGS. 32 to 34 operates as follows.

Figure 35:
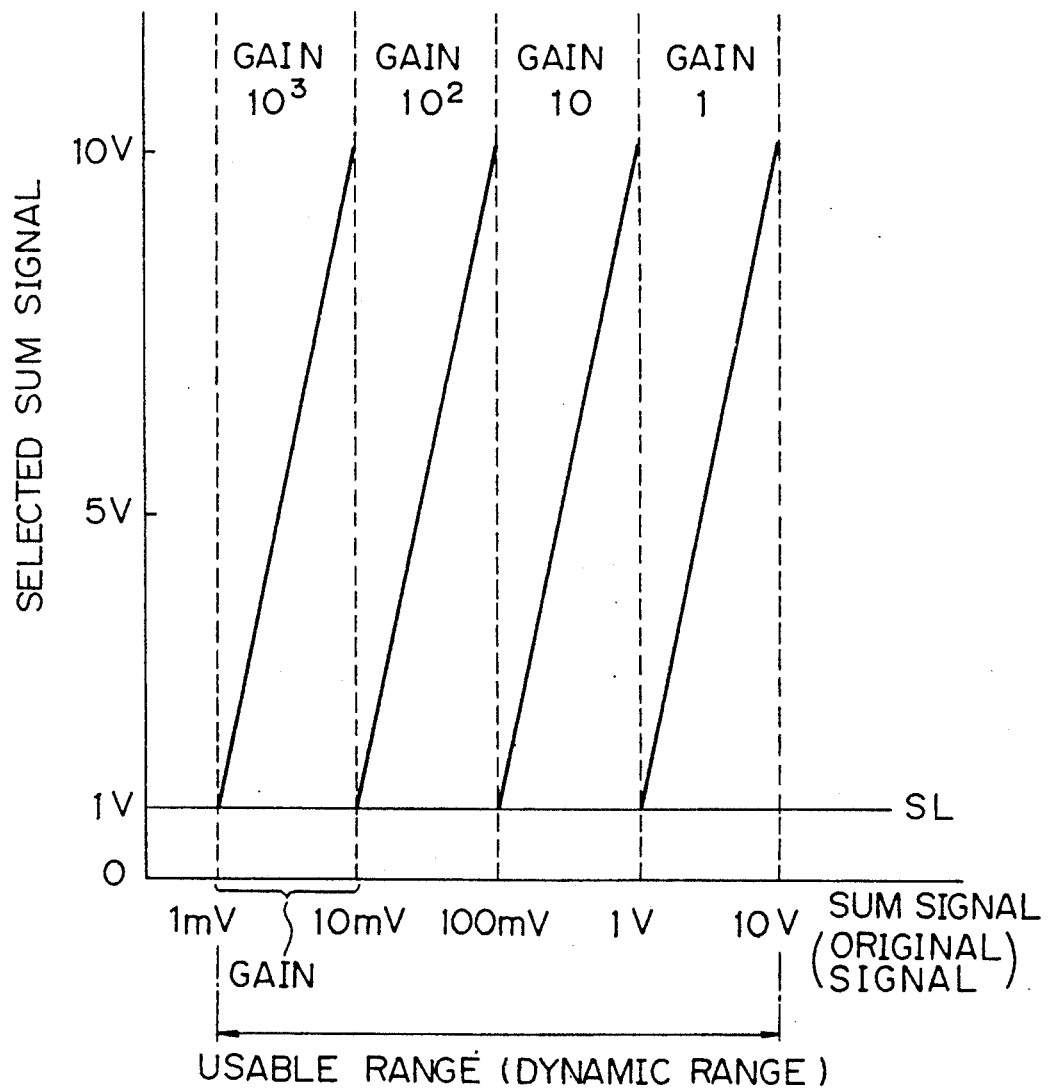
FIG. 35 is a diagram showing a relationship between an original signal of a sum signal and a selection output, according to the present invention.

As shown in FIG. 35, it is assumed that the gain A of the amplifiers is 10, the number of stages of the amplifiers 142–149 is 4, the slice level SL is 1 V, the saturation voltage of the amplifiers is 15 V, and the range of input voltage of the A/D converters 170 and 171 is ±10 V.

Assuming that the sum signal (denominator voltage) is 5 V, the input voltage (5 V) value is larger than the 1 V value of the reference voltage (slice Level SL) in all of the comparators 150–154, and accordingly, the signals to be input to the priority encoder 155 are all "H". Further, if the sum signal is 0.5 V, only the first comparator 150 issues "L" and the remaining comparators 151–154 issue "H". If the sum signal is 0.05 V, the first and second comparators 150 and 151 issue "L" and the remaining comparators 152–154 issue "H", as shown in the following Table 1.

TABLE 1

| | SUM (DENOMINATOR VOLTAGE) | | | | |
|---|---|---|---|---|---|
| | 5 V | 0.5 V | 0.05 V | 0.005 V | 0.0005 V |
| COMPARATOR 50 | H | L | L | L | L |
| COMPARATOR 151 | H | H | L | L | L |
| COMPARATOR 152 | H | H | H | L | L |
| COMPARATOR 153 | H | H | H | H | L |
| COMPARATOR 154 | H | H | H | H | H |
| PRIORITY ORDER | 0 | 1 | 2 | 3 | 4 |

The results of the comparison performed by the comparators 150 –154 are supplied to the priority encoder 155 and represent the priority order, so that the signal is converted to the digital value, 1, or 2 or 3 . . . , in accordance with the predetermined priority order, as shown in Table 1. The demultiplexer 156 makes ON only the signal corresponding to the digital value, so that one optimum pair of the analog switches (numerator and denominator) among 157-161: 162-166 can be made ON. Namely, the selection circuit 168 selects one optimum pair of amplifiers among 142-145: 146-149, to obtain a predetermined range of voltage of the denominator.

Accordingly, the signals corresponding to both the numerator and the denominator are A/D converted and amplified by the gain of $A^{I(1,2,3, or\ 4)}$, and since the gain of the numerator is equal to that of the denominator, the result of the division does not change.

Further, the dynamic range of the denominator (light intensity) is $A_{n+1}(10^4$ in the illustrated embodiment), which is larger than that of the known circuit shown in FIG. 48. As a result, it is possible to obtain from the DSD output high precision light position signals at a higher speed (1 MHz) and with a larger dynamic range ($10^4$).

In the above-mentioned embodiment, although the gain of one stage is 10, this can be varied in accordance with a desired level of precision. For example, if the A/D converters are required to have IM of speed at 12 bits to realize a precision of 8 bits, amplifiers having a 16 gain or so (actually 10 gain, in view of the margin) will be used.

FIGS. 36 to 42 show modified embodiments of FIGS. 31 to 35.

Figure 36:
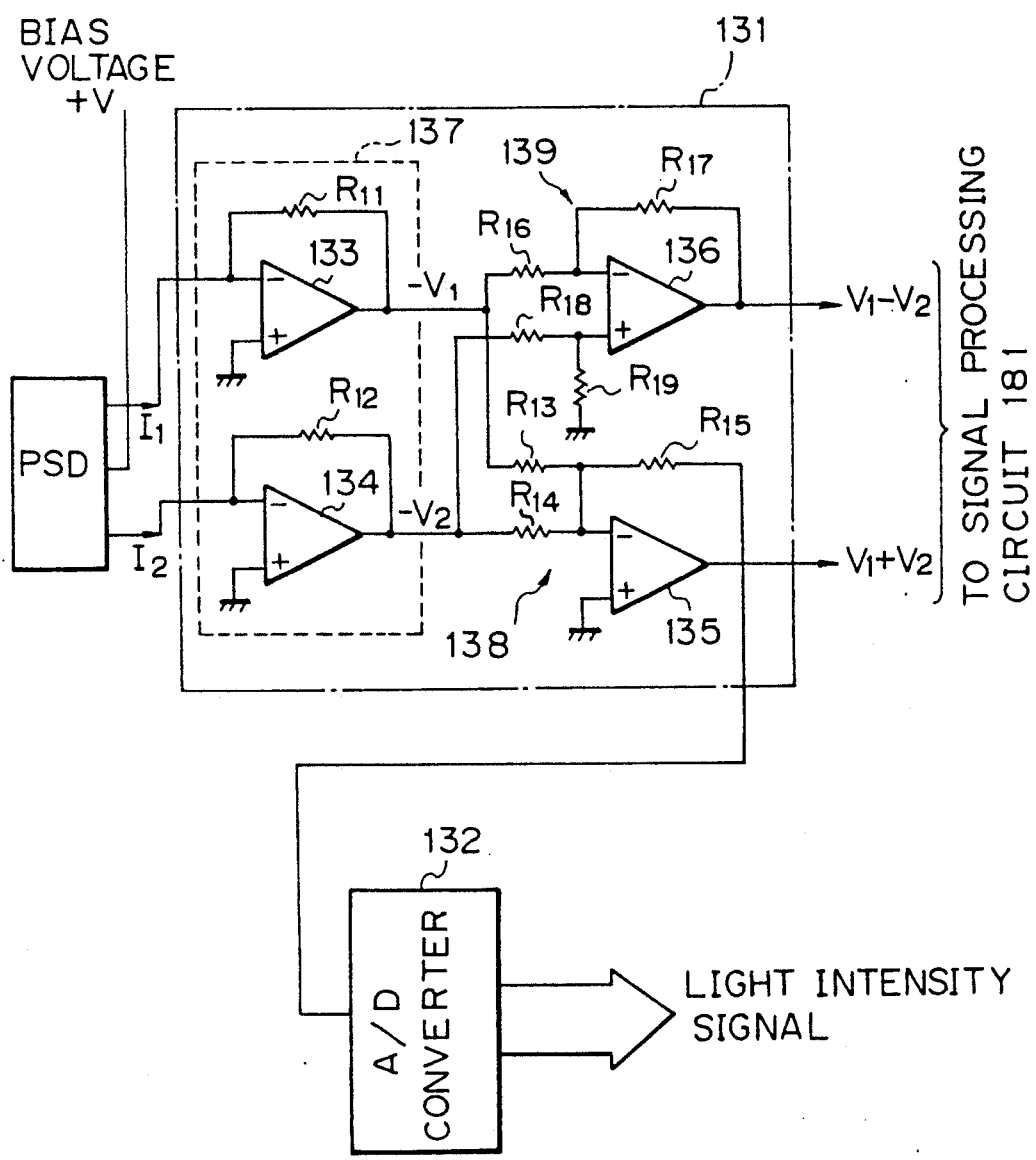
FIG. 36 is a circuit block diagram similar to FIG. 32, but according to another embodiment of the present invention.

FIG. 36 shows an arithmetic circuit similar to FIG. 31. In FIG. 36, the output currents $I_1$ and $I_2$ of the PSD are converted to voltage signals $V_1$ and $V_2$ to obtain the subtraction $(V_1-V_2)$ and the sum $(V_1+V_2)$. The signals are supplied to the signal processing circuit 181. The sum signal is A/D converted to obtain the digital light intensity signal by the A/D converter 132, similar to FIG. 31.

Figure 37:
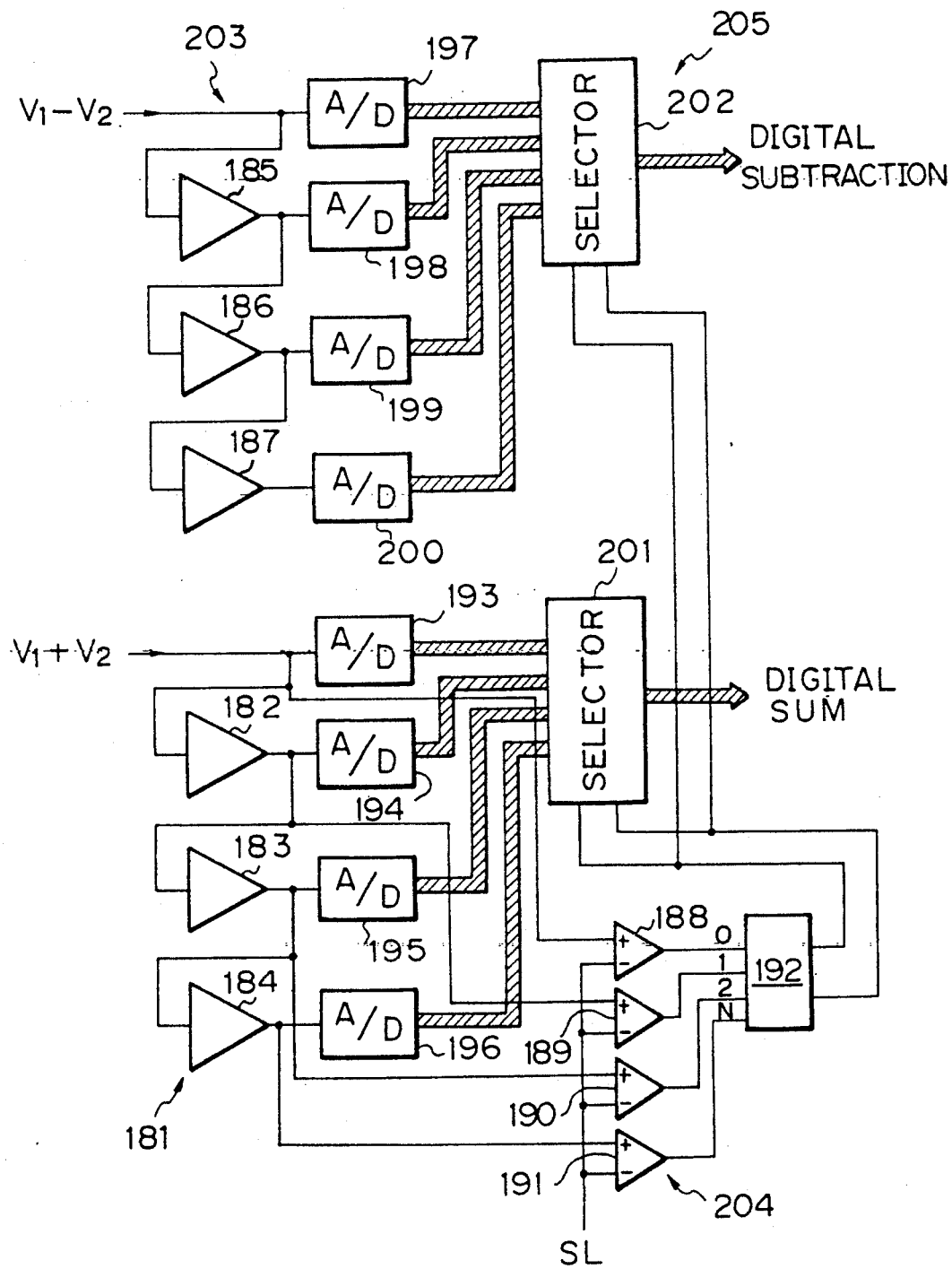
FIG. 37 is a block diagram showing a signal processing circuit shown in FIG. 36.

FIG. 37 shows the signal processing circuit 181, which comprises N-stage amplifiers 182–184, for amplifying the sum $(V_1+V_2)$ supplied from the adding circuit 138 and the signals from the preceding stages of amplifiers, each having the gain A, N-stage amplifiers 185–187 for amplifying the subtraction, or difference $(V_1-V_2)$ supplied from the subtraction circuit and the signals from the preceding stages of amplifiers, each having the gain A, comparators 188–191 to which the sum signal $(V_1+V_2)$ and the outputs of the amplifiers 182–184 are issued to compare the sum $(V_1+V_2)$ and the outputs of the amplifiers 182–184 with a predetermined slice level SL, a priority encoder 192 which detects the input "L" of the highest level among the output data 0—N of the comparators 188–191 input thereto to encode the data to a 2-bit code, A/D converters 193–196 to which the sum signal $(V_1+V_2)$ and the output data of the amplifiers 182–184 are input to convert the analog signals to corresponding digital signals, A/D converters 197–200 to which the subtraction signal $(V_1-V_2)$ and the output data of the amplifiers 185–187 are input to convert the analog signals to corresponding digital signals, a selector 201 which is connected to the output sides of the A/D converters 193–196 to select an optimum output from among the outputs of the A/D converters 193–196 in accordance with the output data of the priority encoder 192 having a predetermined priority order, to issue a digital sum output after level conversion and A/D conversion, and a selector 202 which is connected to the output sides of the A/D converters 197–200 to select an optimum output from among the respective outputs of the A/D converters 197–200 in accordance with the output data of the priority encoder 192 having a predetermined priority order, to issue a digital subtraction output after level conversion and A/D conversion.

As a result, if the N-stage amplifiers having the gain A (e.g., 3-stage amplifiers having a 10 gain) are connected to the sum signal (denominator), similar amplifiers (i.e., 3-stage amplifiers having 10 gain) are connected to the subtraction (i.e. difference) signal (numerator). The converted sum and subtraction (i.e. difference) signals are alternatively switched by the selectors 201 and 202, so that one pair of amplifiers 182–184: 185–187 having the same gain in the denominator and the numerator are simultaneously selected to output the digital values of the sum and subtraction.

The amplifiers 182–187 form an amplifier 203; the comparators 188–191 and the priority encoder 192 form a selecting means 204 as a whole; and the selectors 201 and 202 form a switching means 205.

The digital sum and subtraction signals selected by the selectors 201 and 202 are input to the digital dividing circuit (light position detecting means) 206 which divides the subtract (numerator) by the sum (denominator) to issue the position signal.

In this embodiment, it should be appreciated that although one optimum pair of the numerator and the denominator values are simultaneously selected by the selecting means 204, similar to the embodiment shown in FIGS. 32 to 35, the output signals of the sum and the subtraction (i.e. difference) have already been A/D converted to the digital values at the selection stage. Therefore, it is not necessary to switch the signals having different gains, by using analog switches, and accordingly, even if a sudden change of the analog signals takes place, the signals after conversion to digital signals do not change. As a result, there is no error of measurement due to the response characteristics of the amplifiers 182–187 and the A/D converters 193–200, and a high precision detection is obtained.

Figure 38:
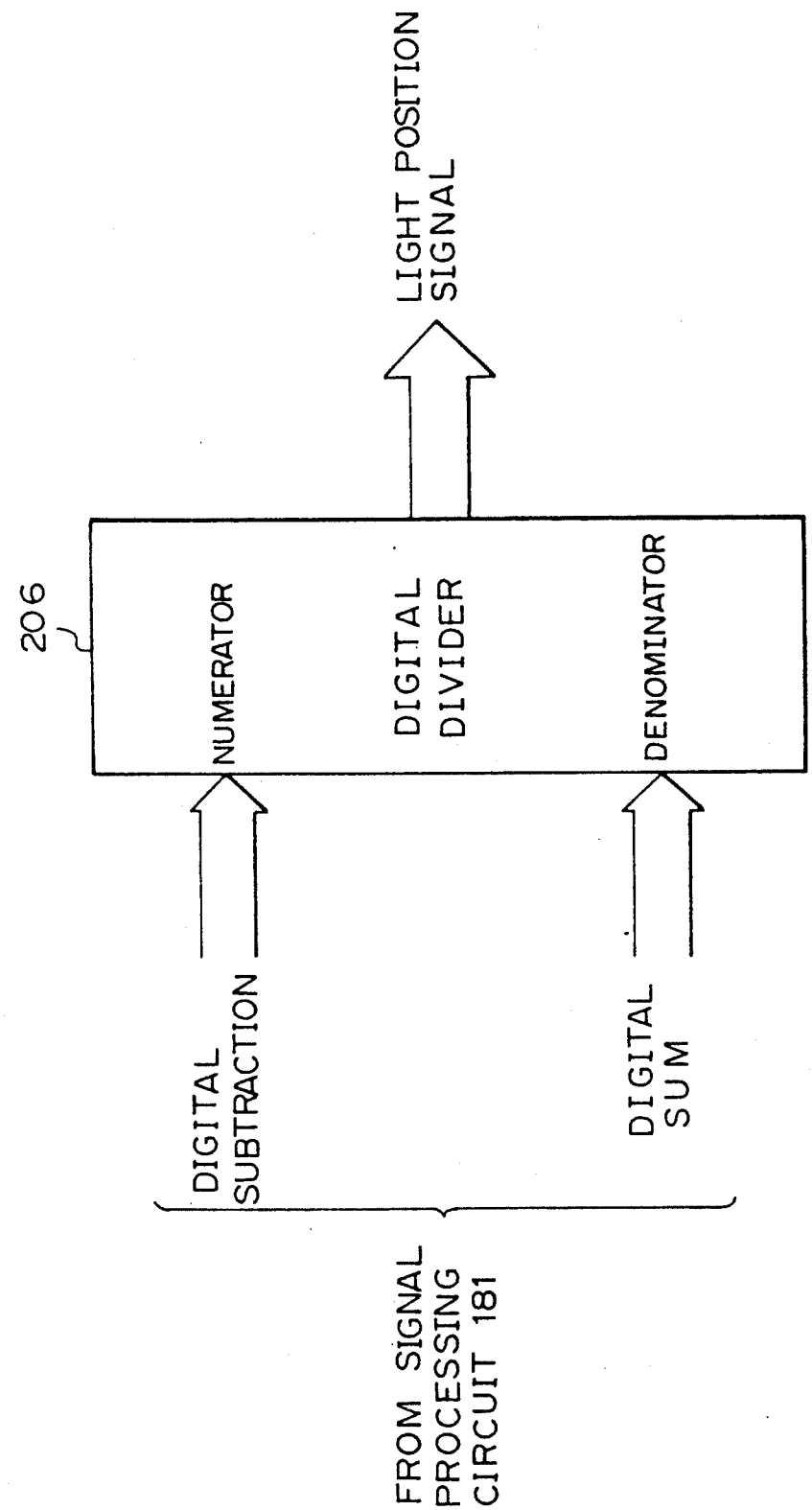
FIG. 38 is a view similar to FIG. 34, corresponding to FIG. 36.
Figure 39:
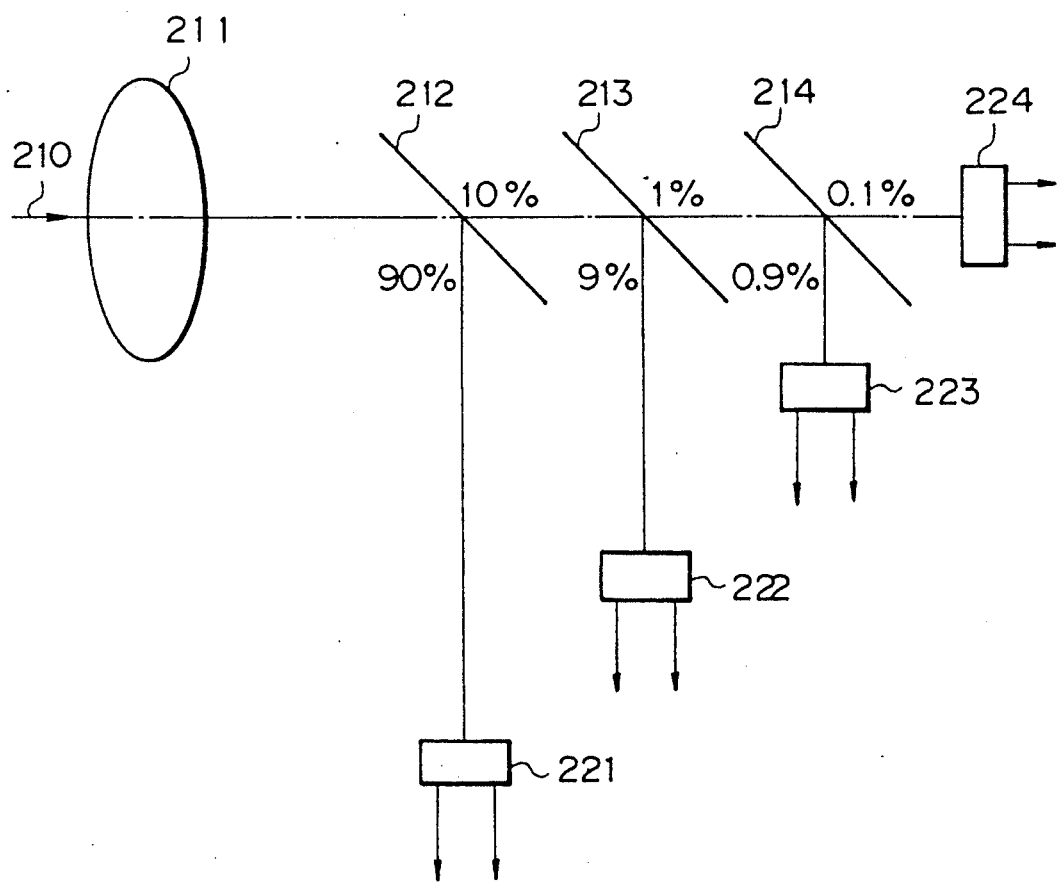
FIG. 39 is a schematic view of an optical system according to another aspect of the present invention.
Figure 40:
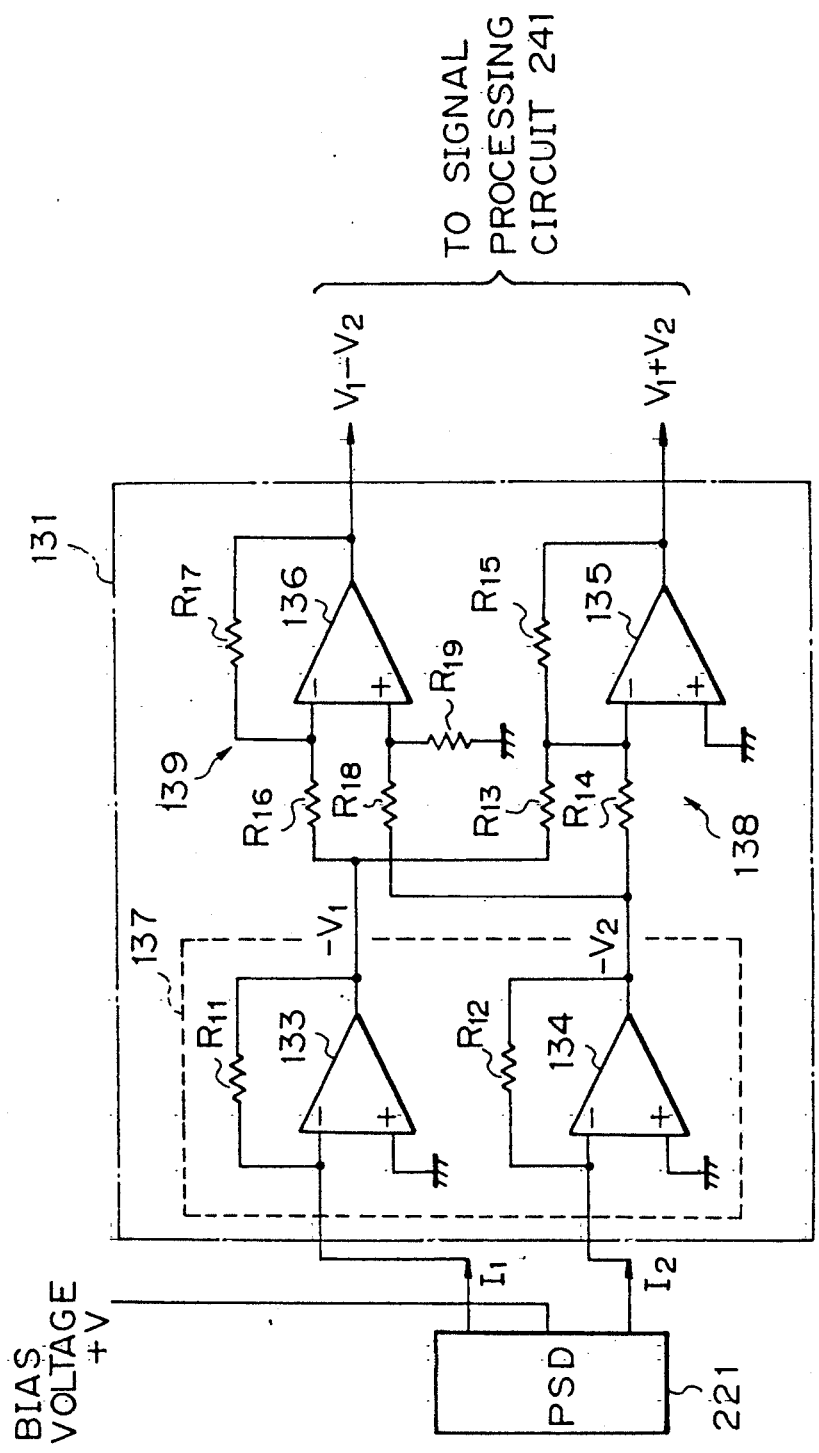
FIG. 40 is a block diagram of an arithmetic circuit according to an embodiment of the present invention.
Figure 41:
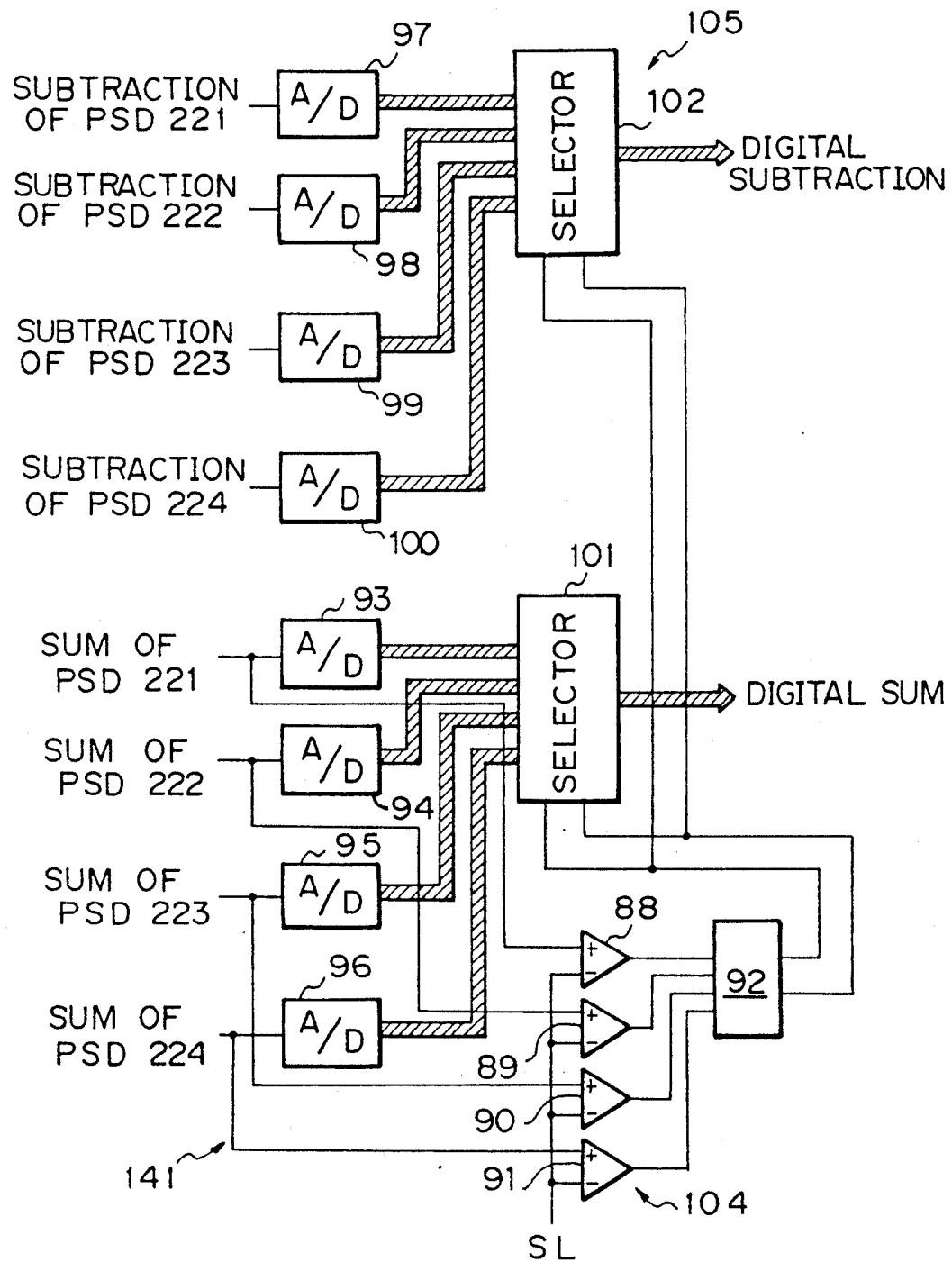
FIG. 41 is a block diagram of a signal processing circuit according to another aspect of the present invention.

FIG. 39 to 41 show a modified embodiment of FIGS. 36 to 38. FIG. 39 is a schematic view of an optical system in which the incident beam 210 passing through the lens 211 is split by the N-stage beam splitters (three-stages in the illustrated embodiment) 212–214, so that the split beams have different quantities of light with different powers, e.g., $1:B:B^2:B^3$. . . In the illustrated embodiment, the quantity of light is split into 90%, 9%, 0.9%, 0.1%, so that the split beams are incident on the respective PSD's (optical detectors) 221 –224.

The PSD's 221 - 224 are connected to the respective arithmetic circuits, an example of which is shown in FIG. 40. The PSD 221 is connected to the arithmetic circuit 131, which is similar to FIG. 32. The number of arithmetic circuits corresponds to number of PSD's The sum $(V_1+V_2)$ and the subtraction $(V_1-V_2)$ from each of the arithmetic circuits 131, etc., are supplied to the signal processing circuit 241 shown in FIG. 41.

The signal processing circuit 241 is similar to that shown in FIG. 37, except for the amplifiers 182 -187 which are omitted in FIG. 41. The signal processing circuit 241 selectively switches the output of the arithmetic circuits to give an optimum gain to the sum and the subtraction in accordance with the sum signals (output signals) of the arithmetic circuits. Note that the sum and the subtraction signals are A/D-converted before the selection. The outputs from the signal processing circuit 241, i.e., the digital signals of sum and subtraction are input to and processed in the digital dividing circuit 206 shown in FIG. 38, as mentioned before.

In the above-mentioned arrangement, the signals are adjusted to a necessary level in the arithmetic circuit 231. Concretely, the sensitivity of voltage/quantity of light is set in accordance with the values of the resistance of the arithmetic circuits. Particularly, the resistors $R_{11}$ and $R_{12}$ determine the coefficient of the current-voltage conversion. Namely, the following relationship exists:

$$V_1 = I_1 \times R_{11}$$

Accordingly, among the split beams having different quantities of light of 90%, 9%, 0.9% and 0.1%, produced by the beam splitters 212-214 and converted to the electrical signals by the PSD's 221-224, the PSD 121 is selected for the dark beam and the PSD 224 is selected for the bright beam. Therefore, assuming that a $10^4$ range of the fluctuation of light intensity (range of quantity of light) occurs and the saturation voltage of each of the circuits is 10 V, the minimum signal is 1 mV immediately after passing the PSD's. According to the embodiment of the present invention, an optimum range of the PSD is selected for such a minimum signal, and accordingly, a 1 — 10 V output level of the signal for the arithmetic circuit 141 is selectively output. Thus, the signals reach the necessary level immediately after the PSD's 221-224, and accordingly, even if the quantity of light is small, noise from the amplifiers or eternal noise can be effectively eliminated, resulting in an improved S/N ratio and an increased precision of measurement.

Figure 42:
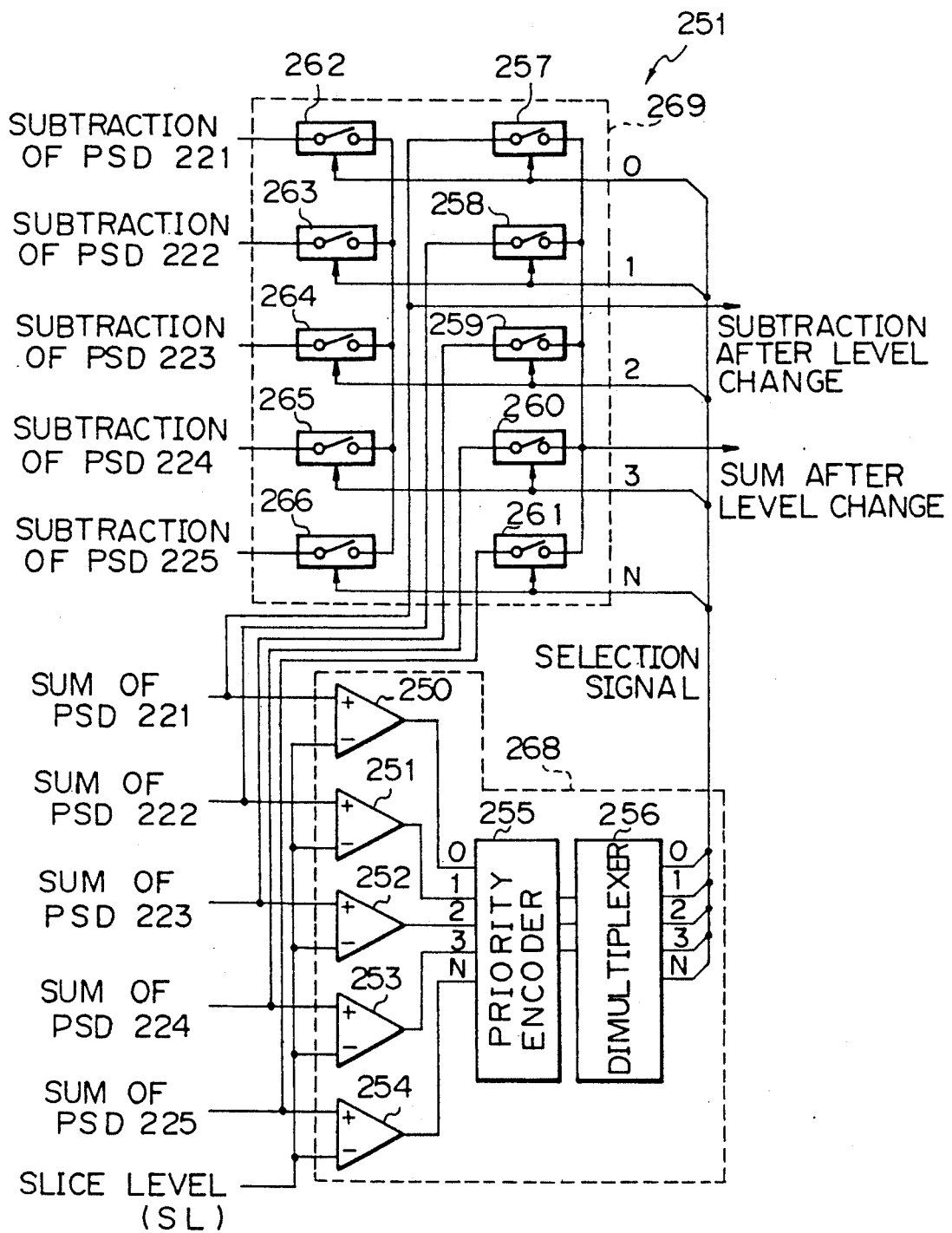
FIG. 42 is a block diagram of a signal processing circuit according to still another aspect of the present invention.
Figure 43:
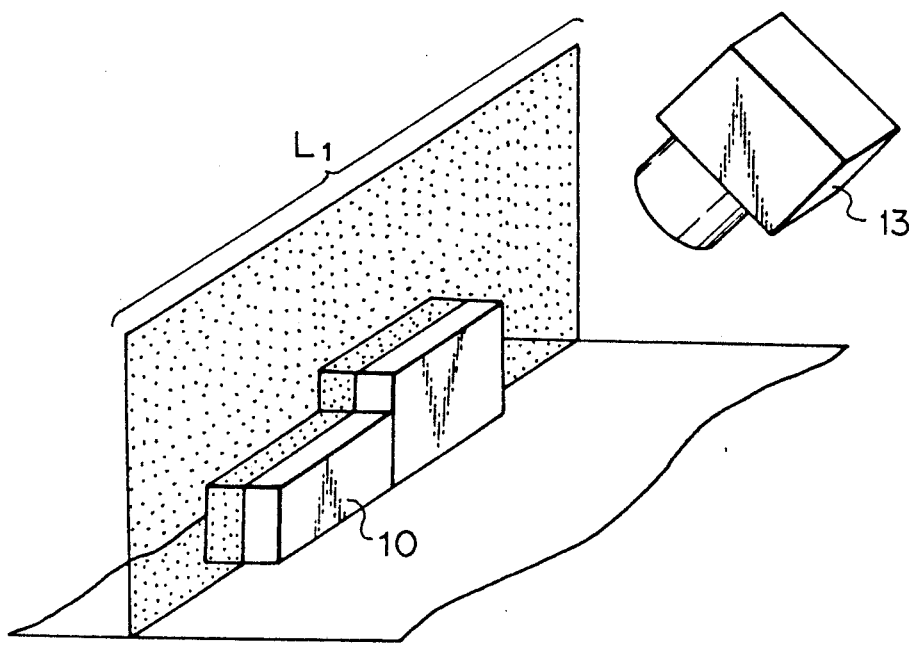
FIG. 43 is a perspective view of a structure light method according to a prior art.
Figure 44:
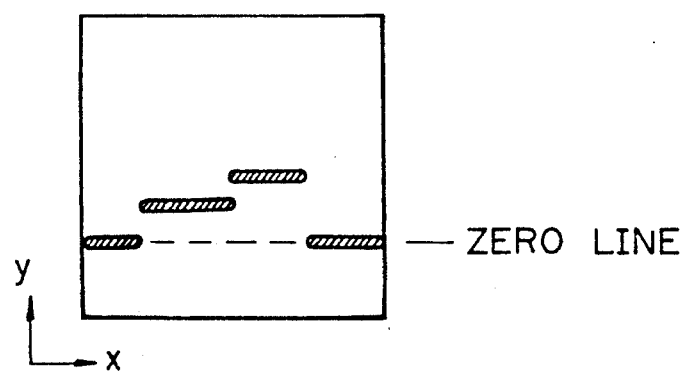
FIG. 44 is a schematic view of an image picture on a monitor detected by the known method shown in FIG. 43.

FIG. 42 shows a modification of FIG. 40. Contrary to the above-mentioned embodiment in which the outputs of the PSD's are A/D converted before the selection stage, an optimum one of the PSD's is discriminated and the A/D conversion is then performed as in FIG. 42. Namely, in FIG. 42, five PSD's 221 -225 are provided, so that the sum signal and the subtraction signal of each PSD are input to the signal processing circuit 251. The signal processing circuit 251 is similar to the signal processing circuit 141 shown in FIG. 33, except that the amplifiers 142-149 of FIG. 33 are omitted. Namely, the signal processing circuit 251 selectively outputs the optimum sum and subtraction (i.e. difference) signals from among those of the PSD's 221 -225, and then the signals are A/D converted by the circuits shown in FIG. 34 to detect the light position.

The present invention is not limited to the illustrated and above-described embodiments. For example, it is possible to connect the output terminals of a plurality of PSD's to amplifiers having different gains.

As can be understood from the foregoing, according to the illustrated embodiments, it is possible to prevent a sudden change of the signal intensity, to thereby obtain a high precision detection of the light position.

Furthermore, even when the quantity of light is small, the S/N ratio can be increased, resulting in high precision detection of the light position.

We claim:

1. An optical system for detecting the shape of a three-dimensional object, comprising:
   a collimating lens for converting a laser beam to a parallel beam of light;
   a scanning optical system comprising:
      a deflection mirror on which the parallel light beam is incident and which reflects the incident parallel beam in a predetermined direction, as a deflection beam.
      a parabolic mirror on which the deflection beam is incident and which reflects the deflection beam as a scanning beam, in a direction normal to the object and incident on the object, for scanning the object with a scanning light beam spot, the scanning light beam spot being reflected by the scanned object and producing a scanned object, diffused reflection beam,
      a further mirror disposed adjacent the surface of the object and with the reflecting surface thereof disposed at a predetermined, small angle of inclination with respect to the normal to the surface of the object whereby the reflecting surface thereof is substantially normal to the surface of the object, the scanned object, diffused reflection beam being incident on said further mirror and the further mirror reflecting same in a predetermined direction as a scanned object, diffused and reflected reflection beam, and
   an image forming, converging lens on which the diffused and reflected reflection beam is incident and which converges same to a point in a first predetermined focal plane and thereby forms an image of the object, as illuminated by the scanning light beam spot, in the first, predetermined focal plane, and
   a first optical detector positioned at the point in the first, predetermined focal plane at which the diffused and reflected beam is converged, for detecting the beam spot.

2. An optical system for detecting the shape of a three-dimensional object, comprising:
   a collimating lens for converting a laser beam to a parallel beam of light;
   a scanning optical system comprising:
      a deflection mirror on which the parallel light beam is incident and which reflects the incident parallel beam in a predetermined direction, as a deflection beam,
      an F.θ lens on which the deflection beam is incident and which reflects the deflection beam as a scanning beam, in a direction normal to the object and incident on the object, for scanning the object with a scanning light beam spot, the scanning light beam spot being reflected by the scanned object and producing a scanned object, diffused reflection beam,
      a further mirror disposed adjacent the surface of the object and with the reflecting surface thereof disposed at a predetermined, small angle of inclination with respect to the normal to the surface of the object whereby the reflecting surface thereof is substantially normal to the surface of the object, the scanned object, diffused reflection beam being incident on said further mirror and the further mirror reflecting same in a predetermined direction as a scanned object, diffused and reflected reflection beam, and
      an image-forming, converging lens on which the diffused and reflected reflection beam is incident and which converges same to a point in a first, predetermined focal plane and thereby forms an image of the object, as illuminated by the scanning light beam spot, in the first, predetermined focal plane; and
   a first optical detector positioned at the point in the first, predetermined focal plane at which the diffused and reflected beam is converged, for detecting the beam spot.

3. An optical system according to claim 1, wherein the laser beam has a first, predetermined direction of polarization and wherein the scanned object, diffused and reflected reflection beam includes an excess diffusion light component in addition to a beam spot component, corresponding to the incident scanning beam spot directly reflected by the scanned object, further comprising:
   a λ/4 plate on which scanned object, diffused and reflected reflection beam is incident, and which transmits therethrough the beam spot component maintaining the first predetermined direction of polarization thereof and polarizes and transmits therethrough the excess diffusion light component thereof with a second, different predetermined direction of polarization; and a polarization beam splitter on which the light beam components transmitted through the λ/4 plate are incident and which splits the components thereof by transmitting the beam spot component therethrough in a first predetermined direction and by selectively reflecting and transmitting the excess diffusion light component therethrough as a split beam in a second, different predetermined direction.

4. An optical system according to claim 3, further comprising:

a lens for converging the split beam to a point in a second, predetermined focal plane; and a second optical detector located in the second, predetermined focal plane at which the split beam is converged and which detects the converged beam.

5. An optical system according to claim 4, further comprising:

a mask which is located in front of the second optical detector and which intercepts and prevents the converged point of the split beam, corresponding to the point at which the scanning light beam spot is incident on the scanned object, from being incident on and thus from being detected by the second optical detector.

6. An optical system according to claim 1 or 2, wherein said first optical detector is a PSD which generates photo-induced current outputs of differing levels respectively proportional to the corresponding differing positions of the converged light beam point incident thereon, each light beam point position relative to the PSD varying in direction relationship to the position of the scanning light beam spot relative to the scanned object, whereby the height of the object can be represented by an determined in accordance with the following equation:

$$Height + (I_a - I_b)/(I_a \pm I_b)$$

wherein $I_a$ and $I_b$ are first and second outputs of t PSD respectively corresponding to first and second p of the scanning light beam spot relative to the scann and defining therebetween the height dimension of the object.

7. An optical system according to claim 4, wherein said first and second optical detectors are both PSD's, each generating photo-induced current outputs of differing levels respectively proportionate to the corresponding differing positions of the converged light beam point incident thereon, each light beam point position relative to the PSD varying in direct relationship to the position of the scanning light beam spot relative to the scanned object, whereby the height of the object can be represented by the following equation:

$$Height = (I_a - I_b)/(I_a + I_b - 2\Delta I)$$

wherein $I_a$ and $I_b$ are first and second outputs of the first PSD respectively corresponding to first and second positions of the scanning light beam spot on the scanned object and defining therebetween the height dimension of the scanned object and $\Delta I$ is the output of the second PSD as commonly produced thereby, concurrently with the first and second outputs of the first PSD.

8. An optical system according to claim 6, further comprising second and third optical detectors located on opposite sides of the first optical detector, with respect to a path of a beam incident on the first optical detector.

9. An optical system according to claim 8, wherein said second and third optical detectors are PSD's, each generating two outputs of photo-induced current in accordance with the position of light incident on the associated optical detectors, so that a height of the object can be represented by the following equation:

$$Height = (I_a - I_b)/$$

wherein $I_c$, $I_d$ and $I_e$, $I_f$ are outputs of the second and third PSD's, respectively.

10. An optical system according to claim 1, wherein said deflection mirror of said scanning optical system comprises a rotatable deflection mirror which rotates about an axis thereby to move the deflection beam through an angular range encompassing the predetermined direction and so as to be incident, throughout the angular range, on the reflecting surface of the parabolic mirror.

11. An optical system according to claim 10, wherein said deflection mirror is a polygonal mirror.

12. An optical system according to claim 11, wherein the parabolic mirror reflects a light beam, when incident thereon in a perpendicular relationship and scanned across the surface thereof, as a scanning beam which moves in a scan path having a predetermined curvature and thus departing from to a desired linear scan path, and wherein:

the parallel beam of light from the collimating lens is incident on the rotatable deflection mirror at an incident angle having a predetermined angle of inclination with respect to the axis of rotation of the deflection mirror, so that the deflection beam is moved through the angular range in a path having a predetermined curvature which cancels the predetermined curvature of the path of the scanning beam produced by the parabolic mirror.

13. An optical system according to claim 12, wherein said parabolic mirror is oriented at a predetermined of-axis angle relative to the axis of rotation of the rotatable deflection mirror, so that the axis of the reflection beam incident thereon is deviated from the axis of the scanning beam reflected therefrom.

14. An optical system according to claim 13, wherein the incident angle of the parallel beam on the deflection mirror is about 0.65 times the value of the off-axis angle of the parabolic mirror.

15. An optical system according to claim 14, wherein the parallel beam is incident on the deflection mirror at an incident angle normal thereto when the deflection mirror directly faces the parabolic mirror.

16. An optical system according to claim 15, wherein the axis of rotation of the deflection mirror is inclined at an inclination angle which is identical in value to the incident angle of the parallel beam on the deflection mirror with respect to a direction normal to the optical axis of the parabolic mirror.

17. An optical system according to claim 1, further comprising a laser beam source which emits the laser beam which is incident on the collimating lens.

18. An optical system according to claim 17, further comprising a polarization beam splitter disposed in the path of the light beam between the collimating lens and the deflection mirror.

19. An optical system according to claim 18, further comprising a λ/4 plate which is located between the deflection mirror and the polarization beam splitter to polarize the beam transmitted therethrough.

20. An optical system according to claim 19, further comprising an additional mirror, the additional mirror and the further mirror being disposed in adjacent but spaced, symmetrical relationship on opposite sides of and adjacent to the scanning beam and the surfaces of the object and offset by a common small angle of inclination relative to the normal to the surface of the object, the beams reflected by the object being symmetrically reflected by the additional and further mirrors toward the deflection mirror.

21. An optical system according to claim 19, further comprising second and third optical detectors symmetrically disposed at opposite sides of the first optical detector to receive the responsive beams reflected by the respective additional and further, generally parallel reflection mirrors, the first, second and third optical detectors producing corresponding first, second and third optical detector outputs.

22. An optical system according to claim 19, further comprising a first processing circuit connected to the first optical detector to receive the first optical detector output thereof and, in response thereto, generating a brightness output.

23. An optical system according to claim 22, further comprising second and third processing circuits connected to the second and third optical detectors, respectively for receiving the second and third optical detector outputs thereof, the second processing circuit generating a brightness signal output in response to the second optical detector output and the third processing circuit generating a height signal representing the height of the scanned object in response to the third optical detector output.

24. An optical system according to claim 23, further comprising a brightness selection circuit connected to the first, second nd third processing circuits, each of the first, second and third processing circuits producing corresponding first, second and third brightness signals, and the brightness selection circuit receiving the corresponding first, second and third brightness signal outputs and selecting the brightest signal of the first, second and third brightness signal outputs.

25. An optical system according to claim 23, further comprising a brightness selection circuit connected to the first, second and third processing circuits, each of the first, second and third processing circuits producing corresponding first, second and third brightness signals, and the brightness selection circuit receiving the corresponding first, second and third brightness signal outputs and producing a sum brightness signal output representing the sum of said first, second and third brightness signal outputs.

26. An optical system according to claim 24 wherein the second and third processing circuits produce corresponding second and third height signal outputs, further comprising a height selection circuit connected to the second and third processing circuits to receive the respective brightness signal and the height signal outputs thereof, an operative to select the height signal output corresponding to the brighter of the second and third brightness signal outputs.

27. An optical system according to claim 26, further comprising an inclination angle arithmetic circuit connected to the three processing circuits to receive the brightness signals therefrom to produce an inclination angle signal representing an inclination angle of the object, wherein the inclination angle A is given by the following equation:

$$A = (Ba\theta a + Bv\theta b + Bc\theta c)/2(Ba + Bb + Bc)$$

wherein Ba, Bb, and Bc are brightnesses represented by the outputs of the first, second and third processing circuits, respectively;

$\theta a$, $\theta b$ and $\theta c$ are reflection angles of the reflection beams from the object received by the first, second and third optical detectors, respectively.

28. An optical system according to claim 27, further comprising a light diffusion arithmetic circuit connected to the three processing circuits to receive the brightness signals therefrom to produce a light diffusion signal representing an extent of a scattering of light from the object, wherein the light diffusion is given by an average deviation $\sigma$ represented by the following equation:

$$\sigma = \frac{[|Ba(\theta a - \theta_M)| + |Bb(\theta b - \theta_M)| + |Bc(\theta c - \theta_M)|]}{(Ba + Bb + Bc)}$$

$$\text{wherein } \theta_M = \frac{(Ba\theta a + Bb\theta b + Bc\theta c)}{(Ba + Bb + Bc)}$$

29. An optical system according to claim 6, further comprising:
means for arithmetically calculating the values of the sum and the difference of the first and second outputs of the optical detector and producing corresponding sum and difference outputs; and
means responsive to the sum and difference outputs for detecting the incident position on the object of the scanning light beam spot, in accordance with the ratio of the difference value to the sum value of the corresponding outputs thus obtained.

30. An optical system according to claim 29, further comprising:
predetermined stages of amplifiers having respective and different predetermined gains, each stage connected to receive a respectively corresponding one of the sum and difference outputs of the arithmetical calculating means and to produce respectively corresponding, amplified sum and difference outputs;
selection means for selecting, from among the stages of amplifiers which amplify the sum outputs, the amplifier stage which affords optimum gain of the sum output of the arithmetic calculating means as received thereby relative to the amplified sum output produced thereby; and
means for switching the amplifier stages to afford the same gain to the sum and the difference calculations and corresponding outputs, in accordance with the selection by the selection means.

31. An optical system according to claim 30, wherein said selection means comprises:
comparators connected to receive the amplified outputs of the respective amplifier stages, which compare the sum output signals of the corresponding amplifier stages with a predetermined slice level;

a priority encoder connected to the comparators to detect a predetermined priority signal from among the outputs of the comparators and to encode same and produce a corresponding encoded output; and a demultiplexer connected to the priority encoder to convert the encoded output data of the priority encoder.

32. An optical system according to claim 31, wherein said switching means comprises analog switches connected to the amplifier stages and turning ON only the optimum gain amplifier stages, in accordance with the selection by the selection means.

33. An optical system according to claim 29, further comprising:

predetermined stages of amplifiers having respective and different predetermined gains each stage connected to received a respectively corresponding one of the sum and difference outputs of the arithmetical calculating means and to produce respectively corresponding, amplified sum and difference outputs;

selection means for selecting, from among the stages of amplifiers optimum gain which amplify the sum outputs the amplifier stage which affords optimum gain of the sum output of the arithmetic calculating means as received thereby relative to the amplified sum output produced thereby;

A/D converters connected to the respective amplifier stages to convert the amplified outputs thereof to corresponding digital signals; and means for switching the A/D converters and respectively associated amplifiers to select digital sum and difference signals, each having an optimum gain, in accordance with the selection by the selection means, so that the detection of the light incident position by the incident position detecting means is effected in accordance with the digital sum and difference value outputs of the A/D converters and associated amplifiers selected by the selection means.

34. An optical system according to claim 29, further comprising beam splitters which split the beam reflected from the object to produce different quantities of light.

35. An optical system according to claim 34, further comprising optical detectors which correspond to the beam splitters and which are located at the focal points of the image forming lens corresponding to the beam splitters to detect the associated split beams.

36. An optical system according to claim 35, further comprising a selection means for selecting an optimum arithmetic means which gives an optimum gain to the sum and subtraction, in accordance with the sum outputs of the arithmetic means amplify the sum, and means for switching the sum and subtraction signals of the arithmetic means, in accordance with the outputs of the selection means to A/D-convert the sum and subtraction signals prior to the switching operation, so that the position by the incident position detecting means is effected in accordance with the sum and the subtraction signals switched by the switching means.

37. An optical system according to claim 35, further comprising a selection means for selecting optimum arithmetic means which gives an optimum gain to the sum and subtraction, in accordance with the sum outputs of the arithmetic means amplify the sum, and means for switching the sum and subtraction signals of the arithmetic means, in accordance with the outputs of the selection means to A/D-convert the sum and subtraction signals after the switching operation, so that the position detection by the incident position detecting means is effected in accordance with the sum and the subtraction signals switched by the switching means.

* * * * *